(12) United States Patent
Tsuji et al.

(10) Patent No.: US 8,811,061 B2
(45) Date of Patent: Aug. 19, 2014

(54) MEMORY DEVICE, SEMICONDUCTOR STORAGE DEVICE, METHOD FOR MANUFACTURING MEMORY DEVICE, AND READING METHOD FOR SEMICONDUCTOR STORAGE DEVICE

(75) Inventors: Kiyotaka Tsuji, Osaka (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 39 days.

(21) Appl. No.: 13/812,532

(22) PCT Filed: Sep. 26, 2011

(86) PCT No.: PCT/JP2011/005402
§ 371 (c)(1),
(2), (4) Date: Jan. 28, 2013

(87) PCT Pub. No.: WO2012/042828
PCT Pub. Date: Apr. 5, 2012

(65) Prior Publication Data
US 2013/0121063 A1   May 16, 2013

(30) Foreign Application Priority Data

Sep. 27, 2010   (JP) ................................ 2010-216248

(51) Int. Cl.
| | |
|---|---|
| *G11C 11/00* | (2006.01) |
| *H01L 45/00* | (2006.01) |
| *H01L 27/24* | (2006.01) |
| *G11C 13/00* | (2006.01) |
| *H01L 27/10* | (2006.01) |

(52) U.S. Cl.
CPC ........ *H01L 45/1253* (2013.01); *H01L 45/1675* (2013.01); *H01L 45/146* (2013.01); *H01L 45/1233* (2013.01); *H01L 45/08* (2013.01); *H01L 27/2472* (2013.01); *G11C 13/004* (2013.01); *H01L 45/1683* (2013.01); *H01L 45/16* (2013.01); *H01L 27/2409* (2013.01); *G11C 13/0007* (2013.01); *H01L 27/101* (2013.01)
USPC .............................. 365/148; 365/163; 257/4

(58) Field of Classification Search
CPC .......................... G11C 13/004; G11C 13/0002
USPC ........................................................ 365/148
See application file for complete search history.

(56) References Cited

U.S. PATENT DOCUMENTS

| | | | |
|---|---|---|---|
| 6,531,371 B2 | 3/2003 | Hsu et al. | |
| 6,569,745 B2 | 5/2003 | Hsu | |

(Continued)

FOREIGN PATENT DOCUMENTS

| | | |
|---|---|---|
| JP | 2003-068984 | 3/2003 |
| JP | 2005-159359 | 6/2005 |

(Continued)

*Primary Examiner* — Son Mai
(74) *Attorney, Agent, or Firm* — Wenderoth, Lind & Ponack, LLP.

(57) ABSTRACT

A memory device that can prevent degradation in characteristics of a diode and the destruction due to the miniaturization includes: a substrate; first electrodes, a second electrode, and a third electrode that are stacked above the substrate; a variable resistance layer between the first and second electrodes; and a non-conductive layer between the second and third electrodes. The variable resistance layer includes a high-concentration variable resistance layer closer to the first electrodes, and a low-concentration variable resistance layer closer to the second electrode and having an oxygen concentration lower than that of the high-concentration variable resistance layer. The second and third electrodes and the non-conductive layer comprise the diode, and the first and second electrodes and the variable resistance layer comprise variable resistance elements, a total number of which is equal to that of the first electrodes.

16 Claims, 36 Drawing Sheets

(56) References Cited

U.S. PATENT DOCUMENTS

| | | |
|---|---|---|
| 6,693,821 B2 | 2/2004 | Hsu et al. |
| 6,825,058 B2 | 11/2004 | Hsu et al. |
| 6,858,905 B2 | 2/2005 | Hsu et al. |
| 6,861,687 B2 | 3/2005 | Hsu et al. |
| 6,905,937 B2 | 6/2005 | Hsu et al. |
| 6,925,001 B2 | 8/2005 | Hsu |
| 6,927,430 B2 | 8/2005 | Hsu |
| 6,940,113 B2 | 9/2005 | Hsu et al. |
| 6,972,211 B2 | 12/2005 | Hsu et al. |
| 7,009,208 B2 | 3/2006 | Aratani et al. |
| 7,009,278 B2 | 3/2006 | Hsu |
| 7,169,624 B2 | 1/2007 | Hsu |
| 7,192,792 B2 | 3/2007 | Hsu et al. |
| 7,193,267 B2 | 3/2007 | Hsu et al. |
| 7,342,824 B2 | 3/2008 | Hsu |
| 7,381,616 B2 | 6/2008 | Hsu |
| 7,425,724 B2 | 9/2008 | Aratani et al. |
| 7,602,042 B2 | 10/2009 | Ahn et al. |
| 7,623,370 B2 | 11/2009 | Toda et al. |
| 7,663,132 B2 | 2/2010 | Toda et al. |
| 7,767,993 B2 | 8/2010 | Toda et al. |
| 7,916,516 B2 | 3/2011 | Wei et al. |
| 7,935,953 B2 | 5/2011 | Ahn et al. |
| 7,989,789 B2 | 8/2011 | Toda |
| 7,989,794 B2 | 8/2011 | Toda et al. |
| 8,269,207 B2 | 9/2012 | Toda |
| 8,350,245 B2 * | 1/2013 | Tsuji ................................ 257/2 |
| 2003/0001178 A1 | 1/2003 | Hsu et al. |
| 2003/0003674 A1 | 1/2003 | Hsu et al. |
| 2003/0003675 A1 | 1/2003 | Hsu |
| 2003/0142578 A1 | 7/2003 | Hsu et al. |
| 2003/0203585 A1 | 10/2003 | Hsu |
| 2003/0206481 A1 | 11/2003 | Hsu et al. |
| 2003/0234449 A1 | 12/2003 | Aratani et al. |
| 2004/0108528 A1 | 6/2004 | Hsu et al. |
| 2004/0164332 A1 | 8/2004 | Hsu et al. |
| 2004/0170048 A1 | 9/2004 | Hsu |
| 2005/0052942 A1 | 3/2005 | Hsu et al. |
| 2005/0054138 A1 | 3/2005 | Hsu et al. |
| 2005/0083757 A1 | 4/2005 | Hsu et al. |
| 2005/0110117 A1 | 5/2005 | Hsu |
| 2005/0141269 A1 | 6/2005 | Hsu et al. |
| 2005/0207248 A1 | 9/2005 | Hsu |
| 2006/0033182 A1 | 2/2006 | Hsu |
| 2006/0043595 A1 | 3/2006 | Aratani et al. |
| 2006/0094187 A1 | 5/2006 | Hsu et al. |
| 2006/0098472 A1 | 5/2006 | Ahn et al. |
| 2006/0284281 A1 | 12/2006 | Hsu |
| 2008/0002455 A1 | 1/2008 | Toda et al. |
| 2008/0002456 A1 | 1/2008 | Toda et al. |
| 2008/0002457 A1 | 1/2008 | Toda et al. |
| 2008/0121865 A1 | 5/2008 | Ahn et al. |
| 2008/0258129 A1 | 10/2008 | Toda |
| 2010/0110766 A1 | 5/2010 | Wei et al. |
| 2010/0259970 A1 | 10/2010 | Toda et al. |
| 2011/0205790 A1 | 8/2011 | Toda |
| 2012/0018696 A1 | 1/2012 | Goux |
| 2012/0097915 A1 | 4/2012 | Mikawa et al. |
| 2013/0148406 A1 * | 6/2013 | Shimakawa et al. .......... 365/148 |
| 2014/0110659 A1 * | 4/2014 | Murase et al. .................... 257/4 |

FOREIGN PATENT DOCUMENTS

| | | |
|---|---|---|
| JP | 2006-140489 | 6/2006 |
| JP | 4103497 | 6/2008 |
| JP | 2010-212541 | 9/2010 |
| JP | 2011-517083 | 5/2011 |
| WO | 03/085675 | 10/2003 |
| WO | 2008/105155 | 9/2008 |
| WO | 2009/122349 | 10/2009 |
| WO | 2010/064340 | 6/2010 |

\* cited by examiner

FIG. 8A

[Current that flows through first current sensing circuit]

|  |  | R222 | |
|---|---|---|---|
|  |  | LR | HR |
| R221 | LR | 31.96 μA | 41.00 μA |
|  | HR | 4.95 μA | 7.90 μA |

[Current that flows through second current sensing circuit]

|  |  | R222 | |
|---|---|---|---|
|  |  | LR | HR |
| R221 | LR | 31.96 μA | 4.95 μA |
|  | HR | 41.00 μA | 7.90 μA |

FIG. 8B

[Current that flows through first current sensing circuit]

|  |  | R222 | |
|---|---|---|---|
|  |  | LR | HR |
| R221 | LR | 31.96 μA | 38.44 μA |
|  | HR | 7.63 μA | 7.90 μA |

[Current that flows through second current sensing circuit]

|  |  | R222 | |
|---|---|---|---|
|  |  | LR | HR |
| R221 | LR | 31.96 μA | 7.63 μA |
|  | HR | 38.44 μA | 7.90 μA |

MEMORY DEVICE, SEMICONDUCTOR STORAGE DEVICE, METHOD FOR MANUFACTURING MEMORY DEVICE, AND READING METHOD FOR SEMICONDUCTOR STORAGE DEVICE

CROSS-REFERENCE TO RELATED APPLICATIONS

This application is a National Phase filing under 35 U.S.C. §371 of International Application No. PCT/JP2011/005402 filed on Sep. 26, 2011, and which claims priority to Japanese Patent Application No. 2010-216248 filed on Sep. 27, 2010.

TECHNICAL FIELD

The present invention relates to a memory device, a semiconductor storage device, a method for manufacturing a memory device, and a reading method for a semiconductor storage device. The present invention relates particularly to a memory device including a variable resistance element connected in series with a diode, a cross-point nonvolatile semiconductor storage device including the memory device, a method for manufacturing the memory device, and a reading method for the cross-point nonvolatile semiconductor storage device.

BACKGROUND ART

Recent years have seen increasingly higher performance in electronic devices such as portable information devices and information appliances, following the development of digital technology. As such, there is an increased demand for increasing capacity, reducing writing power consumption, accelerating speed during writing and reading, and extending operational life, in nonvolatile semiconductor memory devices.

In view of these demands, there has been an advance in the miniaturization of flash memories using existing floating gates.

Since a nonvolatile semiconductor storage device (resistance-change memory, hereinafter referred to as "ReRAM") including, as a storage unit, a variable resistance element in which a resistance value stably held changes with application of a voltage pulse has a simple structure of memory cells, the miniaturization, the higher speed, and the lower power consumption are further expected.

For example, PTL 1 discloses a cross-point ReRAM intended for the miniaturization and the larger capacity, as a ReRAM.

In the ReRAM disclosed in PTL 1, striped lower electrodes are formed on a substrate, and an active layer is entirely formed over the lower electrodes. The active layer used is a variable resistance layer in which a resistance value reversibly changes with application of an electrical pulse. Striped upper electrodes are formed on the active layer so as to cross the lower electrodes.

In the ReRAM with such a structure, a region in which the lower electrodes cross the upper electrodes across the variable resistance layer functions as a storage unit, and each of the lower electrodes and the upper electrodes function as one of word lines and bit lines. The capacity can be increased using a cross-point ReRAM having such a structure.

However, the cross-point ReRAM has a problem in the influence of variable resistance layers in other rows and columns when a resistance value of a variable resistance layer formed at a cross-point at which the upper electrode and the lower electrode cross is read.

Here, a diode is inserted in series with the variable resistance layer in order to prevent the influence of variable resistance layers in the other rows and columns (see, for example, PTL 2).

PTL 2 discloses a ReRAM including: a substrate; a plurality of bit lines (lower electrodes) arranged in parallel with each other on the substrate; a plurality of word lines (upper electrodes) arranged in parallel with each other in a direction in which the word lines cross the bit lines; a resistor structure formed on each of the bit lines at a cross-point between the bit line and the word line; and a diode structure formed on each of the resistor structures so as to be in contact with the resistor structure and the word line.

As such, when a resistance value of a variable resistance layer is read, it is possible to solve the problem of the influence of variable resistance layers in the other rows and columns by changing the unit cell structure into a continuous stacked structure with one diode structure and one resistor structure.

CITATION LIST

Patent Literature

[PTL 1] Japanese Unexamined Patent Application Publication No. 2003-68984

[PTL 2] Japanese Unexamined Patent Application Publication No. 2006-140489

SUMMARY OF INVENTION

Technical Problem

As disclosed in PTL 2, in the conventional cross-point ReRAM, a memory device including one diode structure (diode element) and one resistor structure (variable resistance element) is arranged at each cross-point at which the lower electrode (first line) and the upper electrode (second line) cross each other. Furthermore, since the memory devices are separately formed in the ReRAM, the design dimension (dimension of a memory device and a between-memory device dimension) becomes the smallest in an array portion of the chip.

However, in the cross-point ReRAM disclosed in PTL 2, a structure including the diode structure and the resistor structure is composed of four layers comprising at least four different materials, and is formed simultaneously through etching for each one bit. For example, the diode structure comprises a p-type oxide and an n-type oxide, such as NiO and TiO2. The resistor structure includes a first resistance layer and a second resistance layer comprising, for example, NiO and TiO2. Due to the miniaturization of ReRAM, it is very difficult to establish the technique of simultaneously processing different materials. Thus, there is a problem in the miniaturization of ReRAM. In addition, the miniaturization is all the more difficult when the upper electrodes or the lower electrodes are simultaneously etched with the above structure.

Furthermore, the resistance value immediately after manufacturing the variable resistance element to be used in a conventional ReRAM is higher than that of a variable resistance element in a high resistance state during a resistance change operation. Before performing the normal resistance change operation, it is necessary to form a filament path in a variable resistance film with application of a voltage higher than a voltage for the normal resistance change operation to reduce a resistance (initial break). The initial break operation needs a current higher than a current at the time of the normal resistance change operation and a read operation. Generally, the current ranges from several hundreds μA to 1 mA. Furthermore, the current in the initial break operation is equivalent to a current that flows when the filament path is formed in a variable resistance film having a very high resistance value. Even when the dimension of the variable resistance element becomes smaller according to the miniaturization, the current hardly decreases.

The current that flows in the initial break flows in a diode connected in series with a variable resistance element. Since the highest current (allowable current) that flows without destroying the diode is in proportion to a contact area (connection area) between the variable resistance element and the diode, the allowable current of the diode decreases according to the miniaturization of ReRAM.

Thus, in the cross-point ReRAM in which a variable resistance element and a diode are formed at each cross-point, it is difficult to sufficiently increase the allowable current of the diode in the initial break operation, due to the miniaturization. Thus, there is a problem that the diode may be destroyed because of the variations in the initial break current that are caused by noise.

Even assuming that a certain improvement eliminates the need for the initial break operation of the variable resistance element, when the current that flows in the resistance change operation approximates the allowable current of the diode due to the miniaturization of ReRaM, (i) repetitions of the resistance change operation causes a problem in increased degradation in characteristics of the diode and (ii) a problem that the reliability of ReRAM cannot be assured occurs.

The present invention has been conceived to solve such problems, and has an object of providing a memory device and a semiconductor storage device that can prevent the diode from degrading in the characteristics even with the miniaturization of the ReRAM and from being destroyed. Furthermore, another object is to provide an appropriate method for manufacturing the memory device, and a reading method for the semiconductor storage device.

Solution to Problem

In order to achieve the objects, a memory device according to an aspect of the present invention includes: a substrate; a plurality of first electrodes, a second electrode, and a third electrode that are stacked above the substrate; a variable resistance layer formed between the first electrodes and the second electrode; and a non-conductive layer formed between the second electrode and the third electrode, wherein the variable resistance layer includes a high-concentration variable resistance layer located closer to the first electrodes, and a low-concentration variable resistance layer located closer to the second electrode, the low-concentration variable resistance layer having an oxygen concentration lower than an oxygen concentration of the high-concentration variable resistance layer, the second electrode, the non-conductive layer, and the third electrode comprise a diode, the second electrode, the third electrode, the variable resistance layer, and the non-conductive layer are formed across the first electrodes, the first electrodes, the variable resistance layer, and the second electrode comprise a plurality of variable resistance elements, a total number of which is equal to a total number of the first electrodes, and each of the variable resistance elements has a resistance value that independently changes according to a voltage applied between the first electrodes and the second electrode The processing dimension that needs to be processed to the size of (minimum design dimension×minimum design dimension) in the conventional structure can be increased to N times of (minimum design dimension×minimum design dimension) or more without lowering the density of memory devices with the aforementioned structure, where N is an integer. Accordingly, it is possible to reduce the number of processes that require a micromachining process with higher accuracy and the manufacturing cost, and make the characteristics of the memory devices uniform.

Furthermore, since the contact area of a bi-directional diode can be increased more than that of the conventional memory device for which one bi-directional diode needs to be manufactured per variable resistance element, the allowable current amount of the bi-directional diode can be increased. Accordingly, it is possible to prevent the diode from degrading in the characteristics and being destroyed due to the current that flows through the diode during an initial break operation and a resistance change operation of the variable resistance element.

The memory device according to the aspect of the present invention may further include an interlayer insulating film in which a memory cell hole is formed, wherein the variable resistance layer may be formed within the memory cell hole.

Accordingly, the side surface of the high-concentration variable resistance layer and the low-concentration variable resistance layer is never dry etched in the pattern processing of these layers. Thus, it is possible to prevent decrease in the effective element area of the variable resistance elements, due to degradation of the side surface and alteration of the films. Thus, the advantage that the memory device is easily miniaturized can be produced.

According to the aspect, preferably, a first line is formed opposite to the variable resistance layer with respect to the first electrodes, and a material comprised in the first line has a resistance value smaller than a resistance value of a material comprised in the first electrodes.

Accordingly, when the memory devices according to the present invention are used as memory cells of a cross-point nonvolatile semiconductor storage device and the first electrodes of the memory device are used as bit lines of the memory cell array, the resistance of the bit lines can be reduced. Furthermore, the used amount of materials of the first electrodes can be reduced, and the advantage of easily processing the first electrodes can be produced.

According to the aspect, preferably, each of the first electrodes is formed by a plating method.

According to the aspect, a Cu line is used as the first line, and the first electrode can be formed on the Cu line using an electroless plating method. Accordingly, since the pattern processing through an etching process does not have to be performed on a noble metal used as a material for the first electrodes, it is possible to prevent the short circuit due to the redeposited materials with the fine pattern, and the failure in the pattern formation in the thin line shape. Thus, the advantage that the memory device is easily miniaturized can be produced.

According to the aspect, preferably, a second line is formed opposite to the non-conductive layer with respect to the third electrode, and the third electrode, the non-conductive layer, and the second line have a same shape in a vertical direction with respect to the substrate.

Accordingly, the number of photolithography processes and the manufacturing cost can be reduced.

According to the aspect, preferably, the third electrode, second electrode, and the first electrodes are formed in this order above the substrate.

According to the aspect, preferably, the first electrodes comprise one of platinum (Pt), palladium (Pd), iridium (Ir), and a composite of Pt, Pd, and Ir.

According to the aspect, preferably, the high-concentration variable resistance layer and the low-concentration variable resistance layer comprise an oxide of one of tantalum, hafnium, and zirconium.

According to an aspect of the present invention, a cross-point memory cell array includes a matrix of a plurality of the memory devices.

According to another aspect of the present invention, a semiconductor storage device includes: a cross-point memory cell array including a matrix of a plurality of the memory devices; a plurality of word lines formed in a row direction of the memory cell array; a plurality of bit lines formed in a column direction of the memory cell array; a read word line selection circuit connected to the word lines; a read bit line selection circuit connected to the bit lines; and a plurality of current sensing circuits connected to the bit lines, wherein the read word line selection circuit selects one of the word lines to apply a first potential to the third electrode included in a corresponding one of the memory devices to be read, the read bit line selection circuit selects a plurality of bit lines to apply a same second potential simultaneously to the first electrodes in the corresponding one of the memory devices to be read, the second potential being different from the first potential, and the current sensing circuits detect each current that flows through the bit lines selected by the read bit line selection circuit to apply the second potential.

According to another aspect of the present invention, a semiconductor storage device includes a cross-point memory array including a plurality of first lines, a plurality of second lines that three-dimensionally cross the first lines, and a plurality of memory devices that correspond to a plurality of cross-points between the first lines and the second lines, wherein each of the memory devices includes a diode, and at least a first variable resistance element and a second variable resistance element, the first variable resistance element has one end connected to one of the first lines, the second variable resistance element has one end connected to an other one of the first lines that is adjacent to the one of the first lines that is connected to the first variable resistance element, the diode has one end connected to one of the second lines, and the diode has the other end connected to the other end of the first variable resistance element and the other end of the second variable resistance element.

According to another aspect of the present invention, a method for manufacturing a memory device includes: forming a plurality of first electrodes on a substrate; forming an interlayer insulating film having a height up to a surface of the first electrodes; stacking, on the first electrodes and the interlayer insulating film, films including a high-concentration variable resistance film, a low-concentration variable resistance film, a second electrode film, a non-conductive film, and a third electrode film, the low-concentration variable resistance film having an oxygen concentration lower than an oxygen concentration of the high-concentration variable resistance film; and patterning the stacked films simultaneously into a high-concentration variable resistance layer, a low-concentration variable resistance layer, a second electrode, a non-conductive layer, and a third electrode that are across the first electrodes.

According to another aspect of the present invention, a method for manufacturing a memory device includes: forming a plurality of first electrodes on a substrate; forming an interlayer insulating film to cover the first electrodes; forming a memory cell hole in a region of the interlayer insulating film to expose a surface of each of the first electrodes; sequentially embedding, in the memory cell hole, a high-concentration variable resistance film and a low-concentration variable resistance film having an oxygen concentration lower than an oxygen concentration of the high-concentration variable resistance film; forming a high-concentration variable resistance layer and a low-concentration variable resistance layer in the memory cell hole by removing the high-concentration variable resistance film and the low-concentration variable resistance film to expose a surface of the interlayer insulating film in a region of the interlayer insulating film in which the memory cell hole is not formed; and forming stacked films including a second electrode film, a non-conductive film, and a third electrode film on the memory cell hole; and patterning the stacked films simultaneously into a second electrode, a non-conductive layer, and a third electrode to cover at least a part of the memory cell hole.

According to the aspect, preferably, the method further includes forming copper lines between the substrate and the first electrodes, wherein the first electrodes are formed on the copper lines by an electroless plating method.

According to an aspect of the present invention, a reading method for the semiconductor storage device to read information written in the memory devices included in the semiconductor storage device includes: applying a first potential to the third electrode included in the corresponding one of the memory devices to be read; applying a second potential simultaneously to each of the first electrodes in the corresponding one of the memory devices to be read, the second potential being different from the first potential, and determining each of resistance states of the variable resistance elements in the corresponding one of the memory devices to be read by detecting each current that flows through the bit lines connected to the first electrodes to which the second potential is applied, and reading information on the corresponding one of the memory devices to be read.

Advantageous Effects of Invention

Furthermore, processing dimensions of the variable resistance layer and the diode can be larger than the minimum design dimension of the memory device. Accordingly, the memory device can substantially be miniaturized without using special micromachining process technology. Since the embeddability of the variable resistance layer in the memory device in which the memory cell hole is embedded can be greatly improved, the variation in characteristics of the memory devices can be reduced.

Furthermore, since variable resistance elements identical in number to the first electrodes can be included in the memory device according to the present invention, the element area of one memory device closer to the diode can be larger than that of the diode closer to the variable resistance element. Accordingly, it is possible to prevent the diode from degrading in the characteristics and being destroyed, due to the current that flows through the diode during an initial break operation and a resistance change operation of the variable resistance element.

BRIEF DESCRIPTION OF DRAWINGS

FIG. 8A is a table for indicating a result of calculation of currents that flow through the first current sensing circuit and the second current sensing circuit in the semiconductor storage device according to Embodiment 1 using a Simulation Program with Integrated Circuit Emphasis (Spice), when the variable resistance elements other than the first variable resistance element R221 and the second variable resistance element R222 are in the HR state.

FIG. 8B a table for indicating a result of calculation of currents that flow through the first current sensing circuit and the second current sensing circuit in the semiconductor storage device according to Embodiment 1 using the Spice, when the variable resistance elements other than the first variable resistance element R221 and the second variable resistance element R222 are in the LR state.

DESCRIPTION OF EMBODIMENTS

Figure 1A:
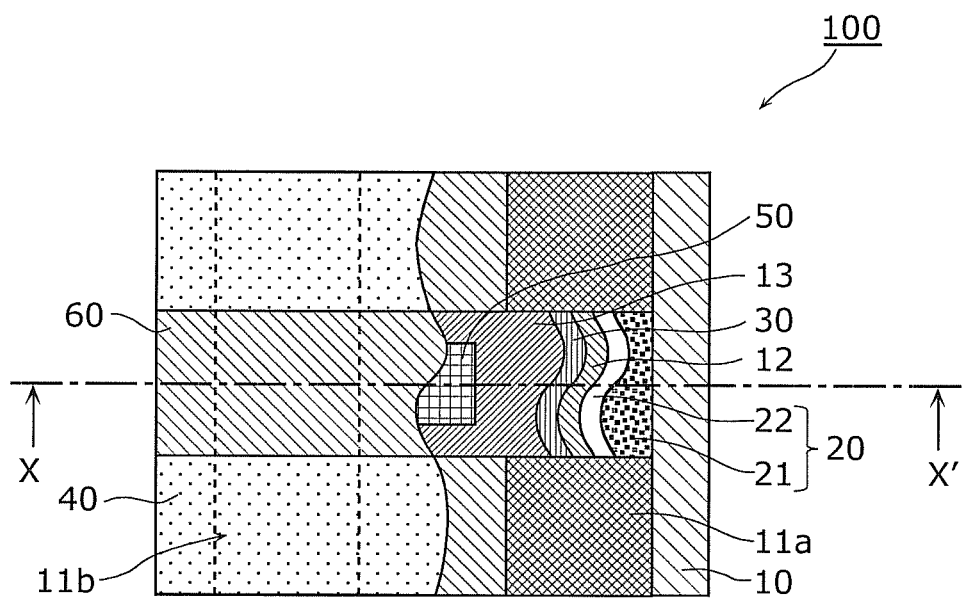
FIG. 1A is a partially cutout plan view illustrating a structure of a memory device according to Embodiment 1.

Hereinafter, Embodiments of the present invention will be described with reference to the drawings. The same constituent elements are assigned the same reference signs and some descriptions are not repeated.

It should be noted that in the present invention, "forming . . . above the substrate" means, according to common interpretation, both forming a structural element directly on top of the substrate and forming a structural element above the substrate with another element disposed therebetween. Furthermore, "interlayer insulating film" refers to both an interlayer insulating film formed by one process in the processes of manufacturing a memory device and an interlayer insulating film obtained by combining interlayer insulating films formed by respective processes of manufacturing the memory device. Furthermore, the shapes of memory devices, via holes, and lines are merely schematic, and rectangles representing the memory devices and the via holes in a plan view include a right-angled rectangle and a rounded rectangle. Furthermore, the number of memory devices, via holes, and lines are the number easily illustrated, and the present invention is not limited by these numbers.

Furthermore, a diode formed within a memory device comprises metal-non-conductive (semiconductor or insulator)- metal, and is a bi-directional diode having rectification properties under positive and negative bias conditions.

In the Description, memory devices formed on a lower line of a cross-point memory array of a single layer are described. Not limited to these, the memory devices formed on the lower line of a cross-point memory array of two or more layers produce the same advantage.

The features of the memory device according to the present invention are that (i) a variable resistance layer has a stacked structure including a high-resistance layer and a low-resistance layer, (ii) a plurality of electrodes (first electrodes) closer to the high-resistance layer included in the variable resistance layer are provided for each variable resistance layer, and (iii) a diode having the almost same element area as that of the high-resistance layer is connected to a second electrode so that the diode is connected in series with the high-resistance layer.

Accordingly, since the first electrodes, the common variable resistance layer, the common second electrode, and the common third electrode comprise a common diode and a plurality of variable resistance elements, a total number of which is equal to that of the first electrodes, the element area of the diode corresponding to the variable resistance elements can be larger than an element area of one diode corresponding to one variable resistance element, and an entire element area can be reduced. As a result, it is possible to substantially increase an allowable current amount of the diode corresponding to one variable resistance element, and prevent the diode from being destroyed by the current during an initial break operation and a resistance change operation.

Furthermore, since processing dimensions of the variable resistance layer and the diode can be larger than the minimum design dimension of the memory device including one variable resistance element and one diode, the memory device can be miniaturized without using special micromachining process technology. Hereinafter, although an exemplified case where one memory device (non-volatile storage element) according to the present invention solely includes two variable resistance elements will be described, the number of variable resistance elements included in one memory device may be three or more.

Embodiment 1

Hereinafter, a memory device, a method for manufacturing a memory device, a semiconductor storage device, and writing and read operations by the semiconductor storage device according to Embodiment 1 of the present invention will be described with reference to the drawings.

[Structure of Memory Device]

A memory device 100 according to Embodiment 1 will be described with reference to FIGS. 1A and 1B. FIG. 1A is a partially cutout plan view illustrating a structure of a memory device according to Embodiment 1. Furthermore, FIG. 1B is a section view illustrating the structure of the memory device cut along an X-X' line in FIG. 1A.

Figure 1B:
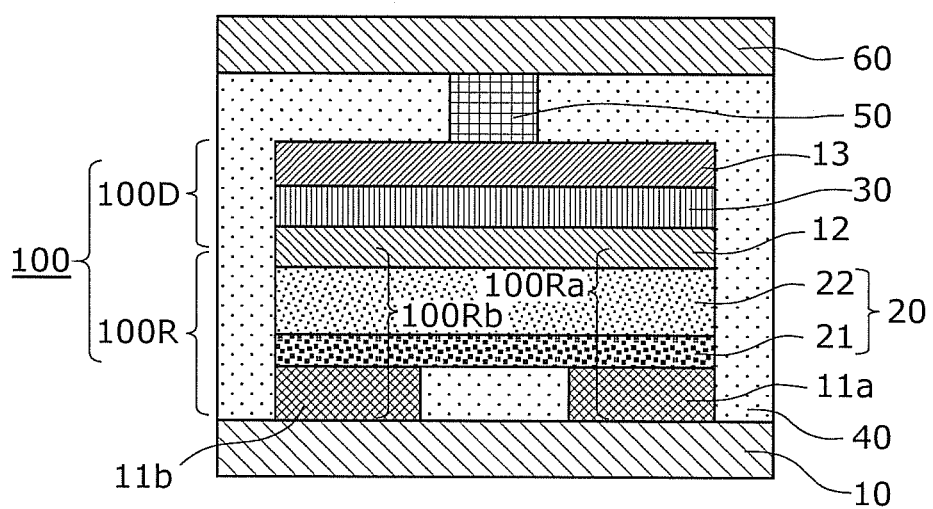
FIG. 1B is a section view illustrating the structure of the memory device cut along an X-X' line in FIG. 1A according to Embodiment 1.

As illustrated in FIGS. 1A and 1B, the memory device 100 according to Embodiment 1 is a planar memory device, and includes two first electrodes 11a and 11b, a second electrode 12, a third electrode 13, a variable resistance layer 20 between the first electrodes 11a and 11b and the second electrode 12, and a non-conductive layer 30 between the second electrode 12 and the third electrode 13. The variable resistance layer 20 includes a high-concentration variable resistance layer 21 closer to the first electrodes 11a and 11b, and a low-concentration variable resistance layer 22 closer to the second electrode 12.

In the memory device 100, the first electrodes 11a and 11b comprise metals such as platinum (Pt) and iridium (Ir), and are formed on and in contact with a substrate 10. The first electrodes 11a and 11b are formed in parallel with each other, at a predetermined distance.

The high-concentration variable resistance layer 21 is formed on the first electrodes 11a and 11b to be in contact with the upper surface of the first electrodes 11a and 11b. Furthermore, the high-concentration variable resistance layer 21 is formed across the first electrodes 11a and 11b. The oxygen concentration of the high-concentration variable resistance layer 21 is higher than that of the low-concentration variable resistance layer 22.

The low-concentration variable resistance layer 22 comprises an oxygen-deficient metal oxide, and is formed on the high-concentration variable resistance layer 21 to be in contact with the upper surface of the high-concentration variable resistance layer 21. The oxygen concentration of the low-concentration variable resistance layer 22 is lower than that of the high-concentration variable resistance layer 21. The oxygen-deficient metal oxide is a metal oxide having lower oxygen content than that of a metal oxide having stoichiometric composition. The metal oxide having stoichiometric composition is normally an insulator, and the oxygen-deficient metal oxide often has semiconductor properties.

The second electrode 12 comprises TaN (tantalum nitride), and is formed on the low-concentration variable resistance layer 22 to be in contact with the upper surface of the low-concentration variable resistance layer 22.

The non-conductive layer 30 comprises a nitrogen-deficient silicon nitride, and is formed on the second electrode 12 to be in contact with the upper surface of the second electrode 12. Here, the nitrogen-deficient silicon nitride is a silicon nitride having lower nitrogen content than that of a silicon nitride ($Si_3N_4$) having stoichiometric composition. The silicon nitride having stoichiometric composition is normally an insulator, and the nitrogen-deficient silicon nitride often has the semiconductor properties.

The third electrode 13 comprises TaN (tantalum nitride), and is formed on the non-conductive layer 30 to be in contact with the upper surface of the non-conductive layer 30.

Furthermore, an interlayer insulating film 40 is formed to surround a stacked structure including the first electrodes 11a and 11b, the high-concentration variable resistance layer 21, the low-concentration variable resistance layer 22, the second electrode 12, the non-conductive layer 30, and the third electrode 13.

Furthermore, the memory device 100 is electrically connected to a second line 60 through a plug 50 electrically connected to the upper surface of the third electrode 13. The plug 50 can secure distances between the first electrodes 11a and 11b and the second line 60, and reduce a capacitance between the lines.

The memory device 100 includes a variable resistance element 100R including first and second variable resistance elements 100Ra and 100Rb, a total number of which is equal to that of the first electrodes 11a and 11b with the stacked structure including the first electrodes, the variable resistance layer 20, and the second electrode 12. According to Embodiment 1, the variable resistance elements 100R includes two of the first and second variable resistance elements 100Ra and 100Rb, and further includes two of the first electrodes 11a and 11b, the one variable resistance layer 20, and the one second electrode 12. In other words, the first variable resistance element 100Ra includes the first electrode 11a, the high-concentration variable resistance layer 21, the low-concentration variable resistance layer 22, and the second electrode 12. Furthermore, the second variable resistance element 100Rb includes the first electrode 11b, the high-concentration variable resistance layer 21, the low-concentration variable resistance layer 22, and the second electrode 12. As such, the high-concentration variable resistance layer 21, the low-concentration variable resistance layer 22, and the second electrode 12 are shared between the first variable resistance element 100Ra and the second variable resistance element 100Rb, but the first electrode is separated into the first electrodes 11a and 11b. The element area of the variable resistance element 100R is defined as a total of areas (contact areas) in which of the first electrodes 11a and 11b and the high-concentration variable resistance layer 21 are in contact with each other.

The second electrode 12, the non-conductive layer 30, and the third electrode 13 comprise a diode 100D with the stacked structure in the memory device 100. The element area of the diode 100D is a smaller one of areas (contact areas) in which (i) the second electrode 12 and the non-conductive layer 30 are in contact with each other and (ii) the non-conductive layer 30 and the third electrode 13 are in contact with each other.

Next, operations of the memory device 100 will be described.

The metal oxide comprised in the high-concentration variable resistance layer 21 and the low-concentration variable resistance layer 22 in the memory device 100 generally has characteristics such that a resistance value is higher as the oxygen concentration is higher. The resistance value of the high-concentration variable resistance layer 21 closer to the first electrodes 11a and 11b is higher than that of the low-concentration variable resistance layer 22 closer to the second electrode 12.

The resistance change phenomenon occurs with formation of a filament path in the high-concentration variable resistance layer 21.

Then, with application of a predetermined voltage to the variable resistance layer 20, oxygen ions in the filament path formed in the high-concentration variable resistance layer 21 closer to the first electrodes 11a and 11b moves to the low-concentration variable resistance layer 22, and the oxygen concentration of the filament path in the high-concentration variable resistance layer 21 changes. Accordingly, the resistance of the first variable resistance element 100Ra and the second variable resistance element 100Rb changes.

The oxygen ions in the high-concentration variable resistance layer 21 moves within the filament path, and a region other than the filament path in the high-concentration variable resistance layer 21 remains in the high resistance state. Accordingly, the first variable resistance element 100Ra closer to the first electrode 11a can be structured, and besides, the second variable resistance element 100Rb closer to the first electrode 11b can be structured. The resistance value of the first variable resistance element 100Ra can independently change with application of a voltage between the first electrode 11a and the second electrode 12, and the resistance value of the second variable resistance element 100Rb can independently change with application of a voltage between the first electrode 11b and the second electrode 12. In other words, resistance values of the first variable resistance element 100Ra and the second variable resistance element 100Rb can independently change with application of a voltage between each of the first electrodes 11a and 11b and the second electrode 12.

Here, a voltage with which potentials of the first electrodes 11a and 11b are relatively higher than the potential of the second electrode 12 and which is for changing the variable resistance layer 20 from a low resistance state to the high resistance state is defined as a high resistance voltage (HR voltage). Furthermore, a voltage with which potentials of the first electrodes 11a and 11b are relatively lower than the potential of the second electrode 12 and which is for changing the variable resistance layer 20 from a high resistance state to a low resistance state is defined as a low resistance voltage (LR voltage). As such, the low resistance state and the high resistance state of the first variable resistance element 100Ra and the second variable resistance element 100Rb can be reversibly changed with application of the HR voltage or the LR voltage.

As described above, the memory device 100 solely includes two of the first variable resistance element 100Ra and the second variable resistance element 100Rb, and the diode 100D shared between the two variable resistance elements. Accordingly, the element area of the diode 100D can be larger than the element area of each of the variable resistance elements 100Ra and 100Rb without increasing the area of the memory device. Thus, the capacity of memory device can be increased without miniaturizing the variable resistance layer. As a result, it is possible to substantially increase an allowable current amount of the diode, and prevent the diode from being destroyed by the current during an initial break operation and a resistance change operation.

Furthermore, since processing dimensions of the variable resistance layer and the diode can be larger than the minimum design dimension of the memory device, the memory device can substantially be miniaturized without using special micromachining process technology.

Although the shape of the stacked structure from the high-concentration variable resistance layer 21 to the third electrode 13 in the plan view is represented by a rectangle as illustrated in FIG. 1A, the shape is not limited to the rectangle. For example, the shape of the stacked structure in the plan view may be represented by an oval or a polygon.

Furthermore, although the stacked structure from the high-concentration variable resistance layer 21 to the third electrode 13 is formed vertical to the substrate 10 as illustrated in FIG. 1B, it does not always have to be so. For example, the present invention includes a tilt on a cross-section surface of the stacked structure manufactured in an actual manufacturing process (tapered form) and protrusion and depression on a side surface of the stacked structure.

Furthermore, although the second electrode 12 is an electrode of a single layer shared between the variable resistance element 100R and the diode 100D as illustrated in FIG. 1B, the second electrode 12 does not have to be so. For example, when the variable resistance element 100R and the diode 100D separately comprise appropriate electrode materials, the second electrode 12 may have a stacked structure including two or more layers comprising different electrode materials.

Although the first electrodes are two in Embodiment 1 as illustrated as 11a and 11b in FIG. 1B, the present invention is not limited to this. For example, when the first electrodes are three or more, as long as the first electrodes are in contact with the high-concentration variable resistance layer 21, the same advantage can be produced. This is true for the descriptions from Embodiment 2 to Embodiment 5 to be described later.

[Method for Manufacturing Memory Device]

Next, a method for manufacturing the memory device 100 will be described with reference to FIGS. 2A to 2H. FIGS. 2A to 2H are section views illustrating processes of manufacturing a memory device according to Embodiment 1.

Figure 2A:
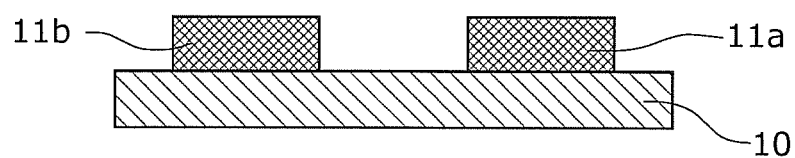
FIG. 2A is a section view illustrating a process of manufacturing a memory device (process of forming first electrodes) according to Embodiment 1.

As illustrated in FIG. 2A, a conductive film is deposited on the substrate 10 using a sputtering method, a CVC method, and so on. Then, the conductive film is patterned into the first electrodes 11a and 11b each with a predetermined shape through masking using an exposure process and etching.

Here, the material of the first electrodes 11a and 11b is preferably a material from which functions of the high-concentration variable resistance layer 21 are easily derived, that is, a material in which the resistance state is easily changed. The material is preferably a noble metal material, for example, one of platinum (Pt), palladium (Pd), iridium (Ir), and a composite of these. According to Embodiment 1, iridium (Ir) is used as the material of the first electrodes 11a and 11b. Here, the material in which the resistance state is easily changed is a material having a higher standard electrode potential than a standard electrode potential of a metal comprised in the variable resistance layer. The standard electrode potential is a parameter representing a degree at which a material is resistant to oxidation, and the larger the parameter is, the material is more resistant to oxidation. Generally, the standard electrode potential of a noble metal is higher. The standard electrode potentials of a plurality of first electrode materials that are described above are higher than those of metals comprised in the variable resistance layer (Ta, Hf, Zr, and others to be described later). The material that is resistant to oxidation is defined as an electrode material, and oxygen effectively reacts (oxidation or reduction) with the variable resistance layer.

Furthermore, the first electrodes 11a and 11b have a width of 0.5 µm, and a thickness of 50 nm. Furthermore, a distance between the first electrodes 11a and 11b that are adjacent to each other is 0.5 µm.

Furthermore, although not illustrated, when the memory device according to Embodiment 1 is used as a storage device for an integrated circuit, a substrate in which a transistor circuit is formed in advance can be used. Here, the first electrodes 11a and 11b are connected to a via hole for electrically connecting the transistor circuit. This is true for the descriptions from Embodiment 2 to Embodiment 4 to be described later.

Figure 2B:
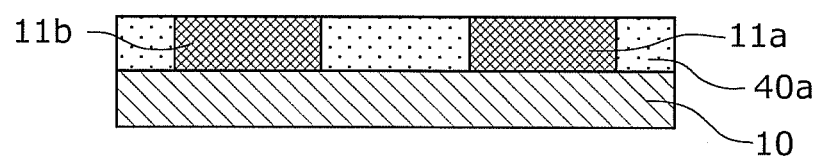
FIG. 2B is a section view illustrating a process of manufacturing the memory device (process of forming a first insulating film) according to Embodiment 1.

Next, as illustrated in FIG. 2B, an interlayer insulating film 40a comprising TEOS-SiO (a silicon dioxide formed using tetraethoxysilane (ethyl orthosilicate)) is deposited using the CVD method with a thickness of 200 nm to cover the first electrodes 11a and 11b. Then, a wafer surface including the interlayer insulating film 40a and the first electrodes 11a and 11b becomes planarized, for example, by polishing the surface of the interlayer insulating film 40a with a chemical mechanical polishing (CMP) method until the surface of each of the first electrodes 11a and 11b is exposed.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 40a. In addition, a stacked structure of these materials may be used as the interlayer insulating film 40a.

Figure 2C:
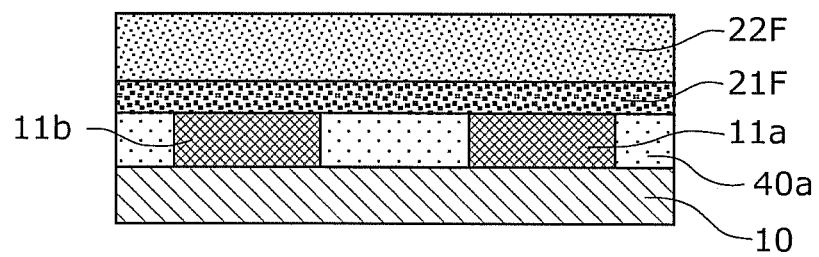
FIG. 2C is a section view illustrating a process of manufacturing the memory device (process of forming a variable resistance layer) according to Embodiment 1.

Next, as illustrated in FIG. 2C, a high-concentration variable resistance film 21F to be the high-concentration variable resistance layer 21 and a low-concentration variable resistance film 22F to be the low-concentration variable resistance layer 22 are successively deposited to cover the entire wafer surface.

Here, an oxygen-deficient film that is an oxide having lower oxygen content than an oxide having stoichiometric composition is used as a material of the low-concentration variable resistance film 22F. According to Embodiment 1, a case where a tantalum oxide is used as the high-concentration variable resistance film 21F and the low-concentration variable resistance film 22F will be described. The tantalum oxide comprised in the low-concentration variable resistance film 22F (low-concentration variable resistance layer 22) is represented by $TaO_x$ with a preferred range of ($0<x<2.5$). The low-concentration variable resistance film 22F has a thickness between 30 nm and 100 nm inclusive. Furthermore, the tantalum oxide comprised in the high-concentration variable resistance film 21F (high-concentration variable resistance layer 21) is represented by $TaO_y$ with a preferred range of ($x<y$). The high-concentration variable resistance film 21F has a thickness between 1 nm and 10 nm inclusive. The values X and Y representing oxygen composition in the chemical formulae of $TaO_x$ and $TaO_y$ can be controlled by adjusting a ratio of oxygen gas flow to argon gas flow at the time of sputtering.

The specific manufacturing process of forming, by the sputtering method, the high-concentration variable resistance film 21F and the low-concentration variable resistance film 22F using the tantalum oxide will be described. First, a substrate is placed in a sputtering apparatus, and the inside of the sputtering apparatus is vacuumed up to approximately $7\times10^{-4}$ Pa. Sputtering is performed above the structure illustrated in FIG. 2B, with tantalum as a target, power set to 250 W, a total gas pressure of the Ar gas and the oxygen gas set to 3.3 Pa, and a preset temperature of the substrate set to 30° C. When the oxygen partial pressure ratio is changed from 1% to 7%, the oxygen content of the tantalum oxide layer (that is, the composition ratio of oxygen atoms to tantalum atoms) changes from approximately 40% ($TaO_{0.66}$) to approximately 70% ($TaO_{2.3}$). The composition of the tantalum oxide layer can be measured using Rutherford Backscattering Spectrometry. Furthermore, an oxide having stoichiometric composition means, in the case of tantalum oxide, $Ta_2O_5$ which is an insulator. The metal oxide has semiconductor properties when the number of oxygen atoms is reduced. According to Embodiment 1, a $Ta_2O_5$ film with a thickness of 6 nm as the high-concentration variable resistance layer 21 and a $TaO_{0.66}$ film with a thickness of 50 nm as the low-concentration variable resistance layer 22 are deposited.

Although an oxygen-deficient tantalum oxide film is used as the low-concentration variable resistance layer 22 according to Embodiment 1, a material other than the oxygen-deficient tantalum oxide film may be used. For example, a variable resistance film with a similar stacked structure as the oxygen-deficient tantalum oxide film can be formed using an oxide comprising oxygen-deficient iron, and other transition metal oxides, such as hafnium (Hf) and zirconium (Zr). The sputtering method, the CVD method, and so on are used as the film-forming method for these materials.

Figure 2D:
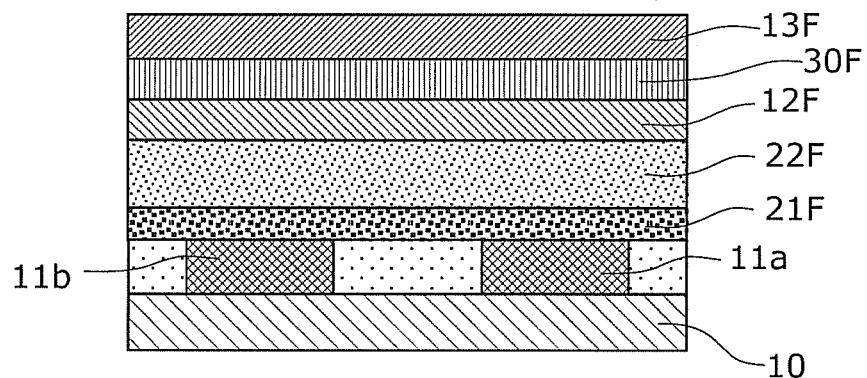
FIG. 2D is a section view illustrating a process of manufacturing the memory device (process of forming stacked films) according to Embodiment 1.

After the formation of the high-concentration variable resistance film 21F and the low-concentration variable resistance film 22F, a second electrode film 12F to be the second electrode 12 is deposited on the wafer surface as illustrated in FIG. 2D. The same material as that for the first electrodes 11a and 11b can be used for the second electrode film 12F. Alternatively, since the second electrode 12 is preferably an electrode that facilitates maintaining the resistance of the interface between the second electrode 12 and the low-concentration variable resistance layer 22, that is, an electrode that does not easily allow resistance change (electrode having a lower standard electrode potential than that of the first electrode), the material of the second electrode film 12F may be one of copper (Cu), titanium (Ti), tungsten (W), tantalum (Ta), and a metal comprising at least one of these nitrides. Furthermore, the sputtering method, the CVD method, and so on can be used as the film-forming method for these materials. According to Embodiment 1, a tantalum nitride (TaN) film with a thickness of 30 nm is deposited as the second electrode film 12F by the sputtering method.

Next, a non-conductive film 30F to be the non-conductive layer 30 is deposited on the wafer surface as illustrated in FIG. 2D. For example, the nitrogen-deficient silicon nitride ($SiN_x$) is used as a material of the non-conductive film 30F.

A $SiN_x$ film having such semiconductor properties can be formed, for example, by reactive sputtering in the nitrogen gas atmosphere using a Si target, and a bandgap of the $SiN_x$ film can be changed and current-voltage characteristics of a diode can be adjusted by changing a composition x of the nitrogen. The non-conductive film 30F may be formed with a pressure in a chamber set to 0.1 to 1 Pa, and an $Ar/N_2$ flow rate set to 18 sccm/2 sccm under a room temperature. A $SiN_x$ (x=0.6) film with a thickness of 15 nm is deposited as the non-conductive film 30F according to Embodiment 1.

Next, a third electrode film 13F to be the third electrode 13 is deposited on the wafer surface as illustrated in FIG. 2D. The same material as that for the second electrode 12 can be used for the third electrode film 13F. According to Embodiment 1, a tantalum nitride (TaN) film with a thickness of 30 nm is deposited as the third electrode film 13F by the sputtering method. Furthermore, aside from the sputtering method, the CVD method may be used as the deposition method.

Accordingly, the stacked films including the high-concentration variable resistance film 21F, the low-concentration variable resistance film 22F, the second electrode film 12F, the non-conductive film 30F, and the third electrode film 13F can be formed on the first electrodes 11a and 11b.

Figure 2E:
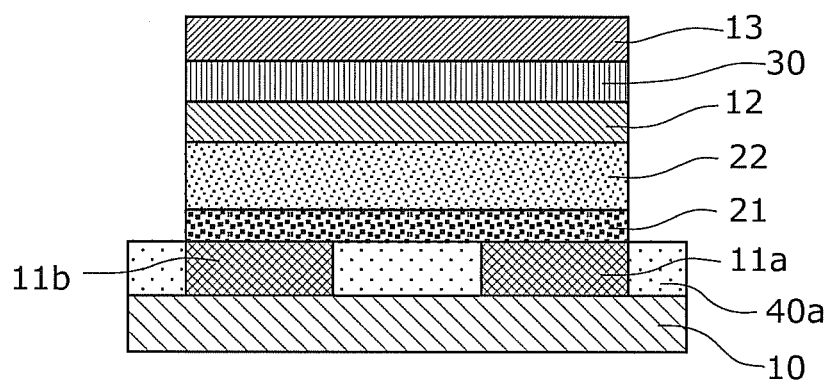
FIG. 2E is a section view illustrating a process of manufacturing the memory device (process of forming stacked layers) according to Embodiment 1.
Figure 2F:
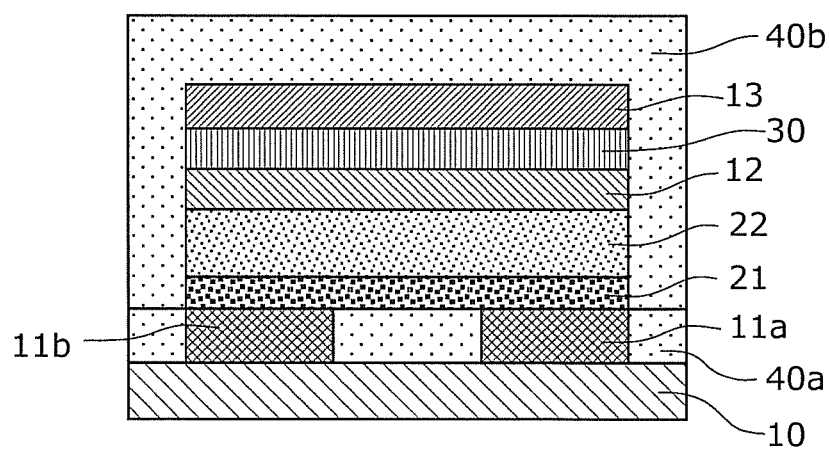
FIG. 2F is a section view illustrating a process of manufacturing the memory device (process of forming a second insulating film) according to Embodiment 1.

Next, the stacked films are masked using an exposure process and etched to form, with a predetermined dimension, a stacked structure including the high-concentration variable resistance layer 21, the low-concentration variable resistance layer 22, the second electrode 12, the non-conductive layer 30, and the third electrode 13 that are across the first electrodes 11a and 11b as illustrated in FIG. 2E. The stacked structure after the etching is represented by a rectangle of 1.5 μm×0.5 μm in the plan view according to Embodiment 1. Furthermore, a longer side of the stacked structure is in a direction across the first electrodes 11a and 11b.

Next, an interlayer insulating film 40b with a thickness of 600 nm and comprising TEOS-SiO is deposited using the CVD method, and the interlayer insulating film 40b is extended upward. Then, the wafer surface becomes almost planarized by polishing the interlayer insulating film 40b on the third electrode 13 with the CMP method until the thickness of the interlayer insulating film 40b reaches 200 nm. Accordingly, an interlayer insulating film 40 can be formed to surround the stacked structure including the first electrodes 11a and 11b, the high-concentration variable resistance layer 21, the low-concentration variable resistance layer 22, the second electrode 12, the non-conductive layer 30, and the third electrode 13.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 40b. In addition, a stacked structure of these materials may be used as the interlayer insulating film 40b.

Figure 2G:
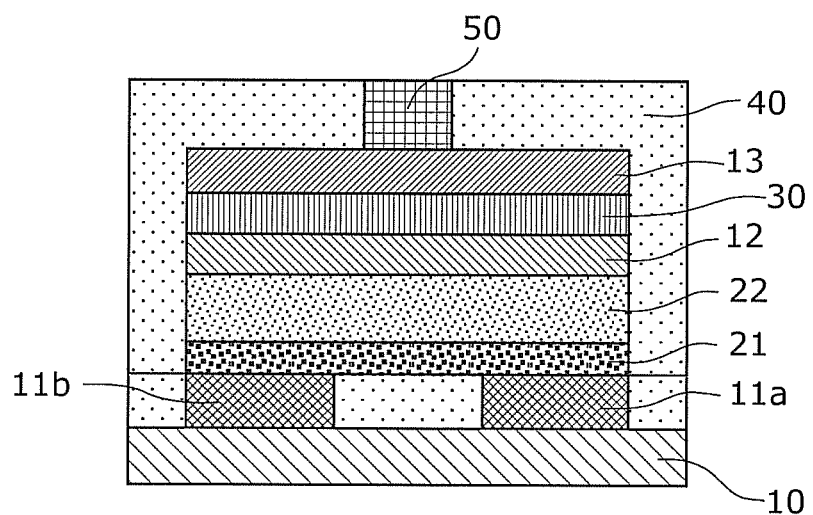
FIG. 2G is a section view illustrating a process of manufacturing the memory device (process of forming a plug) according to Embodiment 1.

Next, a plug 50 is formed to be embedded in the interlayer insulating film 40 on the third electrode 13 as illustrated in FIG. 2G. The plug 50 can be formed as indicated below. Specifically, a via hole with a diameter of 260 nm is formed in the interlayer insulating film 40b in FIG. 2F to reach the surface of the third electrode 13. The via hole can be easily formed using general semiconductor process technology. For example, the structure illustrated in FIG. 2G can be formed by forming such a via hole, forming a conductive film that is to be the plug 50 and comprises tungsten (W), using the CVD method, and performing the CMP on the conductive film. Aside from tungsten (W), copper (Cu), or aluminum (Al) may be used as a material of the plug 50.

Figure 2H:
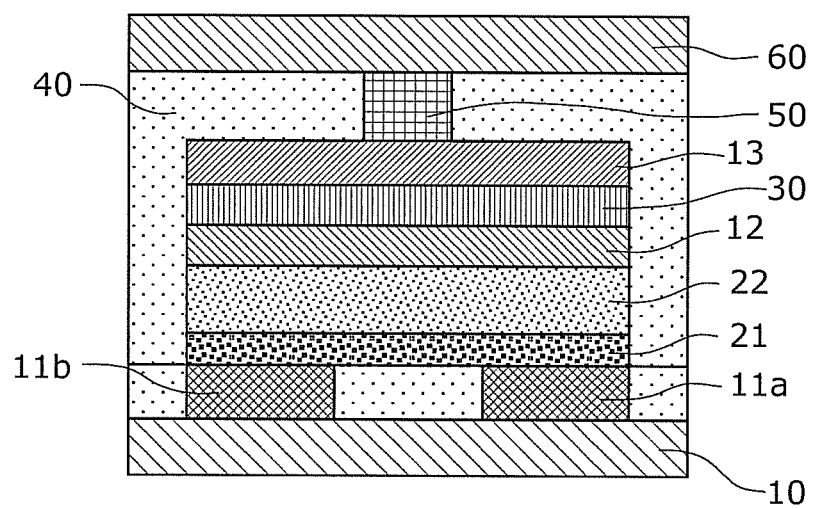
FIG. 2H is a section view illustrating a process of manufacturing the memory device (process of forming a line layer) according to Embodiment 1.

Next, a second line 60 is formed as illustrated in FIG. 2H. The second line 60 can be formed as below. Specifically, a conductive film for lines is deposited on the surface of the structure illustrated in FIG. 2G by the sputtering method, the CVC method, and so on. Then, the conductive film is patterned into the second line 60 with a predetermined shape by forming a photoresist mask through an exposure process and through etching. Al, an Al—Cu alloy, a Ti—Al—N alloy, and a Cu line formed through a damascene process that are also used in the general semiconductor process technology can be used as the material of the second line 60. According to Embodiment 1, an Al film is deposited by the sputtering method as the second line 60. Furthermore, the second line 60 has a thickness between 200 nm and 400 nm inclusive, and a width of approximately 0.5 μm.

Accordingly, the memory device 100 according to Embodiment 1 can be manufactured. When the memory device 100 is manufactured by the manufacturing method according to Embodiment 1, in the case where an absolute value of an LR voltage is 1.5 V, an absolute value of an HR voltage is approximately 2.0 V as a voltage applied between each of the first electrodes 11a and 11b and the second electrode 12. Furthermore, an absolute value of a threshold voltage of the diode 100D (the voltage when the diode is turned OFF, for example, the voltage at the time when the current that flows through the diode is 1 μA) is, for example, approximately 2.3 V.

[Structure of Semiconductor Storage Device]

Figure 3:
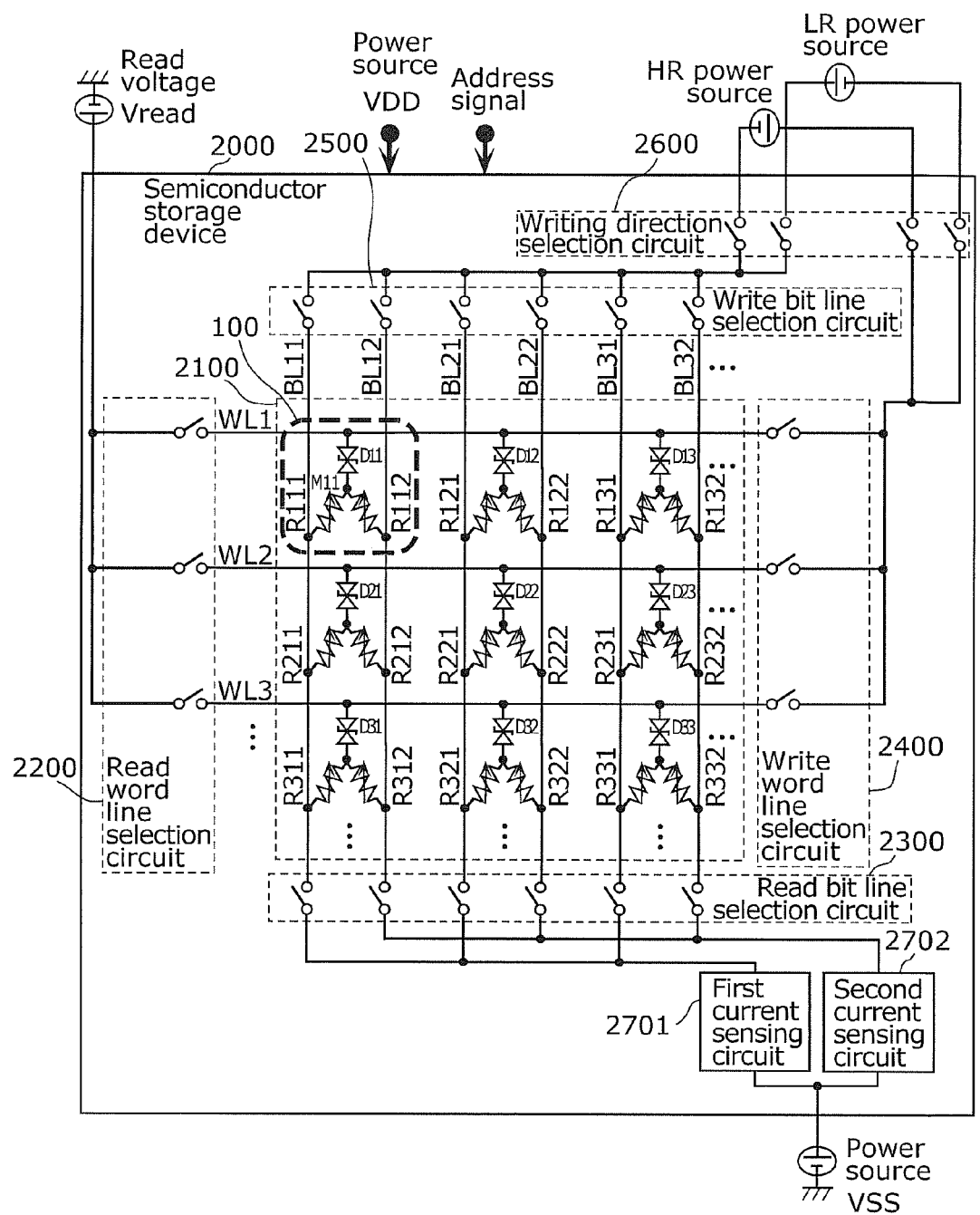
FIG. 3 illustrates an exemplified structure of a semiconductor storage device according to Embodiment 1.

Next, a semiconductor storage device 2000 according to Embodiment 1 will be described with reference to FIG. 3. FIG. 3 illustrates an exemplified structure of a semiconductor storage device according to Embodiment 1.

The semiconductor storage device 2000 according to Embodiment 1 is a variable resistance nonvolatile storage device including the memory devices 100 illustrated in FIGS. 1A and 1B according to Embodiment 1, and includes a cross-point memory cell array 2100, a plurality of word lines WL that extend in a row direction (X direction) of the memory cell array 2100, and a plurality of bit lines BL that extend in a column direction (Y direction) of the memory cell array 2100.

The word lines WL three-dimensionally cross the bit lines BL, and the memory devices 100 are formed to correspond to cross-points between the word lines WL and the bit lines BL.

The memory cell array 2100 includes memory cells Mij arranged in a matrix of p rows and q columns, where i, j, p, and q are natural numbers and the reference signs here satisfy a relationship of i≤p, j≤q. Each of the memory cells Mij of the memory cell array 2100 includes the memory device 100 according to Embodiment 1 illustrated in FIGS. 1A and 1B, and the memory device 100 includes one bi-directional diode Dij, and two variable resistance elements of a first variable resistance element Rij1 and a second variable resistance element Rij2.

The bi-directional diode Dij is a current steering element having a threshold voltage in both of the positive and negative directions (for example, the absolute values are 2.3 V), and one terminal of the bi-directional diode Dij is connected to the word line WLi. The terminal of the bi-directional diode Dij is equivalent to the third electrode 13, and the word line WLi is equivalent to the second line 60 in FIGS. 1A and 1B according to Embodiment 1. In other words, the word line WLi is upper than the bit lines BLi1 and BLj2 according to Embodiment 1. Furthermore, the other terminal of the bi-directional diode Dij is connected to the other terminal of the first variable resistance element Rij1 (electrode that is not connected to the bit line BLj1), and to the other terminal of the second variable resistance element Rij2 (electrode that is not connected to the bit line BLj2).

Furthermore, the first variable resistance element Rij1 and the second variable resistance element Rij2 are variable resistance elements that changes from the low resistance state to the high resistance state with application of the respective HR voltages (for example, the absolute value is 2.0 V), and changes from the high resistance state to the low resistance state with application of the respective LR voltages (for example, the absolute value is 1.5). In each of the memory cells Mij, one terminal of the first variable resistance element Rij1 (opposite to the bi-directional diode Dij) is connected to the bit line BLj1. Furthermore, one terminal of the second variable resistance element Rij2 (opposite to the bi-directional diode Dij) is connected to the bit line BLj2. In other words, the electrodes of the first variable resistance element Rij1 and the second variable resistance element Rij2 that are not connected to each other are connected to different bit lines. According to Embodiment 1, the first electrodes 11a and 11b in FIGS. 1A and 1B share the bit line BLj1 (BLj2) and the electrodes of the first variable resistance element Rij1 and the second variable resistance element Rij2 that are not connected to each other. In other words, the bit lines BLi1 and BLj2 are lower than the word line WLi according to Embodiment 1. The other terminals of the first variable resistance element Rij1 and the second variable resistance element Rij2 are connected to the electrode of the bi-directional diode Dij.

Similarly, a cross-point memory cell array can be structured using memory devices according to Embodiments 2 to 10 to be described later. Furthermore, in order to reduce the resistance of the bit lines BLj1 and BLj2, a line with a lower resistance may be formed along the first electrodes 11a and 11b.

Furthermore, the semiconductor storage device 2000 according to Embodiment 1 includes a read word line selection circuit 2200, a read bit line selection circuit 2300, a write word line selection circuit 2400, a write bit line selection circuit 2500, a writing direction selection circuit 2600, a first current sensing circuit 2701, and a second current sensing circuit 2702.

The read word line selection circuit 2200 includes a plurality of switches connected to the respective terminals of the word lines WLi. When the semiconductor storage device 2000 performs a read operation, the read word line selection circuit 2200 controls the switches according to an address signal from outside of the semiconductor storage device 2000, and selects one of the word lines to apply a first potential to the third electrode of the memory cell from which data is to be read. In other words, the read word line selection circuit 2200 selects only the word line WLi connected to the memory cell Mij including the first variable resistance element Rij1 or the second variable resistance element Rij2 to be read, and applies a read voltage Vread to the third electrode of the memory cell Mij to be read.

The read bit line selection circuit 2300 includes a plurality of switches connected to the respective terminals of the bit lines BLj1 and BLj2. When the semiconductor storage device 2000 performs a read operation, the read bit line selection circuit 2300 controls the switches according to an address signal from outside of the semiconductor storage device 2000, and selects one of the bit lines to apply a same second potential different from the first potential simultaneously to the first electrodes of the memory cell to be read. In other words, the read bit line selection circuit 2300 selects two bit lines BLj1 and BLj2 that are adjacent to each other and are connected to the memory cell Mij including the first variable resistance element Rij1 or the second variable resistance element Rij2 to be read, and simultaneously applies a power source voltage VSS to the two first electrodes of the memory cell Mij to be read. Here, the bit lines to which the power source voltage VSS is applied are connected to the first current sensing circuit 2701 and the second current sensing circuit 2702.

The write word line selection circuit 2400 includes a plurality of switches connected to the respective other terminals (right terminals in FIG. 3) of the word lines WLi. When the semiconductor storage device 2000 performs a write operation, the write word line selection circuit 2400 controls the switches according to an address signal from outside of the semiconductor storage device 2000, and selects only the word line WLi connected to the memory cell Mij including the first variable resistance element Rij1 or the second variable resistance element Rij2 to which data is to be written.

The write bit line selection circuit 2500 includes a plurality of switches connected to the respective other terminals (upper terminals in FIG. 3) of the bit lines BLi1 and BLi2. When the semiconductor storage device 2000 performs a write operation, the write bit line selection circuit 2500 controls the switches according to an address signal from outside of the semiconductor storage device 2000, and selects only the bit line BLj1 (or bit line BLj2) connected to the first variable resistance element Rij1 (or the second variable resistance element Rij2) to which data is to be written.

The writing direction selection circuit 2600 includes a plurality of switches connected to the write word line selection circuit 2400 and the write bit line selection circuit 2500, and controls the switches according to a value to be written in order to switch a direction of a voltage to be applied to the first variable resistance element Rij1 or the second variable resistance element Rij2. In other words, the writing direction selection circuit 2600 can change a resistance state (the high resistance state or the low resistance state) of the first variable resistance element Rij1 and the second variable resistance element Rij2. As illustrated in FIG. 3, each of an HR power source and an LR power source outputs a predetermined voltage to one of the bit lines selected to apply an HR voltage and an LR voltage to the selected variable resistance elements.

The first current sensing circuit 2701 detects, in a read operation, a current that flows through the bit line BLj1 out of the two bit lines BLj1 and BLj2 that are adjacent to each other and are connected to the power source VSS.

The second current sensing circuit 2702 detects, in a read operation, a current that flows through the bit line BLj2 out of the two bit lines BLj1 and BLj2 that are adjacent to each other and are connected to the power source VSS.

As such, the first current sensing circuit 2701 and the second current sensing circuit 2702 are alternately connected to the bit lines through the read bit line selection circuit 2300.

The detection of currents that flow through the bit lines BLj1 and BLj2 by the first current sensing circuit 2701 and the second current sensing circuit 2702, respectively makes it possible to determine respective resistance states of the first variable resistance element Rij1 and the second variable resistance element Rij2 and read information of the memory cells to be read.

Although the read word line selection circuit 2200 is connected to terminals of the word lines WLi and the write word line selection circuit 2400 is connected to the other terminals of the word lines WLi according to Embodiment 1, the configuration does not always have to be so. The read word line selection circuit 2200 and the write word line selection circuit 2400 may be connected to the same terminals of the word lines WLi, and may be connected in parallel.

Similarly, although the read bit line selection circuit 2300 is connected to terminals of the bit lines BLj1 and BLj2 and the write bit line selection circuit 2500 is connected to the other terminals of the bit lines BLj1 and BLj2 according to Embodiment 1, the configuration does not always have to be so. The read bit line selection circuit 2300 and the write bit line selection circuit 2500 may be connected to the same terminals of the bit lines BLj1 and BLj2, and may be connected in parallel.

Furthermore, FIG. 3 illustrates the cross-point memory cell array 2100 limited to 3 rows and 6 columns of 18 bits according to Embodiment 1, which indicates that the memory cell array 2100 has a relatively smaller number of the memory devices 100. However, the memory cell array 2100 is not limited to such, and may include a larger number of the memory devices 100. For example, the memory cell array 2100 may be an array in which the memory devices 100 as many as 1024×1024 are arranged in a matrix, and include 1024 word lines WLi and 2048 bit lines BLj1 and BLj2. Furthermore, the memory cell array 2100 may be an p×q array, where p and q are any number. Furthermore, the semiconductor storage device 2000 may be formed of multi-stages in which the memory cell array 2100, the word lines WLi, and the bit lines BLj1 and BLj2 are stacked in a stacked direction.

Since the semiconductor storage device 2000 includes the memory devices 100 according to Embodiment 1, an allowable current amount of the bi-directional diode included in each of the memory devices 100 can be increased. Accordingly, it is possible to prevent the bi-directional diode from degrading in the characteristics and the variable resistance element from being destroyed, due to the current that flows through the bi-directional diode and the variable resistance element during the initial break operation and the write operation. Furthermore, the resistance states of the first and second variable resistance elements included in the memory device can be simultaneously read in the read operation. Hereinafter, a write operation and a read operation in the semiconductor storage device 2000 according to Embodiment 1 will be described hereinafter.

[Write Operation of a Semiconductor Storage Device]

Figure 4:
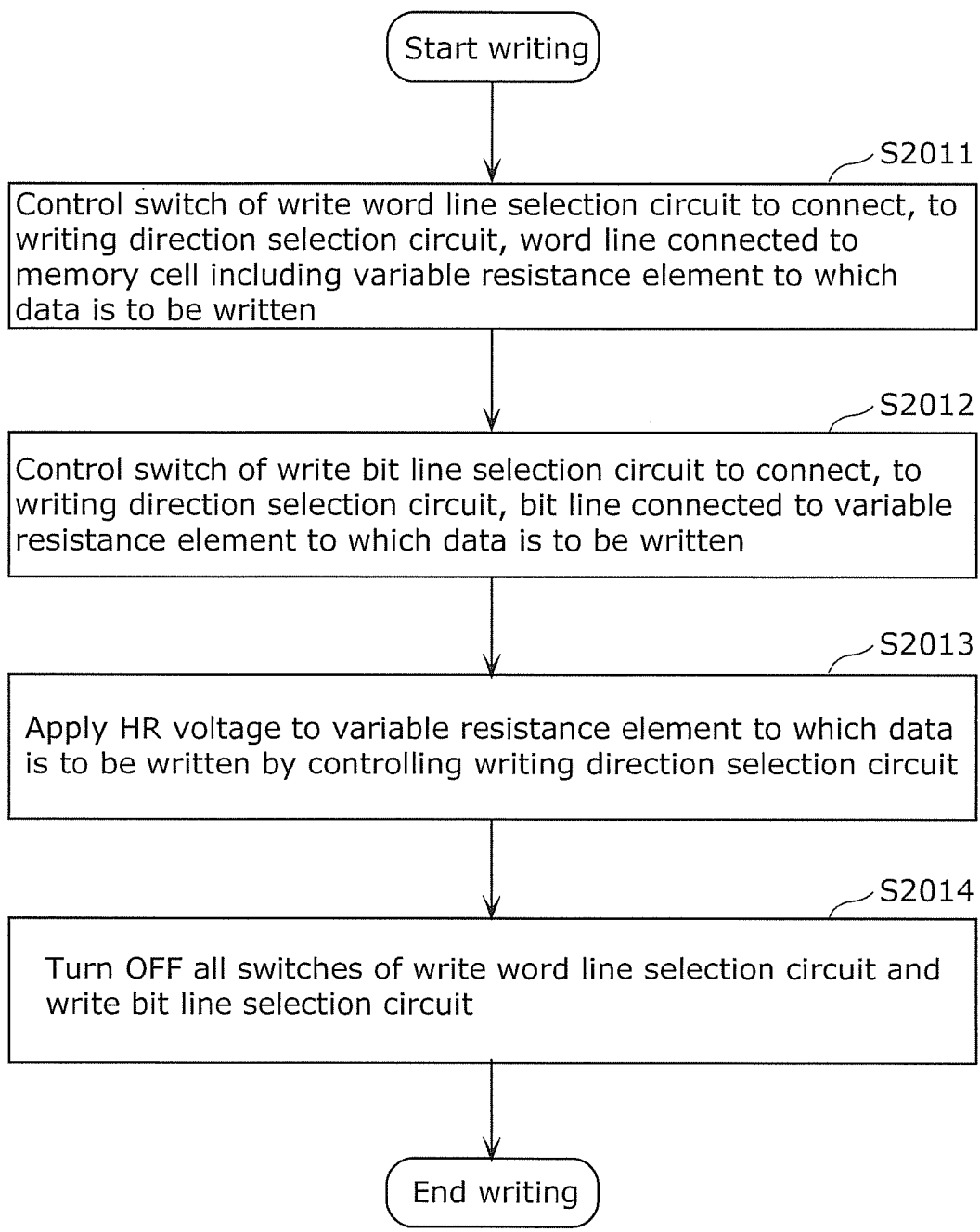
FIG. 4 is a flow chart of a write operation performed by the semiconductor storage device according to Embodiment 1.
Figure 5:
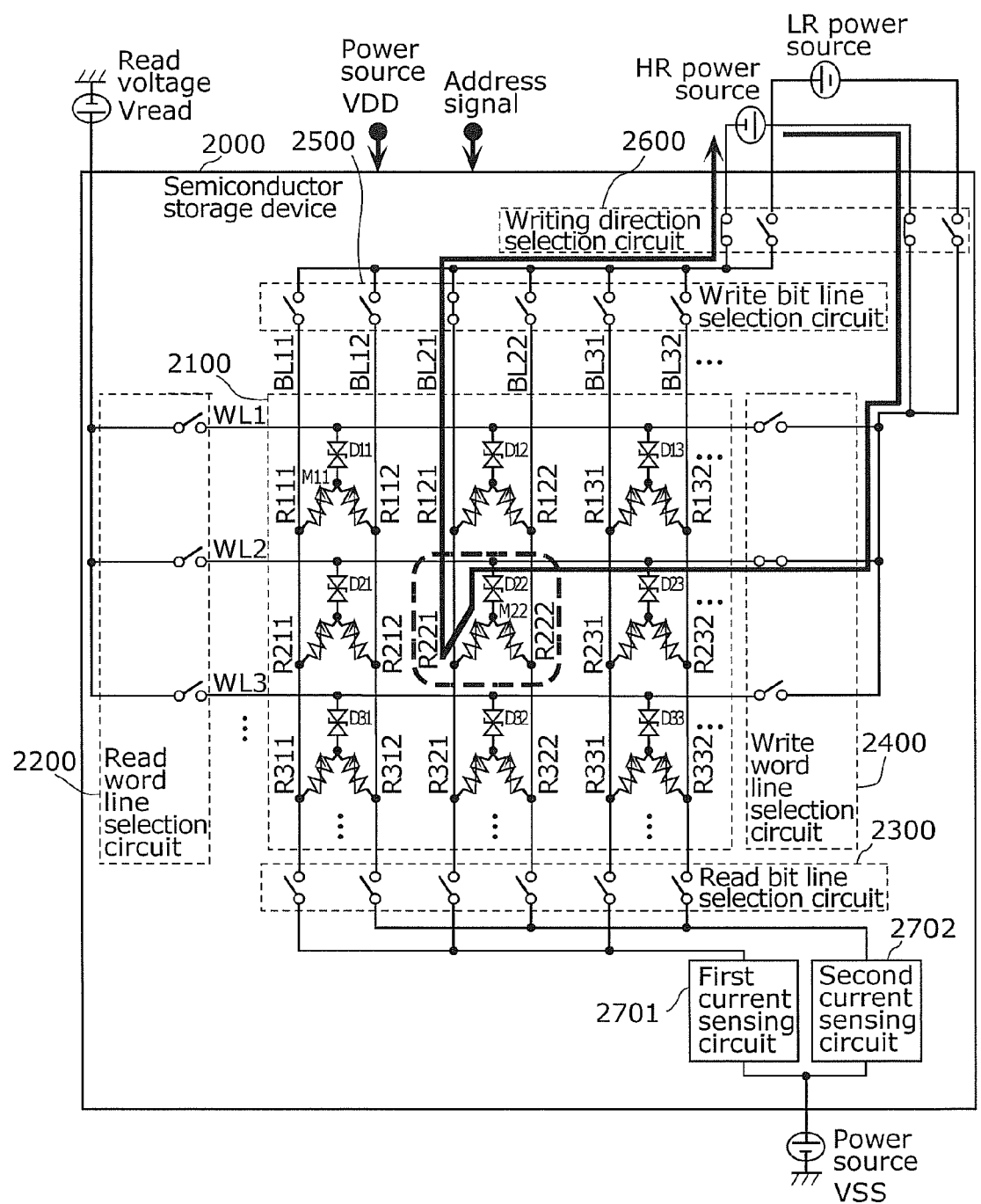
FIG. 5 illustrates a write operation performed by the semiconductor storage device according to Embodiment 1.

Next, an example of the write operation performed by the semiconductor storage device 2000 according to Embodiment 1 will be described with reference to FIGS. 4 and 5. FIG. 4 is a flow chart of the write operation performed by the semiconductor storage device according to Embodiment 1. FIG. 5 illustrates the write operation performed by the semiconductor storage device according to Embodiment 1.

As illustrated in FIG. 5, a write operation in which the high resistance state is written to a first variable resistance element R221 (at a low resistance state) included in a memory cell M22 according to Embodiment 1 will be described as an example.

First, as indicated in FIG. 4, one of the switches of the write word line selection circuit 2400 is controlled according to an address signal to connect, to the writing direction selection circuit 2600, the word line connected to the memory cell including the variable resistance element to which data is to be written (S2011). According to Embodiment 1, since the variable resistance element to which data is to be written is the first variable resistance element R221, only the word line WL2 is connected to the writing direction selection circuit 2600 as illustrated in FIG. 5. The word lines other than the word line WL2 are set to, for example, a floating state. Furthermore, a voltage with which the diodes included in the memory cells that are not selected are not to be turned ON may be applied to the word lines other than the word line WL2.

Next, one of the switches of the write bit line selection circuit 2500 is controlled according to an address signal to connect, to the writing direction selection circuit 2600, the bit line connected to the variable resistance element to which data is to be written (S2012). According to Embodiment 1, since the variable resistance element to which data is to be written is the first variable resistance element R221, only the bit line BL21 is connected to the writing direction selection circuit 2600 as illustrated in FIG. 5. The bit lines other than the bit line BL21 are set to the floating state.

Furthermore, at this point in time, the switches of the read word line selection circuit 2200 and the read bit line selection circuit 2300 are all turned OFF.

Next, the HR voltage is applied to the variable resistance element to which data is to be written by operating the writing direction selection circuit 2600 (S2013). Since the variable resistance element to which data is to be written is the first variable resistance element R221, the HR voltage VHR is applied to the first variable resistance element R221 through the word line WL2 and the bit line BL21 to set the first variable resistance element R221 to the high resistance state as illustrated in FIG. 5. Here, a period during which the HR voltage VHR is applied can be adjusted according to the period during which the writing direction selection circuit 2600 is operated according to the characteristics of the variable resistance element, and is 100 ns Embodiment 1. Furthermore, the absolute value of the voltage to be applied from the HR power source between the word line WL2 and the bit line BL21 is, for example, 4.4 V (>((HR voltage 2.0 V of the variable resistance element R221)+(threshold voltage 2.3 V of the diode D22)).

Then, all the switches of the write word line selection circuit 2400 and the write bit line selection circuit 2500 are turned OFF, so that the high resistance state writing operation to the first variable resistance element R221 in the memory cell M22 ends (S2014).

Furthermore, the first variable resistance element R221 (at the high resistance state) is set to the low resistance state with the same sequence, which is not illustrated. When the first variable resistance element R221 is set to the low resistance state, the LR voltage VLR is applied to the first variable resistance element R221 through the word line WL2 and the bit line BL21 so that the writing direction selection circuit 2600 is operated. Here, the absolute value of the voltage to be applied from the LR power source between the word line WL2 and the bit line BL21 may be 3.9 V (>((LR voltage 1.5 V of the variable resistance element R221)+(threshold voltage 2.3 V of the diode D22)). Furthermore, a period during which the LR voltage VLR is applied is, for example, 100 ns.

Although the case where the first variable resistance element is set to the high resistance state is described with reference to FIGS. 4 and 5, the same holds true for the case where the second variable resistance element is set to the high resistance state. Furthermore, the same holds true for the case where the second variable resistance element is set to the low resistance state.

Although the HR power source and the LR power source are constant voltage power sources, and a period during which the HR voltage VHR and the LR voltage VLR are applied to the first variable resistance element R221 is controlled according the operation period of the writing direction selection circuit 2600 in FIG. 5, the configuration and the operation are not limited to such. For example, the HR voltage VHR and the LR voltage VLR may be voltage pulses, and a method in which the application period of the variable resistance element R221 is controlled by the pulse width may be used.

[Read Operation of a Semiconductor Storage Device]

Figure 6:
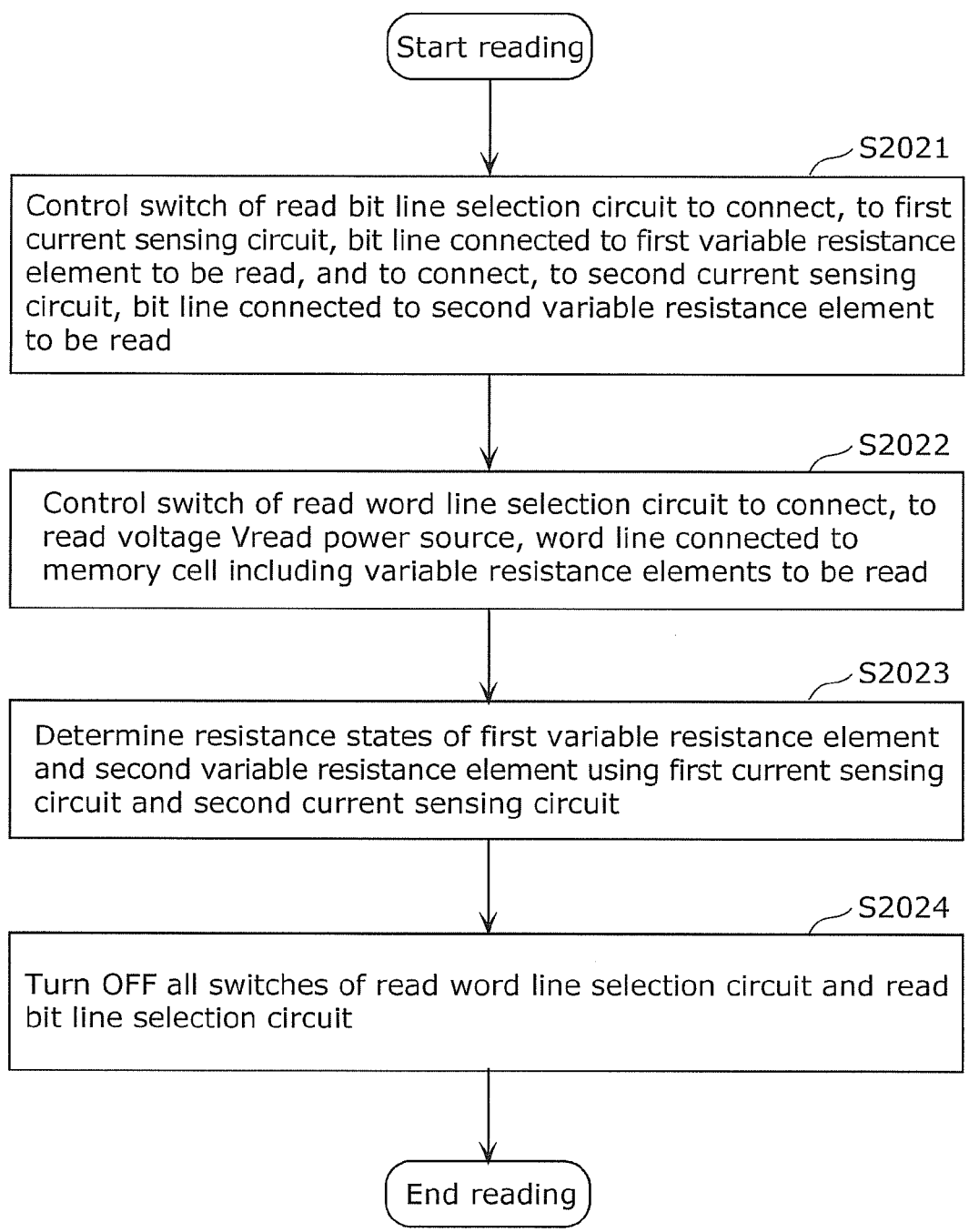
FIG. 6 is a flow chart of a read operation performed by the semiconductor storage device according to Embodiment 1.
Figure 7:
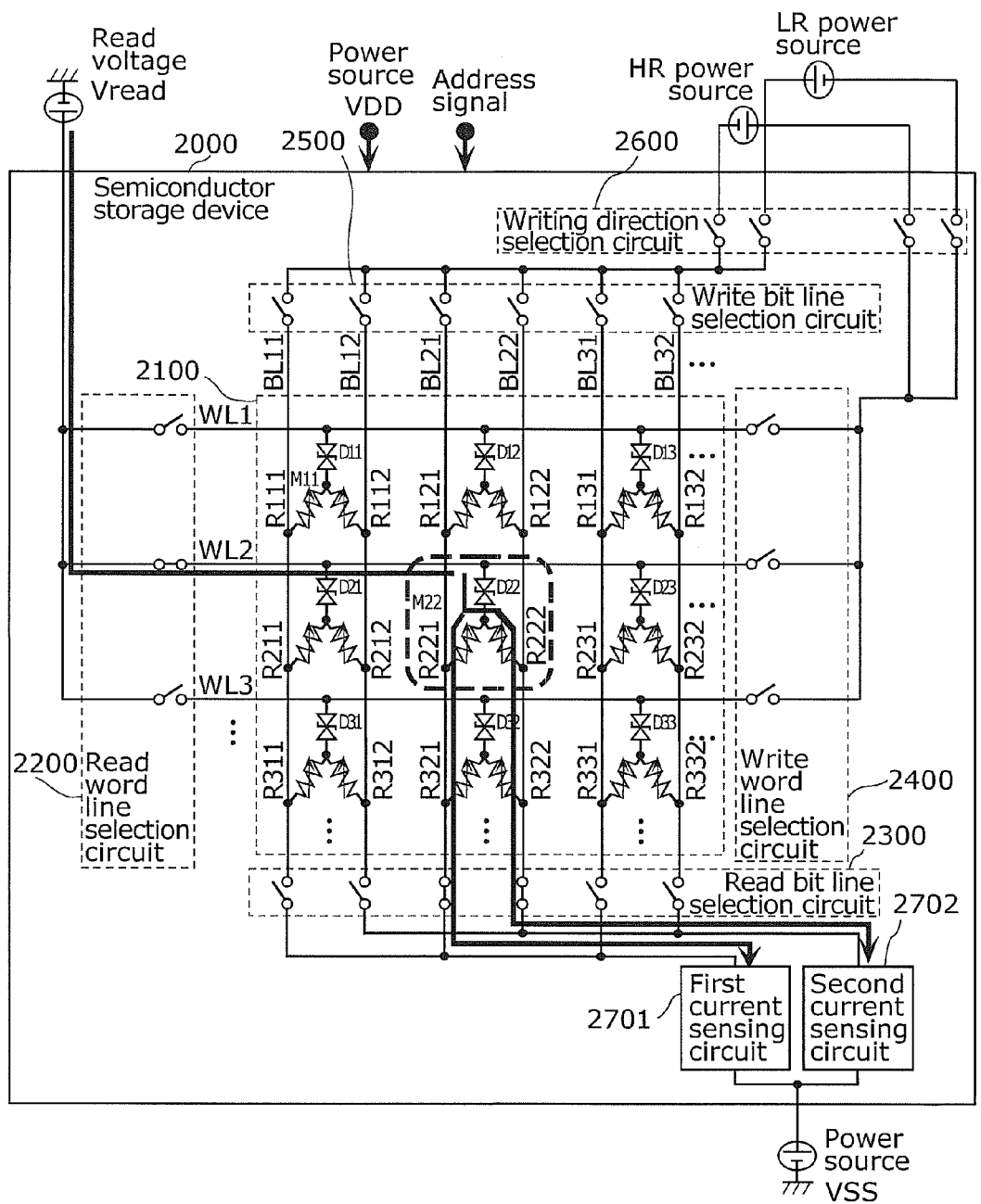
FIG. 7 illustrates the read operation performed by the semiconductor storage device according to Embodiment 1.

Next, a read operation performed by the semiconductor storage device 2000 according to Embodiment 1 will be described with reference to FIGS. 6 and 7. FIG. 6 is a flow chart of the read operation performed by the semiconductor storage device according to Embodiment 1. FIG. 7 illustrates the read operation performed by the semiconductor storage device according to Embodiment 1.

As illustrated in FIG. 7, a read operation for reading the first variable resistance element R221 and the second variable resistance element R222 in the memory cell M22 will be described as an example according to Embodiment 1.

One of the switches of the read bit line selection circuit 2300 is controlled according to an address signal to connect, to the first current sensing circuit 2701, the bit line connected to the first variable resistance element, and to connect, to the second current sensing circuit 2702, the bit line connected to the second variable resistance element, in a memory cell to be read (S2021). According to Embodiment 1, since the variable resistance elements to be read are the first variable resistance element R221 and the second variable resistance element R222, the bit line connected to the first variable resistance element R221 is connected to the first current sensing circuit 2701, and the bit line connected to the second variable resistance element R222 is connected to the second current sensing circuit 2702 as illustrated in FIG. 7. The other bit lines are set to the floating state.

Next, one of the switches of the read word line selection circuit 2200 is controlled according to an address signal to connect, to a read voltage Vread power source, the word line connected to the memory cell including the variable resistance elements to be read (S2022). Since the variable resistance elements to be read are the first variable resistance element R221 and the second variable resistance element R222, only the word line WL2 is connected to the read voltage Vread power source as illustrated in FIG. 7. The other word lines are set to the floating state.

Furthermore, at this point in time, the switches of the write word line selection circuit 2400 and the write bit line selection circuit 2500 are all turned OFF.

Accordingly, a predetermined potential (second potential) is applied to the word line WL2 connected to the bi-directional diode D22 of the memory cell M22 to be read. Furthermore, another predetermined potential (first potential) different from the second potential applied to the word line WL2 is simultaneously applied to the bit line BL21 connected to the first variable resistance element R221 and the bit line BL22 connected to the second variable resistance element R222. The simultaneous application of the potential to the first variable resistance element R221 and the second variable resistance element R222 suppresses the sneak current. In other words, when the read operation is performed with application of a potential only to one of the bit line BL21 connected to the first variable resistance element R221 and the bit line BL22 connected to the second variable resistance element R222, a path of current in a direction from the first variable resistance element R221 to the second variable resistance element R222 is generated, and the resistance value cannot be accurately read.

Next, the resistance states of the first variable resistance element and the second variable resistance element to be read are determined by simultaneously operating the first current sensing circuit 2701 and the second current sensing circuit 2702 and discriminating between high and low values of currents that flow through the first current sensing circuit 2701 and the second current sensing circuit 2702 (S2023). Since the variable resistance elements to be read are the first variable resistance element R221 and the second variable resistance element R222, the resistance state of each of the first variable resistance element R221 and the second variable resistance element R222 is determined to be one of the high resistance state and the low resistance state, that is, to correspond to one of logics "1" and "0", by discriminating between high and low values of currents that flow through the first current sensing circuit 2701 and the second current sensing circuit 2702, respectively, as illustrated in FIG. 7.

Next, a signal is output to outside of the semiconductor storage device 2000 through a circuit (not illustrated) that outputs a signal representing storage information, based on the output of the first current sensing circuit 2701 and the second current sensing circuit 2702.

Then, all the switches of the read word line selection circuit 2200 and the read bit line selection circuit 2300 are turned OFF, so that the reading operations performed by the first variable resistance element R221 and the second variable resistance element R222 in the memory cell M22 ends (S2024).

Here, the read voltage Vread is a voltage obtained by adding, to a voltage of a bi-directional diode, a voltage to be applied to a variable resistance element in reading and a voltage necessary for a current sensing circuit. Although the voltage necessary for the current sensing circuit is different for each system of the current sensing circuit, a circuit system including a general current mirror circuit in an input stage is used according to Embodiment 1. Thus, an amount of voltage drop with a channel resistance of a transistor (for example, 0.1 V) is the voltage necessary for the current sensing circuit.

Furthermore, the current that flows through a variable resistance element is larger as the voltage to be applied to the variable resistance element in reading is higher. Thus, the operating speed and noise immunity of the current sensing circuit are improved. However, when the voltage is too higher, the resistance value of the variable resistance element itself changes according to the voltage. Thus, the voltage is preferably lower than an HR voltage or an LR voltage. According to Embodiment 1, the voltage Vread is set to 3.5 V. In this case, the voltage to be applied to the variable resistance element in reading ranges between 0.25 and 0.7 V according to the resistance value of the variable resistance element.

Next, the simulation outcome of a current that flows through the current sensing circuit in a read operation performed by the semiconductor storage device according to Embodiment 1 will be described with reference to FIGS. 8A and 8B. FIGS. 8A and 8B are tables for indicating a result of calculation of currents that flow through the first current sensing circuit 2701 and the second current sensing circuit 2702 using the Spice, when the first variable resistance element R221 and the second variable resistance element R222 are in the high resistance (HR) state and the low resistance (LR) state in the semiconductor storage device in FIG. 3 according to Embodiment 1. FIG. 8A indicates the result when the variable resistance elements other than the first variable resistance element R221 and the second variable resistance element R222 are in the HR state, and FIG. 8B indicates the result when the variable resistance elements other than the first variable resistance element R221 and the second variable resistance element R222 are in the LR state. Furthermore, the resistance value of the first variable resistance element R221 and the second variable resistance element R222 that are in the HR state is 100 kΩ, and the resistance value thereof in the LR state is 10 kΩ. The threshold voltage of the bi-directional diode D22 is ±2.3 V. The line resistances of the word line WLi and the bit line BLj1 (BLj2) are 0.4Ω/cell and 0.33Ω/cell, respectively.

As indicated in FIG. 8A, when the variable resistance elements other than the first variable resistance element R221 and the second variable resistance element R222 are in the HR state, it is clarified that the current that flows through the first current sensing circuit 2701 ranges approximately between 32 to 41 µA, even when the first variable resistance element R221 is in the LR state and the second variable resistance element R222 is in one of the LR state and the HR state. Furthermore, when the first variable resistance element R221 is in the HR state and the second variable resistance element R222 is in one of the LR state and the HR state, it is clarified that the current that flows through the first current sensing circuit 2701 ranges approximately between 5 to 8 µA.

Furthermore, when the second variable resistance element R222 is in the LR state and the first variable resistance element R221 is in one of the LR state and the HR state, it is clarified that the current that flows through the second current sensing circuit 2702 ranges approximately between 32 to 41 µA. Furthermore, when the second variable resistance element R222 is in the HR state and the first variable resistance element R221 is in one of the LR state and the HR state, it is clarified that the current that flows through the second current sensing circuit 2702 ranges approximately between 5 to 8 µA.

As indicated in FIG. 8B, when the variable resistance elements other than the first variable resistance element R221 and the second variable resistance element R222 are in the LR state, it is clarified that the current that flows through the first current sensing circuit 2701 ranges approximately between 32 to 39 µA, even when the first variable resistance element R221 is in the LR state and the second variable resistance element R222 is in one of the LR state and the HR state. Furthermore, when the first variable resistance element R221 is in the HR state and the second variable resistance element R222 is in one of the LR state and the HR state, it is clarified that the current that flows through the first current sensing circuit 2701 is approximately 8 µA.

Furthermore, as indicated in FIG. 8B, when the variable resistance elements other than the first variable resistance element R221 and the second variable resistance element R222 are in the LR state, it is clarified that the current that flows through the second current sensing circuit 2702 ranges approximately between 32 to 39 µA, even when the second variable resistance element R222 is in the LR state and the first variable resistance element R221 is in one of the LR state and the HR state. Furthermore, when the second variable resistance element R222 is in the HR state and the first variable resistance element R221 is in one of the LR state and the HR state, it is clarified that the current that flows through the second current sensing circuit 2702 is approximately 8 µA.

As clarified from the results of FIGS. 8A and 8B, the semiconductor storage device 2000 according to Embodiment 1 can determine the resistance states of the first and second variable resistance elements in a memory cell to be read, based on the current that flows through the first current sensing circuit 2701 and the second current sensing circuit 2702, regardless of the resistance value of another variable resistance element to be read and of the resistance value of the variable resistance element in a memory cell other than the memory cell to be read.

The circuit that determines one of the logics "1" and "0" in the first current sensing circuit 2701 and the second current sensing circuit 2702 may be designed by setting the threshold current to 20 µA according to Embodiment 1.

Furthermore, the currents that flow through the first current sensing circuit 2701 and the second current sensing circuit 2702 change due to the influence of the resistance states of the variable resistance elements around the variable resistance element to be read, because the leakage current occurs through the other variable resistance elements (R121, R122, R321, R322) that are connected between the bit lines BL21 and BL22 to which the first variable resistance element R221 and the second variable resistance element R222 are connected. Furthermore, although the leakage current occurs through a word line, the bi-directional diode D22 sufficiently suppresses the value of the current.

Furthermore, a selection circuit for selecting a bit line and a word line has only to be a circuit including at least a part of functions of the selection circuit, and is not limited to the selection circuit according to Embodiment 1. The same is true for a circuit for writing or reading a bit line and a word line.

Embodiment 2

Next, a memory device and a method for manufacturing the memory device according to Embodiment 2 will be described with reference to the drawings. A semiconductor storage device and a write operation and a read operation performed by the semiconductor storage device according to Embodiment 2 are the same as those according to Embodiment 1, and thus, the description thereof is omitted.

[Structure of Memory Device]

Figure 9A:
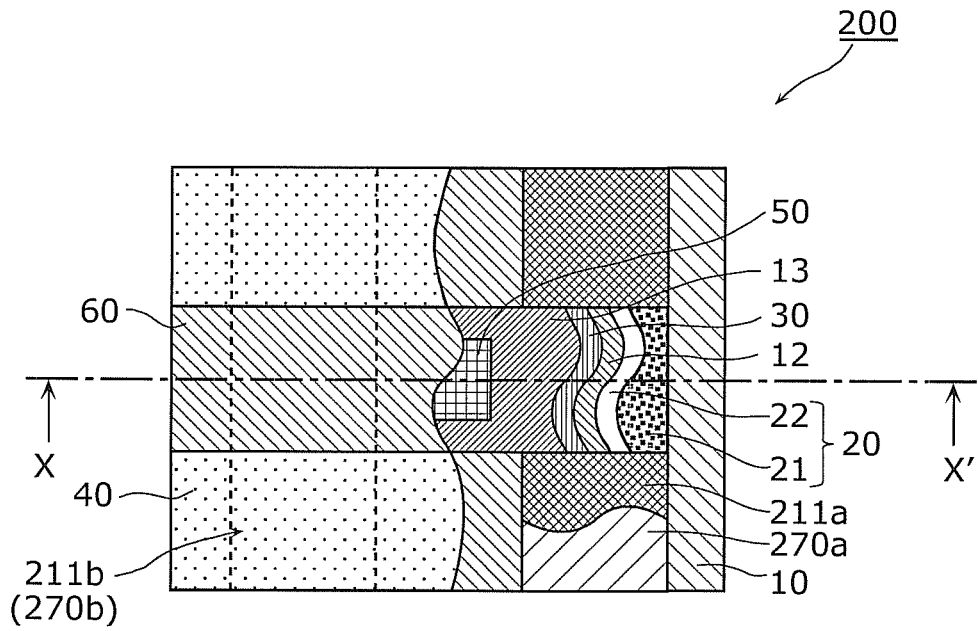
FIG. 9A is a partially cutout plan view illustrating a structure of a memory device according to Embodiment 2.
Figure 9B:
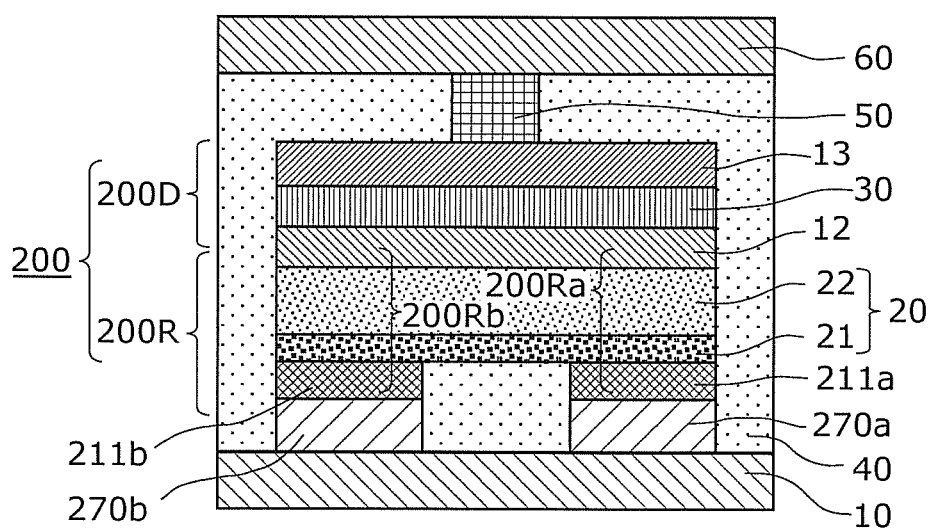
FIG. 9B is a section view illustrating the structure of the memory device cut along an X-X' line in FIG. 9A according to Embodiment 2.

A memory device 200 according to Embodiment 2 will be described with reference to FIGS. 9A and 9B. FIG. 9A is a partially cutout plan view illustrating a structure of a memory device according to Embodiment 2. Furthermore, FIG. 9B is a section view illustrating the structure of the memory device cut along an X-X' line in FIG. 9A. Embodiment 2 will be described using two variable resistance elements formed in a single memory device as an example, as according to Embodiment 1.

The memory device 200 in FIGS. 9A and 9B according to Embodiment 2 has the same basic structure as that of the memory device 100 in FIGS. 1A and 1B according to Embodiment 1. Thus, constituent elements in FIGS. 9A and 9B identical to those in FIGS. 1A and 1B are assigned the same reference signs, and the descriptions are omitted or simplified.

The difference between the memory device 200 in FIGS. 9A and 9B according to Embodiment 2 and the memory device 100 in FIGS. 1A and 1B according to Embodiment 1 is that first lines 270a and 270b are formed along first electrodes 211a and 211b, respectively in the memory device 200.

As illustrated in FIGS. 9A and 9B, the first electrodes 211a and 211b are formed in contact with the high-concentration variable resistance layer 21, as the first electrodes 11a and 11b according to Embodiment 1. Furthermore, the same material as that for the first electrodes 11a and 11b according to Embodiment 1 can be used for the first electrodes 211a and 211b.

The two first lines 270a and 270b comprise a metal with a lower resistance, such as Cu, and are formed on a substrate 10. Furthermore, the first electrode 211a and the first electrode 211b are formed on the first line 270a and the first line 270b, and the first line 270a and the first line 270b are in contact with the first electrode 211a and the first electrode 211b, respectively.

The memory device 200 solely includes a variable resistance element 200R including first and second variable resistance elements 200Ra and 200Rb, a total number of which is equal to that of the first electrodes 211a and 211b with the stacked structure including the first electrodes 211a and 211b, the variable resistance layer 20, and the second electrode 12 as according to Embodiment 1. According to Embodiment 2, the variable resistance element 200R includes two of the first and second variable resistance elements 200Ra and 200Rb within one memory cell, and further includes two of the first electrodes 211a and 211b, the one variable resistance layer 20, and the one second electrode 12. In other words, the first variable resistance element 200Ra includes the first electrode 211a, the high-concentration variable resistance layer 21, the low-concentration variable resistance layer 22, and the second electrode 12. Furthermore, the second variable resistance element 200Rb includes the first electrode 211b, the high-concentration variable resistance layer 21, the low-concentration variable resistance layer 22, and the second electrode 12. Furthermore, the second electrode 12, the non-conductive layer 30, and the third electrode 13 comprise a diode 200D with the stacked structure.

The memory device 200 according to Embodiment 2 having such a structure operates in the same manner and produces the same advantages as the memory device 100 according to Embodiment 1.

Furthermore, the memory device 200 uses the first lines 270a and 270b comprising a material having a resistance lower than that of the first electrodes 211a and 211b. Accordingly, when the first lines 270a and 270b are used as bit lines in a circuit of a semiconductor storage device, the line resistance of the bit lines can be reduced, and a favorable circuit operation can be performed. Furthermore, since the first electrodes 211a and 211b can be thinner using the first lines 270a and 270b, an amount of a material used for the first electrodes 211a and 211b can be reduced, and the first electrodes 211a and 211b can be easily processed. In particular, when the material of the first electrodes 211a and 211b is a noble metal, such as Pt, Pd, and Ir, the amount of the noble metal used for the first electrodes 211a and 211b can be reduced, thus reducing the cost.

[Method for Manufacturing Memory Device]

Figure 10A:
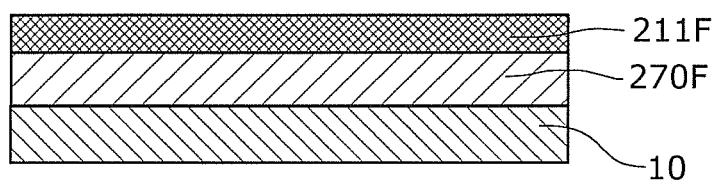
FIG. 10A is a section view illustrating a process of manufacturing the memory device (process of forming a first line film and a first electrode film) according to Embodiment 2.
Figure 10B:
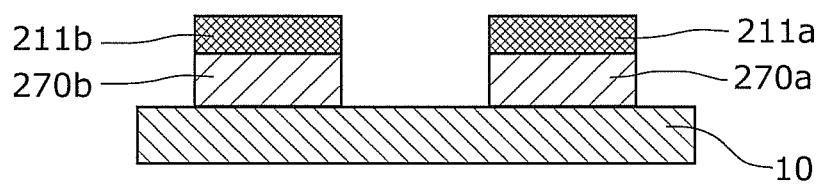
FIG. 10B is a section view illustrating a process of manufacturing the memory device (process of forming first lines and first electrodes) according to Embodiment 2.
Figure 10C:
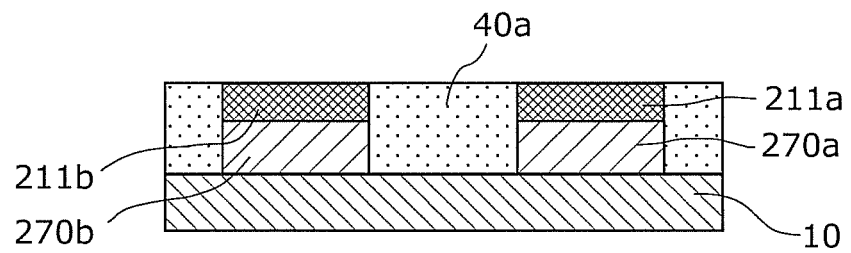
FIG. 10C is a section view illustrating a process of manufacturing the memory device (process of forming a first interlayer insulating film) according to Embodiment 2.

Next, a method for manufacturing the memory device 200 according to Embodiment 2 will be described with reference to FIGS. 10A to 10C. FIGS. 10A to 10C are section views illustrating processes of manufacturing a memory device according to Embodiment 2. Since the manufacturing processes after forming the first electrodes 211a and 211b are the same as those after forming the first electrodes 11a and 11b according to Embodiment 1, in the method for manufacturing the memory device 200 according to Embodiment 2, the description is omitted.

First, as illustrated in FIG. 10A, a first line film 270F and a first electrode film 211F are deposited in this order above the substrate 10 using a sputtering method, a CVC method, and so on.

Here, a material such as Al, an Al—Cu alloy, and a Ti—Al—N alloy can be used for the first line film 270F. According to Embodiment 2, an Al film deposited by the sputtering method is used as the first line film 270F. Furthermore, the first line film 270F has a thickness between 200 nm and 400 nm inclusive. Furthermore, the same material as that for the first electrodes 11a and 11b according to Embodiment 1 can be used for the first electrode film 211F. According to Embodiment 2, iridium (Ir) is used as the material for the first electrode film 211F. Furthermore, the first electrode film 211F has a thickness of 50 nm.

Next, as illustrated in FIG. 10B, the first line film 270F and the first electrode film 211F are patterned into the first lines 270a and 270b and the first electrodes 211a and 211b through masking using an exposure process and etching.

Here, the first lines 270a and 270b have a width of 0.5 μm, and a distance between the first lines 270a and 270b that are adjacent to each other is 0.5 μm. Furthermore, the first electrodes 211a and 211b have a width of 0.5 μm, and a distance between the first electrodes 211a and 211b that are adjacent to each other is 0.5 μm.

Next, as illustrated in FIG. 10C, an interlayer insulating film 40a with a thickness of 600 nm and comprising TEOS-SiO is deposited using the CVD method. Then, a wafer surface including the interlayer insulating film 40a and the first electrodes 211a and 211b becomes almost planarized by polishing the interlayer insulating film 40a until the surface of each of the first electrodes 211a and 211b is exposed, for example, with the CMP method.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as materials of the interlayer insulating film 40a. In addition, a stacked structure of these materials may be used as the interlayer insulating film 40a.

Since the subsequent manufacturing processes are the same as those after FIG. 2C in the manufacturing processes according to Embodiment 1, the description thereof is omitted.

Accordingly, the memory device 200 according to Embodiment 2 can be manufactured.

The memory device 200 can be used as a memory cell of a semiconductor storage device as illustrated in FIG. 3, as according to Embodiment 1. Furthermore, a write operation and a read operation performed by the semiconductor storage device are the same as those according to Embodiment 1.

Embodiment 3

Next, a memory device and a method for manufacturing the memory device according to Embodiment 3 will be described with reference to the drawings. A semiconductor storage device and a write operation and a read operation performed by the semiconductor storage device according to Embodiment 3 are the same as those according to Embodiment 1, and thus, the description thereof is omitted.

[Structure of Memory Device]

Figure 11A:
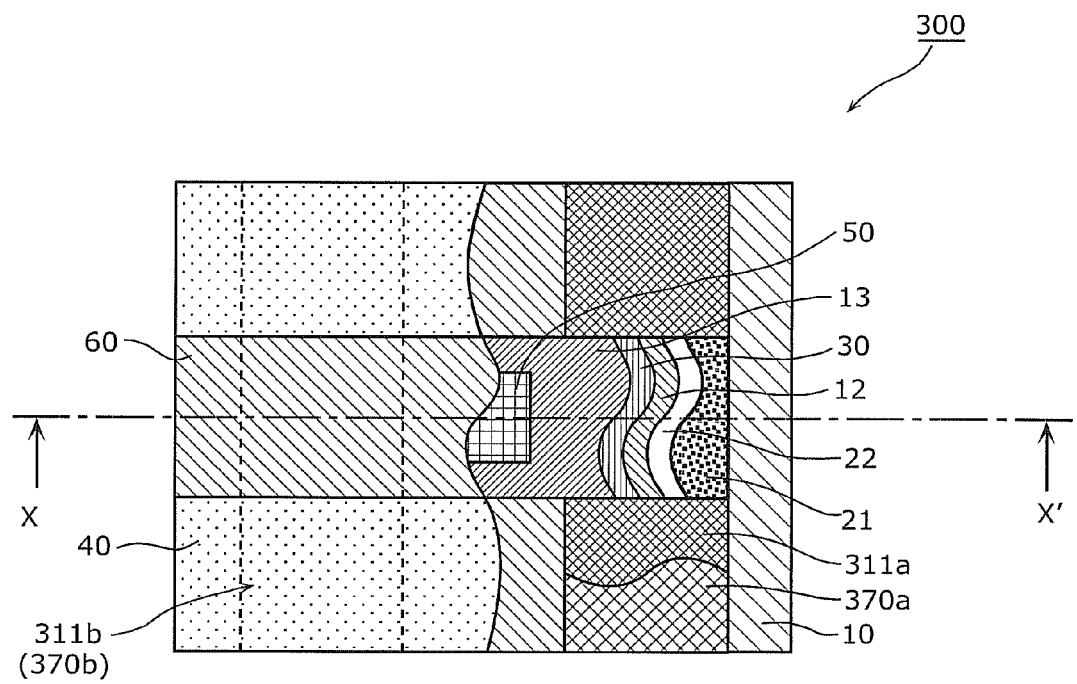
FIG. 11A is a partially cutout plan view illustrating a structure of a memory device according to Embodiment 3.
Figure 11B:
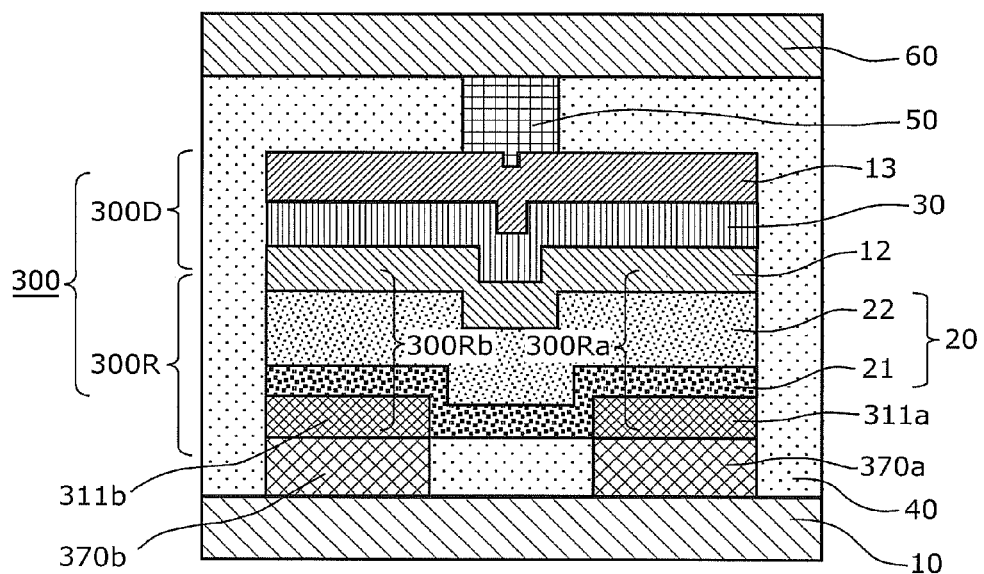
FIG. 11B is a section view illustrating the structure of the memory device cut along an X-X' line in FIG. 11A according to Embodiment 3.

First, a memory device 300 according to Embodiment 3 will be described with reference to FIGS. 11A and 11B. FIG. 11A is a partially cutout plan view illustrating a structure of the memory device according to Embodiment 3. Furthermore, FIG. 11B is a section view illustrating the structure of the memory device cut along an X-X' line in FIG. 11A. Embodiment 3 will be described using two variable resistance elements formed in a single memory device as an example, as according to Embodiments 1 and 2.

The memory device 300 in FIGS. 11A and 11B according to Embodiment 3 has the same basic structure as that of the memory device 200 in FIGS. 9A and 9B according to Embodiment 2. Thus, the constituent elements in FIGS. 11A and 11B identical to those in FIGS. 9A and 9B are assigned the same reference signs, and the descriptions are omitted or simplified.

The differences between the memory device 300 in FIGS. 11A and 11B according to Embodiment 3 and the memory device 200 according to Embodiment 2 are that lines formed along first electrodes 311a and 311b in the memory device 300 are first lines 370a and 370b that are the Cu lines and that the first electrodes 311a and 311b are formed by a plating method.

As illustrated in FIGS. 11A and 11B, the two first lines 370a and 370b are lines comprising copper (Cu), and are formed on the substrate 10 in the memory device 300 according to Embodiment 3. Furthermore, the first electrode 311a and the first electrode 311b are formed on the first line 370a and the first line 370b, and the first line 370a and the first line 370b are in contact with the first electrode 311a and the first electrode 311b, respectively.

The first electrodes 311a and 311b are formed in contact with the high-concentration variable resistance layer 21. The same material as that for the first electrodes 211a and 211b according to Embodiment 2 can be used as the material for the first electrodes 311a and 311b according to Embodiment 3. The first electrodes 311a and 311b are plated electrodes formed on the surface of the first lines 370a and 370b using an electroless plating method.

The memory device 300 according to Embodiment 3 includes a variable resistance element 300R including first and second variable resistance elements 300Ra and 300Rb, a total number of which is equal to that of the first electrodes 311a and 311b with the stacked structure including the first electrodes 311a and 311b, the variable resistance layer 20, and the second electrode 12 as according to Embodiment 2. According to Embodiment 3, the variable resistance element 300R includes two of the first and second variable resistance elements 300Ra and 300Rb within one memory cell, and further includes two of the first electrodes 311a and 311b, the one variable resistance layer 20, and the one second electrode 12. In other words, the first variable resistance element 300Ra includes the first electrode 311a, the high-concentration variable resistance layer 21, the low-concentration variable resistance layer 22, and the second electrode 12. Furthermore, the second variable resistance element 300Rb includes the first electrode 311b, the high-concentration variable resistance layer 21, the low-concentration variable resistance layer 22, and the second electrode 12. Furthermore, the second electrode 12, the non-conductive layer 30, and the third electrode 13 comprise a diode 300D with the stacked structure.

The memory device 300 according to Embodiment 3 having such a structure operates in the same manner and produces the same advantages as the memory devices according to Embodiments 1 and 2.

Furthermore, the first electrodes 311a and 311b are formed by a plating method in the memory device 300. Accordingly, the pattern processing through an etching process does not have to be performed on a noble metal, such as Pt and Pd, as a material for the first electrodes 311a and 311b. Thus, the following advantages can be produced.

Specifically, the difficulty lies in (i) vertically processing the cross-sectional shape of a noble metal to be used as a material for the first electrodes 311a and 311b, in the general dry etching process using, for example, reactive ion etching, and (ii) completely removing materials that are supposed to be removed in the etching but are redeposited on the noble metal because of a higher vapor pressure of a reaction product generated from etching gas and the noble metal. Thus, the short circuit easily occurs due to the redeposited materials with the fine pattern, and the pattern formation in the thin line shape also easily fails, which are problematic in the miniaturization.

In contrast, since the pattern processing through etching a noble metal is not necessary according to Embodiment 3, such problems do not occur. Thus, the advantage that the first electrodes 311a and 311b can be easily miniaturized can be produced.

[Method for Manufacturing Memory Device]

Figure 12A:
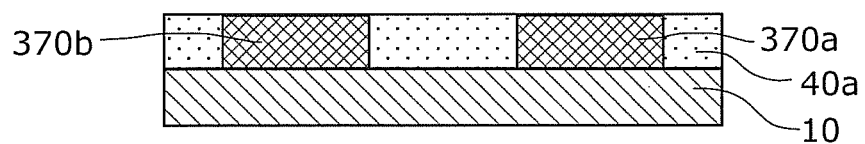
FIG. 12A is a section view illustrating a process of manufacturing the memory device (process of forming first lines and an interlayer insulating film) according to Embodiment 3.
Figure 12B:
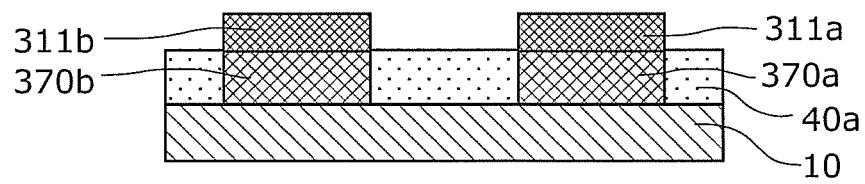
FIG. 12B is a section view illustrating a process of manufacturing the memory device (plating process) according to Embodiment 3.

Next, a method for manufacturing the memory device 300 according to Embodiment 3 will be described with reference to FIGS. 12A and 12B. FIGS. 12A and 12B are section views illustrating processes of manufacturing a memory device according to Embodiment 3. Since the manufacturing processes after forming the first electrodes 311a and 311b in the method for manufacturing the memory device 300 according to Embodiment 3 are the same as those after forming the first electrodes 11a and 11b according to Embodiment 1, the description is omitted.

First, as illustrated in FIG. 12A, the interlayer insulating film 40a and the first lines 370a and 370b that are copper lines are formed on the substrate 10 to expose the surface of the first lines 370a and 370b. The interlayer insulating film 40a and the first lines 370a and 370b can be formed using a general Cu damascene process. Here, the first lines 370a and 370b include Cu portions having a thickness of 200 nm, and have a line width of approximately 0.5 µm. Furthermore, a distance between the first lines 370a and 370b that are adjacent to each other is 0.5 µm.

Next, as illustrated in FIG. 12B, the first electrodes 311a and 311b are formed by, for example, an electroless selective growth electroless plating method only on the exposed surface of the first lines 370a and 370b.

According to Embodiment 3, Pt may be used as a material of the first electrodes 311a and 311b, and a hydrazine-ammonia Pt plating bath or a Pt plating bath including a boron-based compound or hypophosphoric acid as a reducer may be used as an electroless Pt plating bath. Furthermore, the first electrodes 311a and 311b comprising Pt desirably have a thickness approximately between 5 nm and 50 nm, and have a thickness of 25 nm according to Embodiment 3.

Furthermore, after an electrode seed layer comprising one of nickel, a nickel-phosphorus alloy, and a nickel-boron alloy is formed on the exposed surface of the first lines 370a and 370b, the electroless Pt plating bath is desirably performed. Accordingly, the Pt selective growth can be more efficiently performed on the Cu lines. In this case, the electrode seed layer may have a stacked structure comprising one of (i) a pair of palladium and nickel, (ii) a pair of palladium and a nickel-phosphorus alloy, and (iii) a pair of palladium and a nickel-boron alloy.

Since the subsequent manufacturing processes are the same as those after FIG. 2C in the manufacturing processes according to Embodiment 1, the description thereof is omitted.

Accordingly, the memory device 300 according to Embodiment 3 can be manufactured.

The memory device 300 can be used as a memory cell of a semiconductor storage device as illustrated in FIG. 3, as according to Embodiment 1. Furthermore, a write operation and a read operation performed by the semiconductor storage device are the same as those according to Embodiment 1.

Embodiment 4

Next, a memory device and a method for manufacturing the memory device according to Embodiment 4 will be described with reference to the drawings. A semiconductor storage device and a write operation and a read operation performed by the semiconductor storage device according to Embodiment 4 are the same as those according to Embodiment 1, and thus, the description thereof is omitted.

[Structure of Memory Device]

Figure 13A:
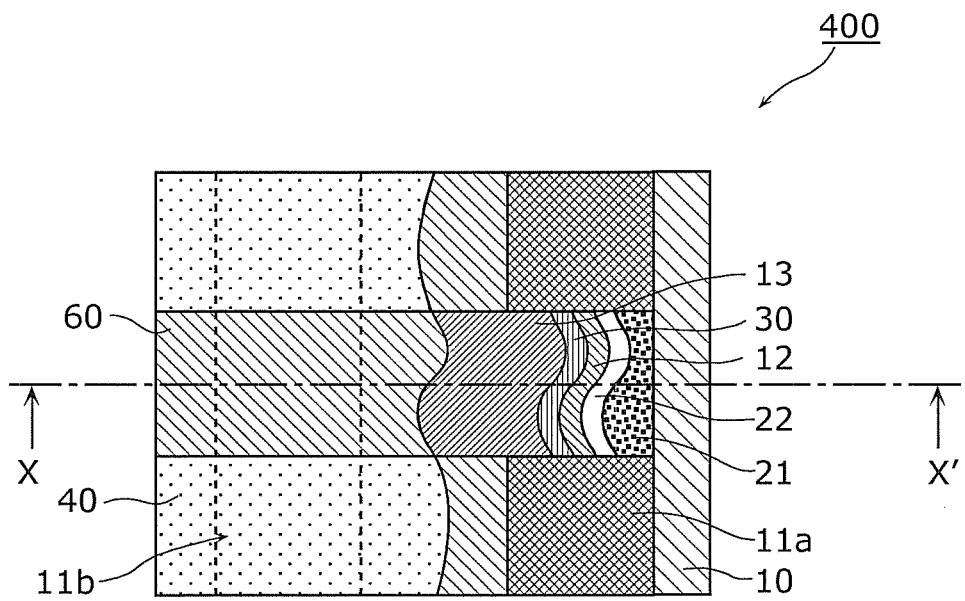
FIG. 13A is a partially cutout plan view illustrating a structure of a memory device according to Embodiment 4.

First, a memory device 400 according to Embodiment 4 will be described with reference to FIGS. 13A and 13B. FIG. 13A is a partially cutout plan view illustrating a structure of the memory device according to Embodiment 4. Furthermore, FIG. 13B is a section view illustrating the structure of the memory device cut along an X-X' line in FIG. 13A.

Embodiment 4 will be described using two variable resistance elements formed in a single memory device as an example, as according to Embodiments 1 to 3.

Figure 13B:
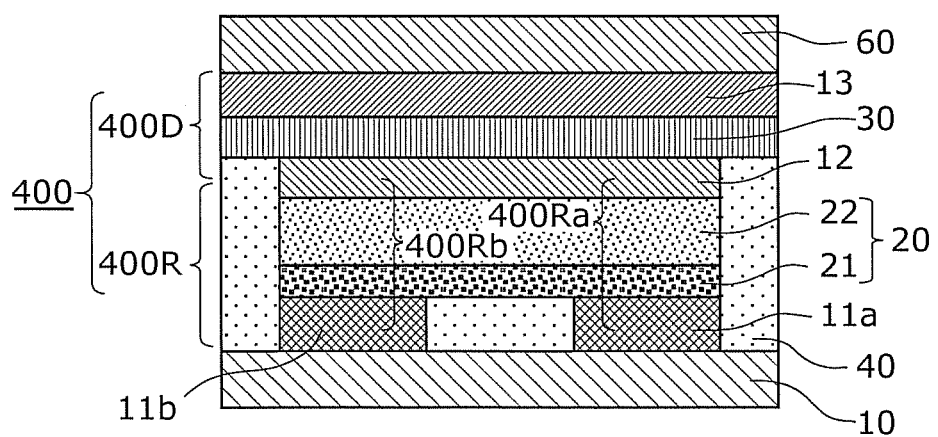
FIG. 13B is a section view illustrating the structure of the memory device cut along an X-X' line in FIG. 13A according to Embodiment 4.

The memory device 400 in FIGS. 13A and 13B according to Embodiment 4 has the same basic structure as that of the memory device 100 in FIGS. 1A and 1B according to Embodiment 1. Thus, the constituent elements in FIGS. 13A and 13B identical to those in FIGS. 1A and 1B are assigned the same reference signs, and the descriptions are omitted or simplified.

The differences between the memory device 400 in FIGS. 13A and 13B according to Embodiment 4 and the memory device 100 according to Embodiment 1 are that the memory device 400 does not include the plug 50 included in the memory device 100 according to Embodiment 1 and that a non-conductive layer 30 and a third electrode 13 are fabricated in the same shape as that of a second line 60.

The memory device 400 includes a variable resistance element 400R including first and second variable resistance elements 400Ra and 400Rb, a total number of which is equal to a total number of the first electrodes 11a and 11b with the stacked structure including the first electrodes 11a and 11b, the variable resistance layer 20, and the second electrode 12 as according to Embodiment 1. According to Embodiment 4, the variable resistance element 400R includes two of the first and second variable resistance elements 400Ra and 400Rb within one memory cell, and further includes two of the first electrodes 11a and 11b, the one variable resistance layer 20, and the one second electrode 12. In other words, the first variable resistance element 400Ra includes the first electrode 11a, the high-concentration variable resistance layer 21, the low-concentration variable resistance layer 22, and the second electrode 12. Furthermore, the second variable resistance element 400Rb includes the first electrode 11b, the high-concentration variable resistance layer 21, the low-concentration variable resistance layer 22, and the second electrode 12. Furthermore, the second electrode 12, the non-conductive layer 30, and the third electrode 13 comprise a common diode 400D with the stacked structure.

The memory device 400 according to Embodiment 4 having such a structure operates in the same manner and produces the same advantages as the memory device 100 according to Embodiment 1.

Furthermore, the memory device 400 has no plug, and the second line 60 is directly formed on the third electrode 13. Accordingly, since the process of forming the plug can be eliminated, the number of photolithography processes and the manufacturing cost can be reduced.

Furthermore, since the non-conductive layer 30 can be formed on the interlayer insulating film 40 in the memory device 400, the third electrode 13 and the non-conductive layer 30 are expanded outside of the second electrode 12. Since the electric lines of force that run in the non-conductive layer 30 are spread outside of the second electrode 12, the allowable current amount of the current that can flows through the diode 400D can be increased.

[Method for Manufacturing Memory Device]

Next, a method for manufacturing the memory device 400 according to Embodiment 4 will be described with reference to FIGS. 14A to 14F. FIGS. 14A to 14F are section views illustrating processes of manufacturing a memory device according to Embodiment 4.

Figure 14A:
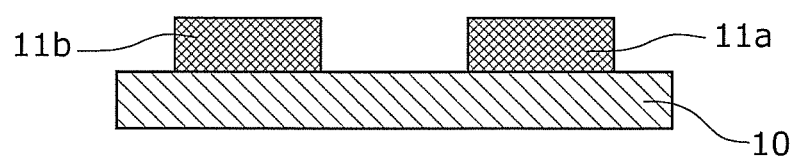
FIG. 14A is a section view illustrating a process of manufacturing the memory device (process of forming first electrodes) according to Embodiment 4.

First, as illustrated in FIG. 14A, the first electrodes 11a and 11b are formed on the substrate 10 as according to Embodiment 1.

Figure 14B:
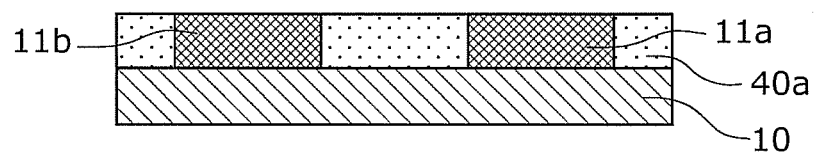
FIG. 14B is a section view illustrating a process of manufacturing the memory device (process of forming a first insulating film) according to Embodiment 4.

Next, as illustrated in FIG. 14B, an interlayer insulating film 40a is deposited to cover the first electrodes 11a and 11b.

Then, a wafer surface including the interlayer insulating film 40a and the first electrodes 11a and 11b becomes planarized, for example, by polishing the surface of the interlayer insulating film 40a with the CMP method until the surface of each of the first electrodes 11a and 11b is exposed as according to Embodiment 1.

Figure 14C:
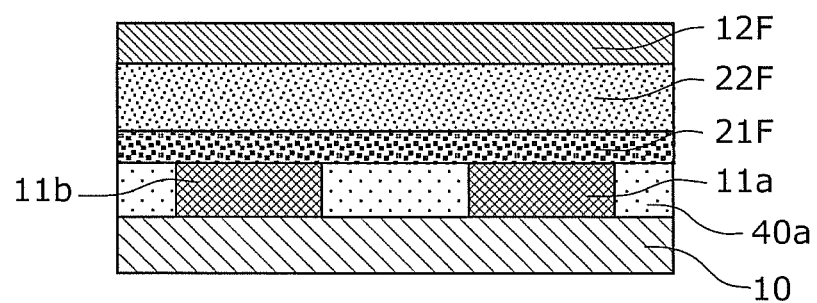
FIG. 14C is a section view illustrating a process of manufacturing the memory device (process of forming stacked films) according to Embodiment 4.

Next, as illustrated in FIG. 14C, a high-concentration variable resistance film 21F to be the high-concentration variable resistance layer 21, a low-concentration variable resistance film 22F to be the low-concentration variable resistance layer 22, and a second electrode film 12F to be the second electrode 12 are successively deposited to cover the entire wafer surface. Accordingly, the stacked films including the high-concentration variable resistance film 21F, the low-concentration variable resistance film 22F, and the second electrode film 12F can be structured on the first electrodes 11a and 11b. Here, the materials of these films are the same as those according to Embodiment 1, and respective films can be formed in the same manner as according to Embodiment 1. According to Embodiment 4, a $Ta_2O_5$ film with a thickness of 6 nm as the high-concentration variable resistance film 21F, a $TaO_{0.66}$ film with a thickness of 50 nm as the low-concentration variable resistance film 22F, and a TaN film with a thickness of 50 nm as the second electrode film 12F are deposited using the sputtering method.

Figure 14D:
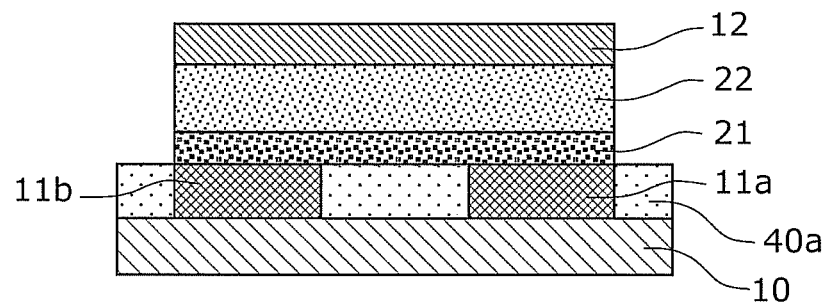
FIG. 14D is a section view illustrating a process of manufacturing the memory device (process of forming stacked layers) according to Embodiment 4.

Next, the stacked films including the high-concentration variable resistance film 21F, the low-concentration variable resistance film 22F, and the second electrode film 12F are masked using an exposure process and etched to form a stacked structure including the high-concentration variable resistance layer 21, the low-concentration variable resistance layer 22, and the second electrode 12, as illustrated in FIG. 14D.

Figure 14E:
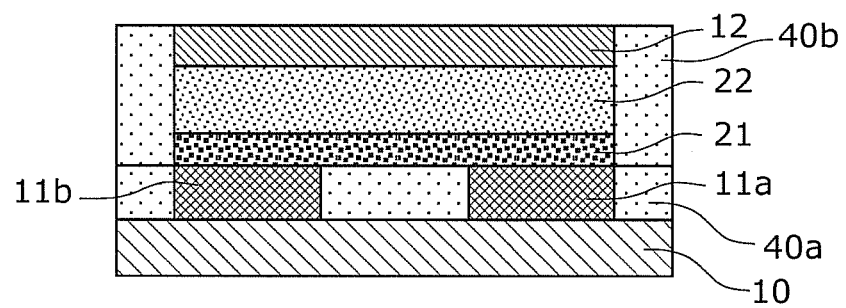
FIG. 14E is a section view illustrating a process of manufacturing the memory device (process of forming a second interlayer insulating film) according to Embodiment 4.

Next, as illustrated in FIG. 14E, the interlayer insulating film 40b comprising TEOS-SiO and having a thickness of 200 nm is formed on the interlayer insulating film 40a using, for example, the CVD method to cover the stacked structure including the high-concentration variable resistance layer 21, the low-concentration variable resistance layer 22, and the second electrode 12. Then, a wafer surface including the interlayer insulating film 40b and the second electrode 12 becomes planarized, for example, by polishing the surface of the interlayer insulating film 40b with the CMP method until the surface of the second electrode 12 is exposed.

Aside from TEOS-SiO, silicon nitride (SiN), silicon carbonitride (SiCN) which is a low dielectric constant material, silicon oxycarbide (SiOC), fluorinated silicon oxide (SiOF)/ and so on may be used as a material of the interlayer insulating film 40b. In addition, a stacked structure of these materials may be used as the interlayer insulating film 40b.

Figure 14F:
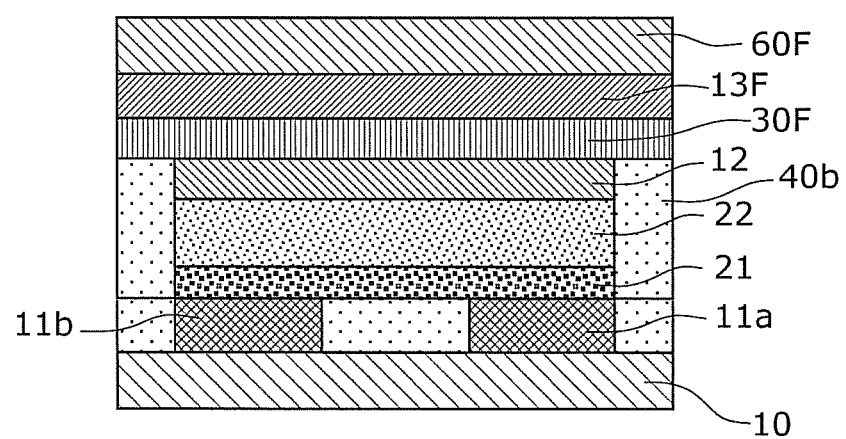
FIG. 14F is a section view illustrating a process of manufacturing the memory device (process of forming stacked films) according to Embodiment 4.

Next, as illustrated in FIG. 14F, a non-conductive film 30F to be the non-conductive layer 30, a third electrode film 13F to be the third electrode 13, and a second line film 60F to be the second line 60 are deposited on the wafer surface in this order to form stacked films. Here, the materials of the non-conductive film 30F, the third electrode film 13F, and the second line film 60F are the same as those according to Embodiment 1, and these films can be formed in the same manner as according to Embodiment 1. According to Embodiment 4, a $SiN_x$ (x=0.6) film having a thickness of 15 nm as the non-conductive film 30F, a tantalum nitride (TaN) film having a thickness of 30 nm as the third electrode film 13F, and an Al film having a thickness of 200 nm as the second line film 60F are deposited using the sputtering method.

Next, masking using an exposure process and bulk etching are performed on the stacked films including the non-conductive film 30F, the third electrode film 13F, and the second line film 60F to form the non-conductive layer 30, the third electrode 13, and the second line 60. The second line film 60F is patterned into the second line 60 having a width of 0.5 μm according to Embodiment 4.

Accordingly, the memory device 400 according to Embodiment 4 as illustrated in FIGS. 13A and 13B can be manufactured.

The memory device 400 can be used as a memory cell of a semiconductor storage device as illustrated in FIG. 3, as according to Embodiment 1. Furthermore, a write operation and a read operation performed by the semiconductor storage device are the same as those according to Embodiment 1.

Embodiment 5

Next, a memory device and a method for manufacturing the memory device according to Embodiment 5 will be described with reference to the drawings. A semiconductor storage device and a write operation and a read operation performed by the semiconductor storage device according to Embodiment 5 are the same as those according to Embodiment 1, and thus, the description thereof is omitted.

[Structure of Memory Device]

Figure 15A:
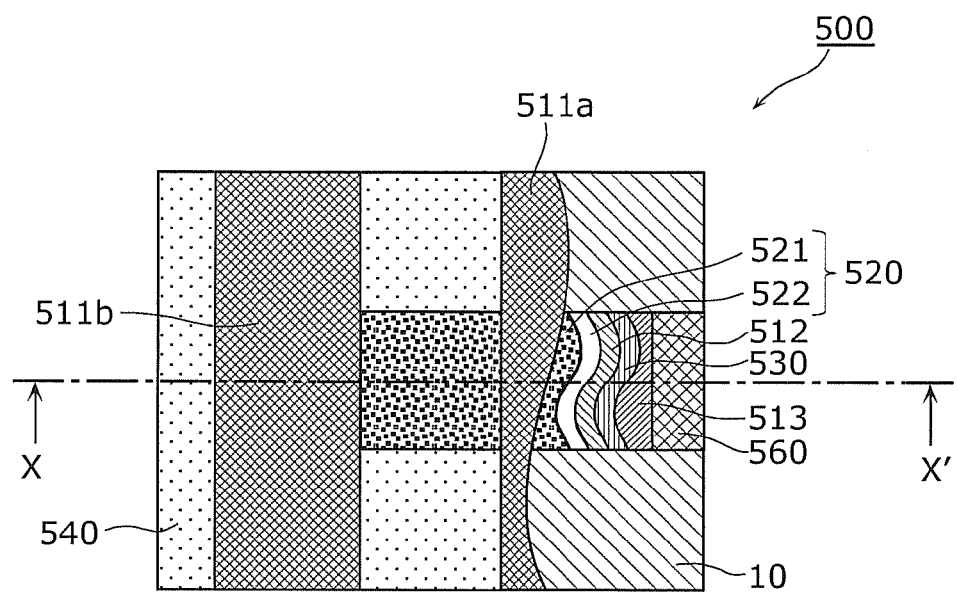
FIG. 15A is a partially cutout plan view illustrating a structure of a memory device according to Embodiment 5.
Figure 15B:
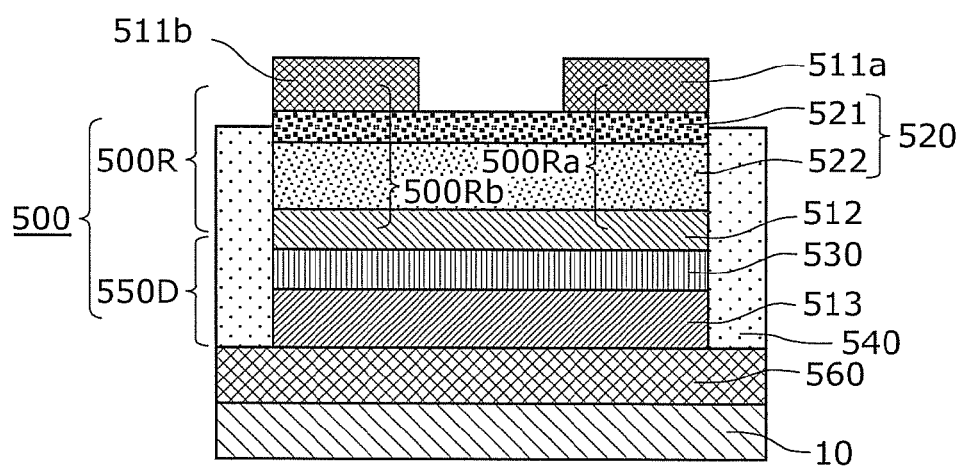
FIG. 15B is a section view illustrating the structure of the memory device cut along an X-X' line in FIG. 15A according to Embodiment 5.

First, a memory device 500 according to Embodiment 5 will be described with reference to FIGS. 15A and 15B. FIG. 15A is a partially cutout plan view illustrating a structure of the memory device according to Embodiment 5. Furthermore, FIG. 15B is a section view illustrating the structure of the memory device cut along an X-X' line in FIG. 15A. Embodiment 5 will be described using two variable resistance elements formed in a single memory device as an example, as according to Embodiments 1 to 4.

As illustrated in FIGS. 15A and 15B, the memory device 500 according to Embodiment 5 includes a second line 560 formed on the substrate 10, a third electrode 513 formed in contact with the upper surface of the second line 560, a non-conductive layer 530 formed in contact with the upper surface of the third electrode 513, a second electrode 512 formed in contact with the upper surface of the non-conductive layer 530, a low-concentration variable resistance layer 522 formed in contact with the upper surface of the second electrode 512, a high-concentration variable resistance layer 521 formed in contact with the upper surface of the low-concentration variable resistance layer 522, and two first electrodes 511a and 511b formed in contact with the upper surface of the high-concentration variable resistance layer 521.

Furthermore, the memory device 500 is electrically connected to the second line 560 through the bottom surface of the third electrode 513, and is surrounded by an interlayer insulating film 540.

The same materials as those for the first electrodes 11a and 11b, the high-concentration variable resistance layer 21, the low-concentration variable resistance layer 22, the second electrode 12, the non-conductive layer 30, the third electrode 13, the second line 60, and the interlayer insulating film 40 according to Embodiment 1 can be used for the first electrodes 511a (511b), the high-concentration variable resistance layer 521, the low-concentration variable resistance layer 522, the second electrode 512, the non-conductive layer 530, the third electrode 513, the second line 560, and the interlayer insulating film 540 according to Embodiment 4, respectively.

Furthermore, the high-concentration variable resistance layer 521 and the low-concentration variable resistance layer 522 comprise a variable resistance layer 520, and the oxygen concentration of the high-concentration variable resistance layer 521 is higher than that of the low-concentration variable resistance layer 522.

The memory device 500 according to Embodiment 5 includes a variable resistance element 500R including first and second variable resistance elements 500Ra and 500Rb, a total number of which is equal to a total number of the first electrodes 511a and 511b with the stacked structure including the first electrodes 511a and 511b, the variable resistance layer 520, and the second electrode 512. According to Embodiment 5, the variable resistance elements 500R includes two of the first and second variable resistance elements 500Ra and 500Rb within one memory cell, and further includes two of the first electrodes 511a and 511b, the one variable resistance layer 520, and the one second electrode 512. In other words, the first variable resistance element 500Ra includes the first electrode 511a, the high-concentration variable resistance layer 521, the low-concentration variable resistance layer 522, and the second electrode 512. Furthermore, the second variable resistance element 500Rb includes the first electrode 511b, the high-concentration variable resistance layer 521, the low-concentration variable resistance layer 522, and the second electrode 512. As such, the high-concentration variable resistance layer 521, the low-concentration variable resistance layer 522, and the second electrode 512 are shared between the first variable resistance element 500Ra and the second variable resistance element 500Rb, but the resistance elements include the respective first electrodes 11a and 11b. The element area of the variable resistance element 500R is defined as a total of areas (contact areas) in which the first electrodes 511a and 511b and the high-concentration variable resistance layer 21 are in contact with each other.

Furthermore, the second electrode 512, the non-conductive layer 530, and the third electrode 513 comprise a diode 550D with the stacked structure in the memory device 500. The element area of the diode 550D is defined as a smaller one of areas (contact areas) in which (i) the second electrode 512 and the non-conductive layer 530 are in contact with each other and (ii) the non-conductive layer 530 and the third electrode 513 are in contact with each other.

As such, the two variable resistance elements 500Ra and 500Rb and the one diode 550D shared between the two variable resistance elements are formed solely in the memory device 500 according to Embodiment 5 as according to Embodiment 1. The memory device 500 operates in the same manner as the memory device according to Embodiment 1. Accordingly, the element area of the diode 550D can be larger than the element area of each of the variable resistance elements 500Ra and 500Rb. Thus, the capacity of a memory device can be increased without miniaturizing the variable resistance layer also according to Embodiment 5. As a result, it is possible to substantially increase an allowable current amount of the diode, and prevent the diode from being destroyed by the current during an initial break operation and a resistance change operation.

Furthermore, since processing dimensions of the variable resistance layer and the diode can be larger than the minimum design dimension of the memory device, the memory device can substantially be miniaturized without using special micromachining process technology.

Furthermore, the structure of the memory device 500 is obtained by turning the structure of the memory device 100 according to Embodiment 1 upside down. With the structure, the process of forming a plug (plug 50 in FIG. 1B) that connects the third electrode 513 to the second line 560 can be eliminated. Thus, the number of photolithography processes and the manufacturing cost can be reduced.

Although the stacked structure from the high-concentration variable resistance layer 521 to the third electrode 513 in the plan view is represented by a rectangle as illustrated in FIGS. 15A and 15B according to Embodiment 5, the shape is not limited to the rectangle. For example, the shape of the stacked structure in the plan view may be represented by an oval or a polygon.

Furthermore, although the stacked structure from the high-concentration variable resistance layer 521 to the third electrode 513 is formed vertical to the substrate 10 as illustrated in FIG. 15B, it does not always have to be so. For example, the present invention includes a tilt (tapered form) on a side surface of the stacked structure manufactured in an actual manufacturing process (tapered form) and protrusion and depression on a side surface of the stacked structure.

Furthermore, although the second electrode 512 is an electrode of a single layer shared between the variable resistance element 500R and the diode 550D as illustrated in FIG. 15B according to Embodiment 5, the second electrode 512 does not have to be so. For example, when the variable resistance element 500R and the diode 550D separately comprise appropriate electrode materials, the second electrode 512 may have a stacked structure including two or more layers of different electrode materials.

[Method for Manufacturing Memory Device]

Next, a method for manufacturing the memory device 500 according to Embodiment 5 will be described with reference to FIGS. 16A to 16F. FIGS. 16A to 16F are section views illustrating processes of manufacturing a memory device according to Embodiment 5.

Figure 16A:
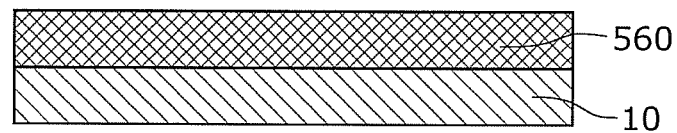
FIG. 16A is a section view illustrating a process of manufacturing the memory device (process of forming a second line) according to Embodiment 5.

First, a second line 560 that is a Cu line is formed on the substrate 10 as illustrated in FIG. 16A. The second line 560 can be formed using a general Cu damascene process. The second line 560 includes a CU portion having a thickness of 200 nm, and has a line width of approximately 0.5 μm.

Figure 16B:
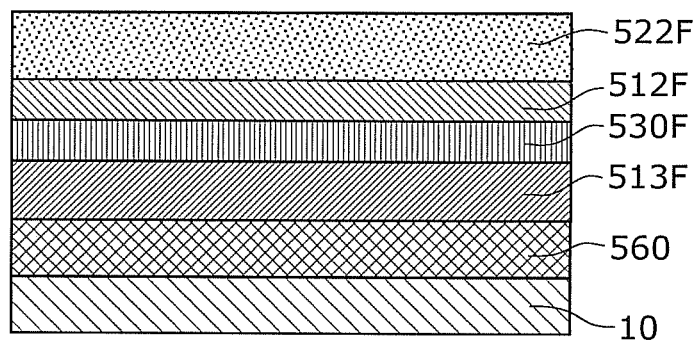
FIG. 16B is a section view illustrating a process of manufacturing the memory device (process of forming stacked films) according to Embodiment 5.

Next, a third electrode film 513F to be the third electrode 513, a non-conductive film 530F to be the non-conductive layer 530, a second electrode film 512F to be the second electrode 512, and a low-concentration variable resistance film 522F to be the low-concentration variable resistance layer 522 are deposited in this order as illustrated in FIG. 16B to form stacked films.

Here, the material of the second electrode film 512F and the third electrode film 513F is preferably a noble metal material, for example, one of platinum (Pt), palladium (Pd), iridium (Ir), a composite of these, copper (Cu), titanium (Ti), tungsten (W), tantalum (Ta), and a metal including at least one of these nitrides. Furthermore, the sputtering method, the CVD method, and so on are used as the film-forming method for these materials. The second electrode material preferably has a standard electrode potential lower than that of the first electrode material. When a material identical to that of the second electrode material or having a work function equivalent to that of the second electrode material is used for the third electrode material, a diode having current-voltage characteristics symmetric with respect to current-voltage characteristics of a polarity of a different applied voltage can be formed. The same holds true for other Embodiments for selecting the second and third electrode materials. According to Embodiment 5, a tantalum nitride (TaN) film with a thickness of 30 nm is deposited as the second electrode film 512F and the third electrode film 513F using the sputtering method.

Furthermore, the material of the non-conductive film 30F according to Embodiment 1 can be used as the material of the non-conductive film 530F. A SiN$_x$ (x=0.6) film with a thickness of 15 nm is deposited as the non-conductive film 530F according to Embodiment 5.

Furthermore, the material of the low-concentration variable resistance film 22F according to Embodiment 1 can be used as the material of the low-concentration variable resistance film 522F. According to Embodiment 5, a TaO$_{0.66}$ film with a thickness of 50 nm is deposited as the low-concentration variable resistance layer 522 using the sputtering method.

Figure 16C:
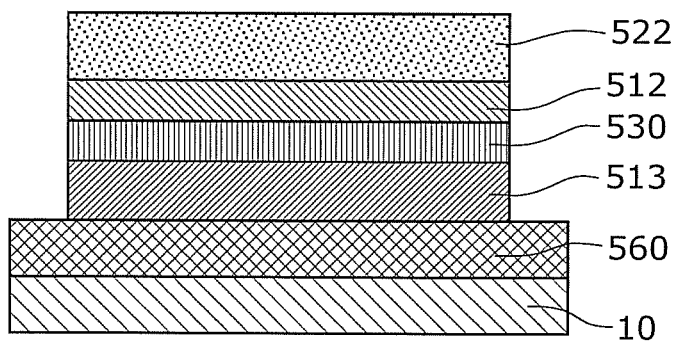
FIG. 16C is a section view illustrating a process of manufacturing the memory device (process of forming stacked layers) according to Embodiment 5.

Next, as illustrated in FIG. 16C, masking using an exposure process and bulk etching are performed on the stacked films including the third electrode film 513F, the non-conductive film 530F, the second electrode film 512F, and the low-concentration variable resistance film 522F to form a stacked structure having predetermined dimensions and including the third electrode 513, the non-conductive layer 530, the second electrode 512, and the low-concentration variable resistance layer 522. The stacked structure after the etching is represented by a rectangle of 1.5 μm×0.5 μm in the plan view according to Embodiment 5. Furthermore, a longer side of the stacked structure is in a direction of a longer side of the second line 560.

Figure 16D:
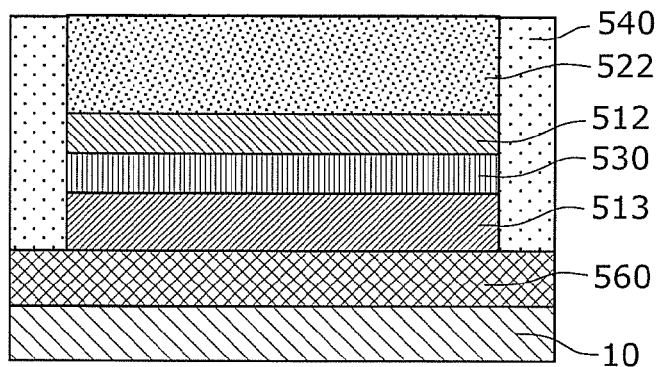
FIG. 16D is a section view illustrating a process of manufacturing the memory device (process of forming an interlayer insulating film) according to Embodiment 5.

Next, as illustrated in FIG. 16D, an interlayer insulating film 540 comprising TEOS-SiO is deposited using the CVD method with a thickness of 400 nm. Then, a wafer surface including the interlayer insulating film 540 and the low-concentration variable resistance layer 522 becomes planarized, for example, by polishing the surface of the interlayer insulating film 540 with the CMP method until the surface of the low-concentration variable resistance layer 522 is exposed. Accordingly, the interlayer insulating film 540 can be formed to surround the third electrode 513, the non-conductive layer 530, the second electrode 512, and the low-concentration variable resistance layer 522 in a state where the surface of the low-concentration variable resistance layer 522 is exposed.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 540. In addition, a stacked structure of these materials may be used as the interlayer insulating film 540.

Figure 16E:
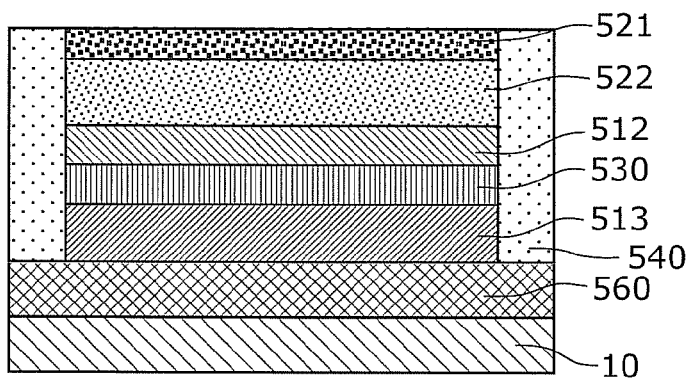
FIG. 16E is a section view illustrating a process of manufacturing the memory device (process of forming a high-concentration variable resistance layer) according to Embodiment 5.

Next, the exposed surface of the low-concentration variable resistance layer 522 is oxidized by performing a plasma oxidation process on the wafer surface to form the high-concentration variable resistance layer 521 as illustrated in FIG. 16E. According to Embodiment 5, the high-concentration variable resistance layer 521 with a thickness of 6 nm is formed by the plasma oxidation process at 400° C.

Figure 16F:
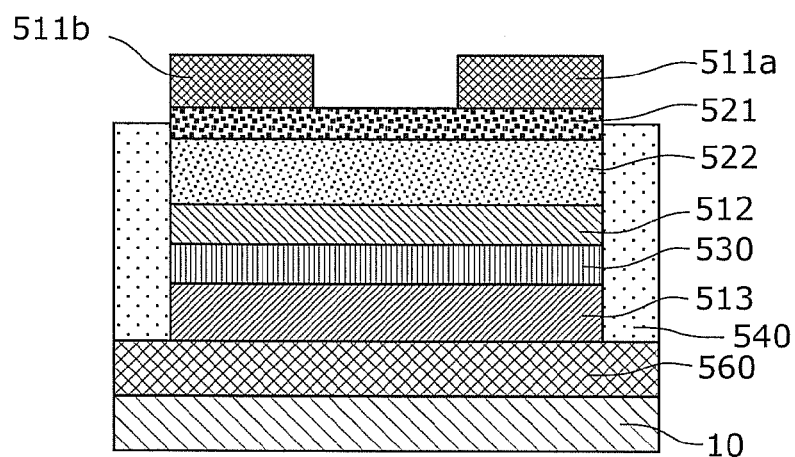
FIG. 16F is a section view illustrating a process of manufacturing the memory device (process of forming first electrodes) according to Embodiment 5.

Next, a first electrode film to be the first electrodes 511a and 511b is deposited using the sputtering method, a CVC method, and so on as illustrated in FIG. 16F. Then, the first electrode film is patterned into the first electrodes 511a and 511b through masking using an exposure process and etching. Here, the material of the first electrodes 511a and 511b is preferably a material from which functions of the high-concentration variable resistance layer 521 are easily derived, that is, a material in which the resistance state is easily changed. The material is preferably a noble metal material, for example, one of platinum (Pt), palladium (Pd), iridium (Ir), and a composite of these. According to Embodiment 5, iridium (Ir) is used as the material of the first electrodes 511a and 511b. Furthermore, the first electrodes 511a and 511b have a width of 0.5 μm, and a thickness of 50 nm. Furthermore, a distance between the first electrodes 511a and 511b that are adjacent to each other is 0.5 μm.

Furthermore, although not illustrated, when the memory device according to Embodiment 5 is used as a storage device for an integrated circuit, a substrate in which a transistor circuit is formed in advance can be used. Here, a via hole for electrically connecting the transistor circuit is connected to the second line 560.

Accordingly, the memory device 500 according to Embodiment 5 can be manufactured.

Since the high-concentration variable resistance layer 521 is on the low-concentration variable resistance layer 522 in the memory device 500, the high-concentration variable resistance layer 521 can be formed by oxidizing a part of the low-concentration variable resistance layer 522. Thus, the high-concentration variable resistance layer 521 can be easily formed.

The memory device 500 can be used as a memory cell of a semiconductor storage device as illustrated in FIG. 3, as according to Embodiment 1. Furthermore, a write operation and a read operation performed by the semiconductor storage device are the same as those according to Embodiment 1.

Embodiment 6

Next, a memory device and a method for manufacturing the memory device according to Embodiment 6 will be described with reference to the drawings. A semiconductor storage device according to Embodiment 6 and a write operation and a read operation performed by the semiconductor storage device are the same as those according to Embodiment 1, and thus, the description thereof is omitted.

[Structure of Memory Device]

Figure 17A:
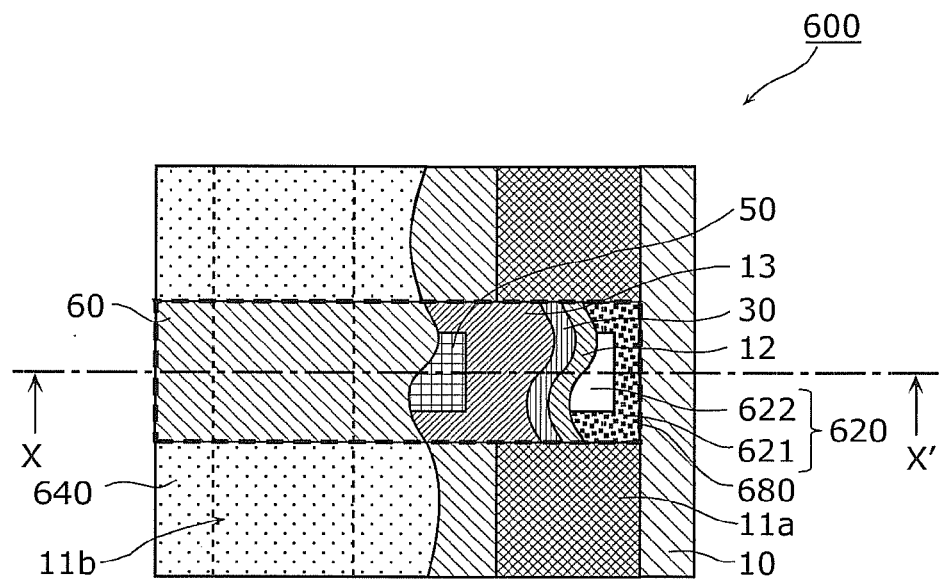
FIG. 17A is a partially cutout plan view illustrating a structure of a memory device according to Embodiment 6.
Figure 17B:
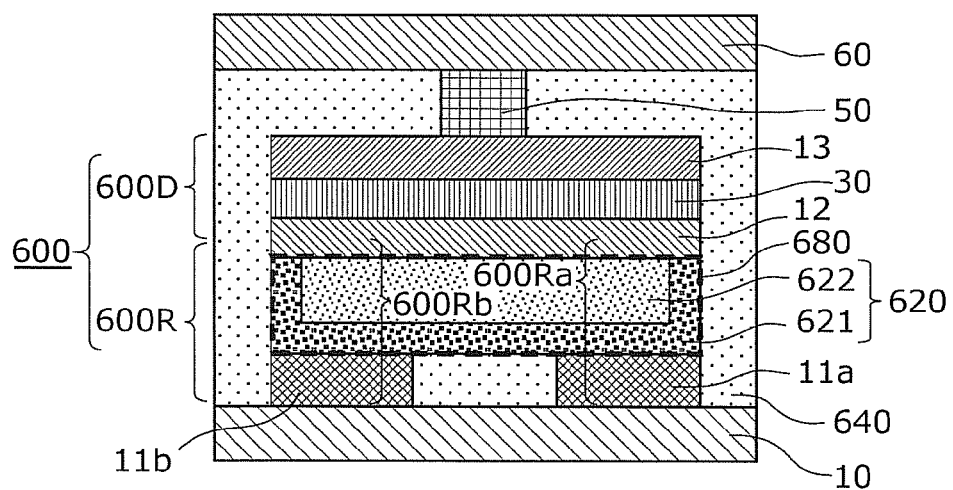
FIG. 17B is a section view illustrating the structure of the memory device cut along an X-X' line in FIG. 17A according to Embodiment 6.

First, a memory device 600 according to Embodiment 6 will be described with reference to FIGS. 17A and 17B. FIG. 17A is a partially cutout plan view illustrating a structure of the memory device 600 according to Embodiment 6. Furthermore, FIG. 17B is a section view illustrating the structure of the memory device 600 cut along an X-X' line in FIG. 17A. Embodiment 6 will be described using two variable resistance elements formed in a single memory device as an example, as according to Embodiment 1. Thus, the constituent elements in FIGS. 17A and 17B identical to those in FIGS. 1A and 1B are assigned the same reference signs, and the descriptions are omitted or simplified.

The difference between the memory device 600 in FIGS. 17A and 17B according to Embodiment 6 and the memory device 100 in FIGS. 1A and 1B according to Embodiment 1 is that the memory device 600 is a memory-cell-hole-type memory device including a memory cell hole in which a part of the memory device is formed, whereas the memory device 100 is a planar memory device.

As illustrated in FIGS. 17A and 17B, the memory device 600 includes an interlayer insulating film 640 that surrounds first electrodes 11a and 11b and covers the upper portions of the first electrodes 11a and 11b, a memory cell hole 680 (region enclosed by dashed lines in FIGS. 17A and 17B) formed within the interlayer insulating film 640 to at least reach the top surface of the first electrodes 11a and 11b, a high-concentration variable resistance layer 621 formed within the memory cell hole 680 to cover at least the bottom surface of the memory cell hole 680, and a low-concentration variable resistance layer 622 embedded in the memory cell hole 680 to be in contact with the high-concentration variable resistance layer 621.

Furthermore, the second electrode 12 is formed on and in contact with the low-concentration variable resistance layer 622. The non-conductive layer 30 is formed on the second electrode 12 to be in contact with the top surface of the second electrode 12. The third electrode 13 is formed on the non-conductive layer 30 to be in contact with the top surface of the non-conductive layer 30.

Here, the memory device 600 is electrically connected to a second line 60 through a plug 50 electrically connected to the top surface of the third electrode 13 as according to Embodiment 1.

According to Embodiment 6, the materials of the high-concentration variable resistance layer 21 and the low-concentration variable resistance layer 22 according to Embodiment 1 can be used as the materials of the high-concentration variable resistance layer 621 and the low-concentration variable resistance layer 622, respectively. Furthermore, the high-concentration variable resistance layer 621 and the low-concentration variable resistance layer 622 comprise a variable resistance layer 620, and the oxygen concentration of the high-concentration variable resistance layer 621 is higher than that of the low-concentration variable resistance layer 622.

The memory device 600 includes a variable resistance element 600R including first and second variable resistance elements 600Ra and 600Rb, a total number of which is equal to a total number of the first electrodes 11a and 11b with the stacked structure including the first electrodes 11a and 11b, the variable resistance layer 620, and the second electrode 12 as according to Embodiment 1. According to Embodiment 6, the variable resistance element 600R includes two of the first and second variable resistance elements 600Ra and 600Rb within one memory cell, and further includes two of the first electrodes 11a and 11b, the one variable resistance layer 620, and the one second electrode 12. In other words, the first variable resistance element 600Ra includes the first electrode 11a, the high-concentration variable resistance layer 621, the low-concentration variable resistance layer 622, and the second electrode 12. Furthermore, the second variable resistance element 600Rb includes the first electrode 11b, the high-concentration variable resistance layer 621, the low-concentration variable resistance layer 622, and the second electrode 12. As such, the high-concentration variable resistance layer 621, the low-concentration variable resistance layer 622, and the second electrode 12 are shared between the first variable resistance element 600Ra and the second variable resistance element 600Rb, but the resistance elements include the respective first electrodes 11a and 11b. The element area of the variable resistance element 600R is defined as a total of areas (contact areas) in which the first electrodes 11a and 11b and the high-concentration variable resistance layer 621 are in contact with each other.

In the memory device 600, the second electrode 12, the non-conductive layer 30, and the third electrode 13 comprise a diode 600D shared between the first variable resistance element 600Ra and the second variable resistance element 600Rb, with the stacked structure. The element area of the diode 600D is a smaller one of areas (contact areas) in which (i) the second electrode 12 and the non-conductive layer 30 are in contact with each other and (ii) the non-conductive layer 30 and the third electrode 13 are in contact with each other.

As such, the two variable resistance elements 600Ra and 600Rb and the one diode 600D are formed solely in the memory device 600 according to Embodiment 6 as according to Embodiment 1. The memory device 600 operates in the same manner as the memory device according to Embodiment 1. Accordingly, the element area of the diode 600D to be shared can be larger than the element area of each of the variable resistance elements 600Ra and 600R. Thus, the capacity of the memory device can be increased without miniaturizing the variable resistance layers also according to Embodiment 6. As a result, it is possible to substantially increase an allowable current amount of the diode, and prevent the diode from being destroyed by the current during an initial break operation and a resistance change operation.

Furthermore, since processing dimensions of the variable resistance layer and the diode can be larger than the minimum design dimension of the memory device, the memory device can substantially be miniaturized without using special micromachining process technology.

Furthermore, a memory cell hole is formed across electrodes in contact with a layer in which the resistance state changes, in the variable resistance layer of the memory device 600, and variable resistance elements are formed by embedding the variable resistance layers in the memory cell hole. Then, a diode is formed on the memory cell hole, and each of the variable resistance elements is connected in series with the diode.

Using the memory-cell-hole-type memory device, the side surface of the high-concentration variable resistance layer and the low-concentration variable resistance layer is never dry etched in the pattern processing of these layers. Accordingly, it is possible to prevent the side surface from being damaged by the etching and prevent decrease in the effective element area of the variable resistance element due to degradation of the side surface, and miniaturize the memory device.

Since the memory cell hole is enough large to be across the variable resistance elements, the bottom area of the memory cell hole according to Embodiment 6 is larger than that of the memory cell holes formed respectively in the variable resistance elements. Accordingly, it is possible to reduce an aspect ratio of a memory cell hole, easily embed the variable resistance layer into the memory cell hole, and improve forming of a high-concentration variable resistance layer with a uniform thickness at the bottom of the memory cell hole.

Although the memory cell hole 680 in the plan view is represented by a rectangle as illustrated in FIGS. 17A and 17B according to Embodiment 6, the shape is not limited to the rectangle. For example, the shape of the memory cell hole in the plan view may be represented by an oval or a polygon.

Furthermore, although the memory cell hole 680 is formed vertical to the substrate 10 as illustrated in FIG. 17B, it does not always have to be so. For example, the present invention includes a tilt (tapered form) on a cross-section surface of the stacked structure manufactured in an actual manufacturing process.

Furthermore, although the second electrode 12 is an electrode of a single layer shared between the variable resistance element 600R and the diode 600D as illustrated in FIG. 17B, the second electrode 12 does not have to be so. For example, when the variable resistance element 600R and the diode 600D separately comprise appropriate electrode materials, the second electrode 12 may have a stacked structure including two or more layers of different electrode materials.

Although the first electrodes 11a and 11b are two in Embodiment 6, the present invention is not limited to these. For example, when the first electrodes are three or more, as long as the first electrodes are connected to the high-concentration variable resistance layer 621, the same advantage can be produced. This is true for the descriptions from Embodiments 7 to 10 to be described later.

[Method for Manufacturing Memory Device]

Next, a method for manufacturing the memory device 600 according to Embodiment 6 will be described with reference to FIGS. 18A to 18J. FIGS. 18A to 18J are section views illustrating processes of manufacturing a memory device according to Embodiment 6.

Figure 18A:
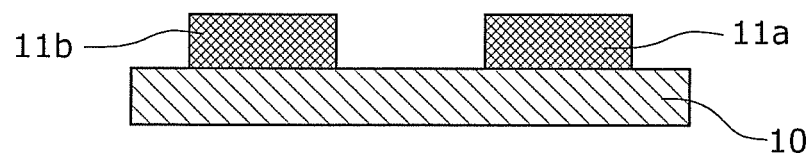
FIG. 18A is a section view illustrating a process of manufacturing the memory device (process of forming first electrodes) according to Embodiment 6.

As illustrated in FIG. 18A, a conductive film is deposited on the substrate 10 using the sputtering method, the CVC method, and so on. Then, the conductive film is patterned into first electrodes 11a and 11b through masking using an exposure process and etching.

Here, the material of the first electrodes 11a and 11b is preferably a material from which functions of the high-concentration variable resistance layer 621 are easily derived, that is, a material in which the resistance state is easily changed. The material is preferably a noble metal material, for example, one of platinum (Pt), palladium (Pd), iridium (Ir), and a composite of these. According to Embodiment 6, iridium (Ir) is used as the material of the first electrodes 11a and 11b. Furthermore, the first electrodes 11a and 11b have a width of 0.5 μm, and a thickness of 50 nm. Furthermore, a distance between the first electrodes 11a and 11b that are adjacent to each other is 0.5 μm.

Furthermore, although not illustrated, when the memory device according to Embodiment 6 is used as a storage device for an integrated circuit, a substrate in which a transistor circuit is formed in advance can be used. Here, the first electrodes 11a and 11b are connected to a via hole for electrically connecting the transistor circuit. This is true for the descriptions from Embodiments 7 to 9 to be described later.

Figure 18B:
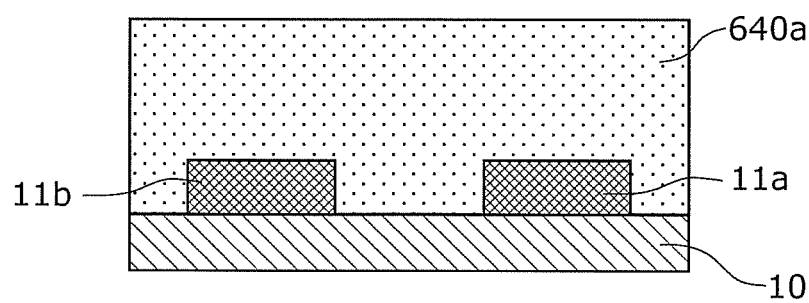
FIG. 18B is a section view illustrating a process of manufacturing the memory device (process of forming a first insulating film) according to Embodiment 6.

Next, as illustrated in FIG. 18B, an interlayer insulating film 640a comprising TEOS-SiO is deposited using the CVD method with a thickness of 600 nm to cover the first electrodes 11a and 11b. Then, a wafer surface including the interlayer insulating film 640a including the first electrodes 11a and 11b becomes planarized, for example, by polishing the surface of the interlayer insulating film 640a with the CMP method until the interlayer insulating film 640a has a thickness of 300 nm.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 640a. In addition, a stacked structure of these materials may be used as the interlayer insulating film 640a.

Figure 18C:
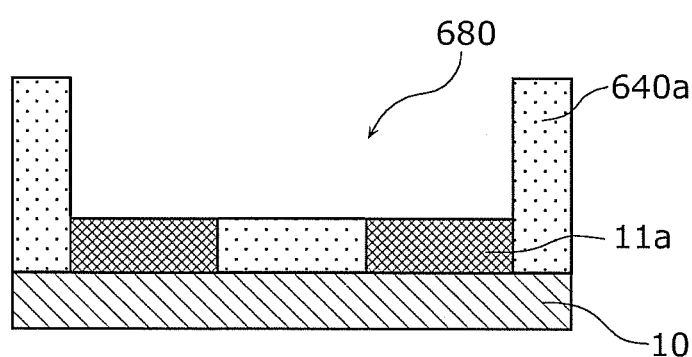
FIG. 18C is a section view illustrating a process of manufacturing the memory device (process of forming a memory cell hole) according to Embodiment 6.

Next, as illustrated in FIG. 18C, a memory cell hole 680 whose bottom surface is across the first electrodes 11a and 11b and reaches the top surface of the interlayer insulating film 640a is formed by etching the interlayer insulating film 640a until the first electrodes 11a and 11b are exposed through masking using an exposure process.

Figure 18D:
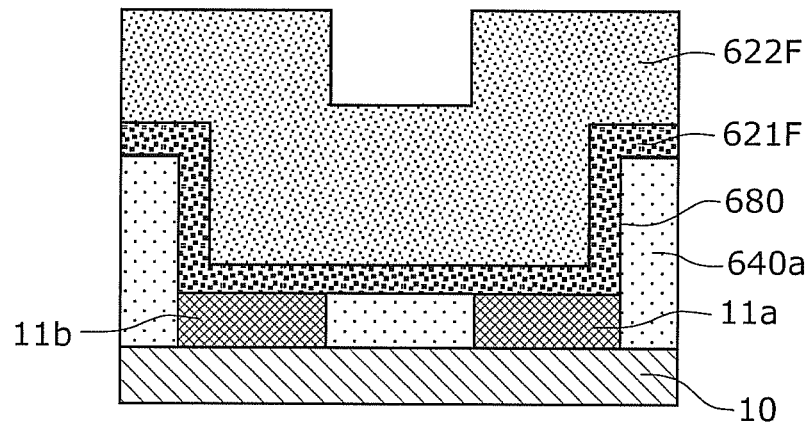
FIG. 18D is a section view illustrating a process of manufacturing the memory device (process of forming a variable resistance layer) according to Embodiment 6.

Next, as illustrated in FIG. 18D, a high-concentration variable resistance film 621F to be the high-concentration variable resistance layer 621 and a low-concentration variable resistance film 622F to be the low-concentration variable resistance layer 622 are successively deposited to cover the surface of the interlayer insulating film 640a and the bottom surface and the inner surface of the memory cell hole 680.

Here, an oxygen-deficient film that is an oxide having lower oxygen content than that of an oxide having stoichiometric composition is used as a material of the low-concentration variable resistance layer 622F. According to Embodiment 6, a case where a tantalum oxide is used as such a film will be described. The tantalum oxide comprised in the low-concentration variable resistance film 622F (low-concentration variable resistance layer 622) is represented by $TaO_x$ with a preferred range ($0 < x < 2.5$). The low-concentration variable resistance film 622F has a thickness large enough to completely embed the memory cell hole 680. Furthermore, the tantalum oxide comprised in the high-concentration variable resistance film 621F (high-concentration variable resistance layer 621) is represented by TaO$_y$ with a preferred range of (x<y). The high-concentration variable resistance film 621F has a thickness between 1 nm and 10 nm inclusive at the bottom of the memory cell hole 680. The thickness of the high-concentration variable resistance film 621F as the inner wall of the memory cell hole 680 is not particularly limited. The values X and Y representing oxygen composition in the chemical formulae of TaO$_x$ and TaO$_y$ can be controlled by adjusting a ratio of oxygen gas flow to argon gas flow at the time of sputtering.

The specific process of sputtering the high-concentration variable resistance film 621F and the low-concentration variable resistance layer 622F that comprise a tantalum oxide will be described. First, a substrate is placed in a sputtering apparatus, and the inside of the sputtering apparatus is vacuumed up to approximately $7 \times 10^{-4}$ Pa. Sputtering is performed above the structure illustrated in FIG. 18C, with tantalum as a target, power set to 250 W, a total gas pressure of the Ar gas and the oxygen gas set to 3.3 Pa, and a preset temperature of the substrate set to 30° C. When the oxygen partial pressure ratio is changed from 1% to 7%, the oxygen content of the tantalum oxide layer (that is, the composition ratio of oxygen atoms to tantalum atoms) changes from approximately 40% (TaO$_{0.66}$) to approximately 70% (TaO$_{2.3}$). The composition of the tantalum oxide layer can be measured using Rutherford Backscattering Spectrometry. Furthermore, an oxide having stoichiometric composition means, in the case of tantalum oxide, Ta$_2$O$_5$ which is an insulator, and here, an oxygen-deficient metal oxide becomes conductive. According to Embodiment 6, a Ta$_2$O$_5$ film with a thickness of 6 nm as the high-concentration variable resistance film 621F and a TaO$_{0.66}$ film with a thickness of 400 nm as the low-concentration variable resistance film 622F are deposited.

Although an oxygen-deficient tantalum oxide film is used as the low-concentration variable resistance film 622F according to Embodiment 6, a material other than tantalum oxide may be used. For example, a variable resistance film with a similar stacked structure as the oxygen-deficient tantalum oxide film can be formed using an oxide comprising oxygen-deficient iron, and other transition metal oxides, such as hafnium (Hf) and zirconium (Zr). The sputtering method, the CVD method, and so on are used as the film-forming method for these materials.

Figure 18E:
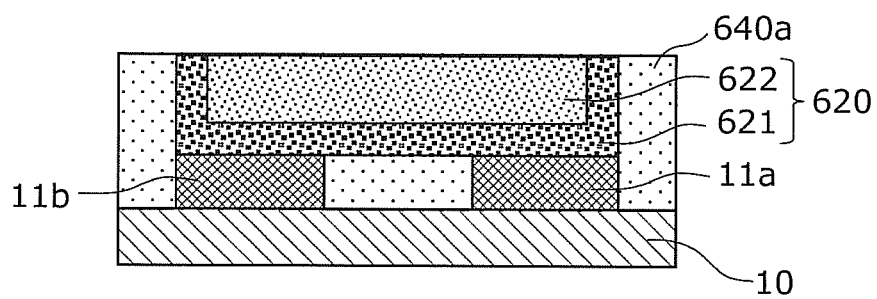
FIG. 18E is a section view illustrating a process of manufacturing the memory device (polishing process) according to Embodiment 6.

Next, as illustrated in FIG. 18E, the wafer surface becomes planarized, for example, by polishing the high-concentration variable resistance film 621F and the low-concentration variable resistance film 622F with the CMP method until the surface of the interlayer insulating film 640a is exposed. Thus, the high-concentration variable resistance layer 621 and the low-concentration variable resistance layer 622 are formed within the memory cell hole 680.

Figure 18F:
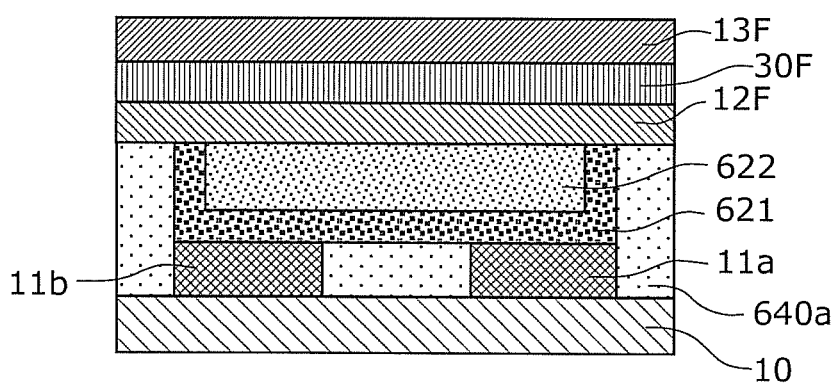
FIG. 18F is a section view illustrating a process of manufacturing the memory device (process of forming stacked films) according to Embodiment 6.

Next, a second electrode film 12F to be the second electrode 12 is deposited on the wafer surface as illustrated in FIG. 18F. The same material as that for the first electrodes 11a and 11b can be used for the second electrode film 12F. Alternatively, since the second electrode 12 is preferably an electrode that facilitates maintaining the resistance of the interface between the second electrode 12 and the low-concentration variable resistance layer 622, that is, an electrode that does not easily allow resistance change, the material of the second electrode film 12F may be one of copper (Cu), titanium (Ti), tungsten (W), tantalum (Ta), and a metal comprising at least one of these nitrides. Furthermore, the sputtering method, the CVD method, and so on can be used as the film-forming method for these materials. According to Embodiment 6, a tantalum nitride (TaN) film with a thickness of 30 nm is deposited as the second electrode film 12F using the sputtering method.

Next, a non-conductive film 30F to be the non-conductive layer 30 is deposited on the wafer surface as illustrated in FIG. 18F. For example, the nitrogen-deficient silicon nitride (SiN$_x$) is used as a material of the non-conductive film 30F.

The SiN$_x$ film having such semiconductor properties can be formed, for example, by reactive sputtering in the nitrogen gas atmosphere using a Si target, and a bandgap of the SiN$_x$ film can be changed and current-voltage characteristics of a diode can be adjusted, by changing a composition x of the nitrogen. The non-conductive film 30F may be formed with a pressure in a chamber set to 0.1 to 1 Pa, and an Ar/N$_2$ flow rate set to 18 sccm/2 sccm under a room temperature. A SiN$_x$ (x=0.6) film with a thickness of 15 nm is deposited as the non-conductive film 30F according to Embodiment 6.

Next, a third electrode film 13F to be the third electrode 13 is deposited on the wafer surface as illustrated in FIG. 18F. The same material as that for the second electrode film 12F can be used for the third electrode film 13F. According to Embodiment 6, a tantalum nitride (TaN) film with a thickness of 30 nm is deposited as the third electrode film 13F by the sputtering method. Furthermore, aside from the sputtering method, the CVD method may be used as the deposition method.

Accordingly, the stacked films including the second electrode film 12F, the non-conductive film 30F, and the third electrode film 13F can be structured on the memory cell hole 680 in which the variable resistance layer 620 is formed.

Figure 18G:
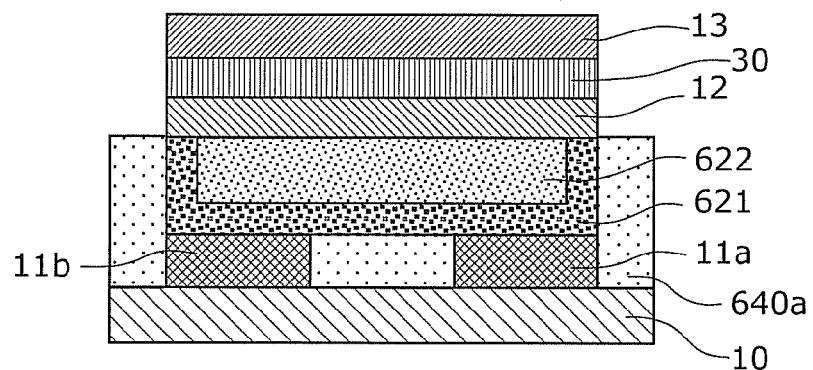
FIG. 18G is a section view illustrating a process of manufacturing the memory device (process of forming stacked layers) according to Embodiment 6.

Next, the stacked films including the second electrode film 12F, the non-conductive film 30F, and the third electrode film 13F are masked using an exposure process and etched to form a stacked structure having predetermined dimensions and including the second electrode 12, the non-conductive layer 30, and the third electrode 13 as illustrated in FIG. 18G. The stacked structure after the etching is represented by a rectangle of 1.5 μm×0.5 μm in the plan view according to Embodiment 6. Furthermore, a longer side of the stacked structure is in a direction of a shorter side of the first electrodes 11a and 11b.

Figure 18H:
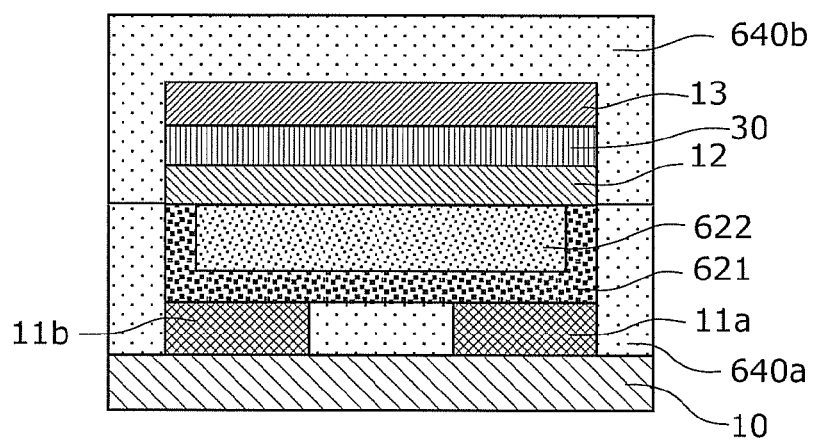
FIG. 18H is a section view illustrating a process of manufacturing the memory device (process of forming a second interlayer insulating film) according to Embodiment 6.

Next, an interlayer insulating film 640b with a thickness of 400 nm and comprising TEOS-SiO is deposited using the CVD method, and the interlayer insulating film 640b is extended upward. Then, the wafer surface becomes almost planarized by polishing the interlayer insulating film 640b on the third electrode 13 with the CMP method until the thickness of the interlayer insulating film 640b reaches 200 nm as illustrated in FIG. 18H. Accordingly, an interlayer insulating film 640 can be formed with the interlayer insulating film 640a corresponding to the memory cell hole 680 and the interlayer insulating film 640b that covers the stacked structure of the second electrode 12, the non-conductive layer 30, and the third electrode 13.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 640b. In addition, a stacked structure of these materials may be used as the interlayer insulating film 640b.

Figure 18I:
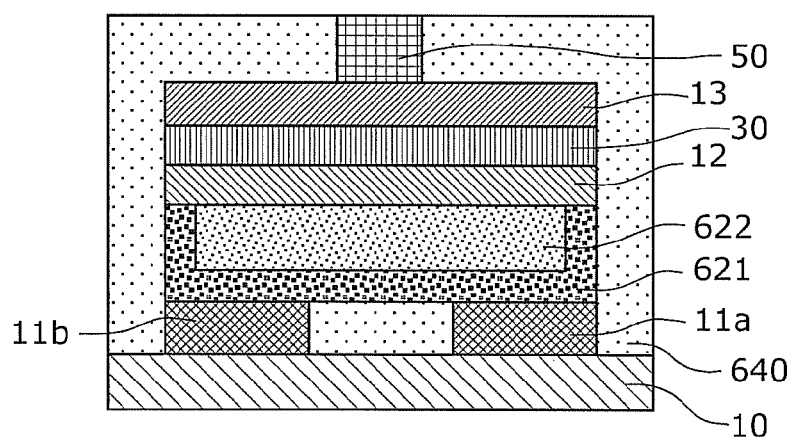
FIG. 18I is a section view illustrating a process of manufacturing the memory device (process of forming a plug) according to Embodiment 6.

Next, a plug 50 is formed to be embedded in the interlayer insulating film 640 on the third electrode 13 as illustrated in FIG. 18I. The plug 50 can be formed as indicated below. Specifically, a via hole with a diameter of 260 nm is formed in the interlayer insulating film 640b in FIG. 18H to reach the surface of the third electrode 13. The via hole can be easily formed using general semiconductor process technology. For example, the structure illustrated in FIG. 18I can be formed by forming such a via hole, forming a conductive film that is to be the plug 50 and comprises tungsten (W), using the CVD method, and performing the CMP on the conductive film. Aside from tungsten (W), copper (Cu) or aluminum (Al) may be used as a material for the plug 50.

Figure 18J:
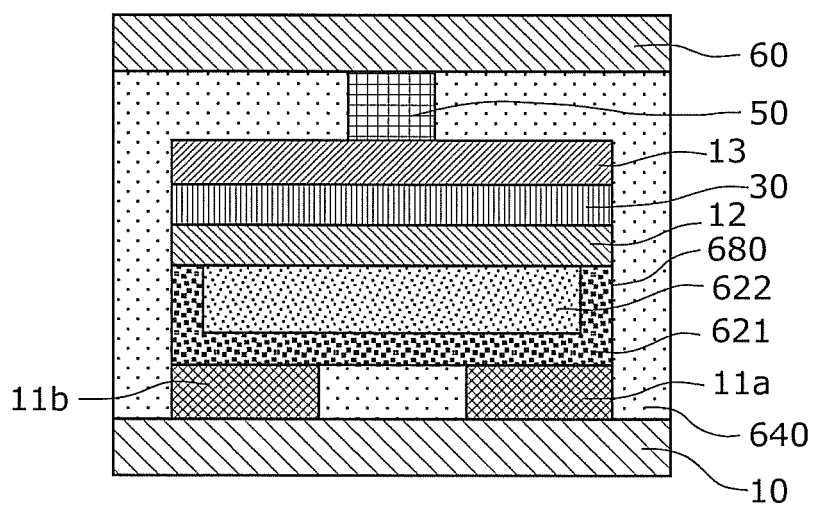
FIG. 18J is a section view illustrating a process of manufacturing the memory device (process of forming a second line) according to Embodiment 6.

Next, a second line 60 is formed as illustrated in FIG. 18J. The second line 60 can be formed as below. Specifically, a conductive film for lines is deposited on the surface of the structure illustrated in FIG. 18I by the sputtering method, the CVC method, and so on. Then, the conductive film is patterned into the second line 60 with a predetermined shape through masking using an exposure process and etching. The material of the second line 60 may be Al, an Al—Cu alloy, a Ti—Al—N alloy, and a Cu line formed through a damascene process that are also used in the line forming process included in the general semiconductor processes. According to Embodiment 6, an Al film deposited by the sputtering method is used as the second line 60. Furthermore, the second line 60 has a thickness between 200 nm and 400 nm inclusive, and a width of approximately 0.5 µm.

Accordingly, the memory device 600 according to Embodiment 6 can be manufactured.

The memory device 600 can be used as a memory cell of a semiconductor storage device as illustrated in FIG. 3, as according to Embodiment 1. Furthermore, a write operation and a read operation performed by the semiconductor storage device are the same as those according to Embodiment 1.

Embodiment 7

Next, a memory device and a method for manufacturing the memory device according to Embodiment 7 will be described with reference to the drawings. A semiconductor storage device according to Embodiment 7 and a write operation and a read operation performed by the semiconductor storage device are the same as those according to Embodiment 1, and thus, the description thereof is omitted.

[Structure of Memory Device]

Figure 19A:
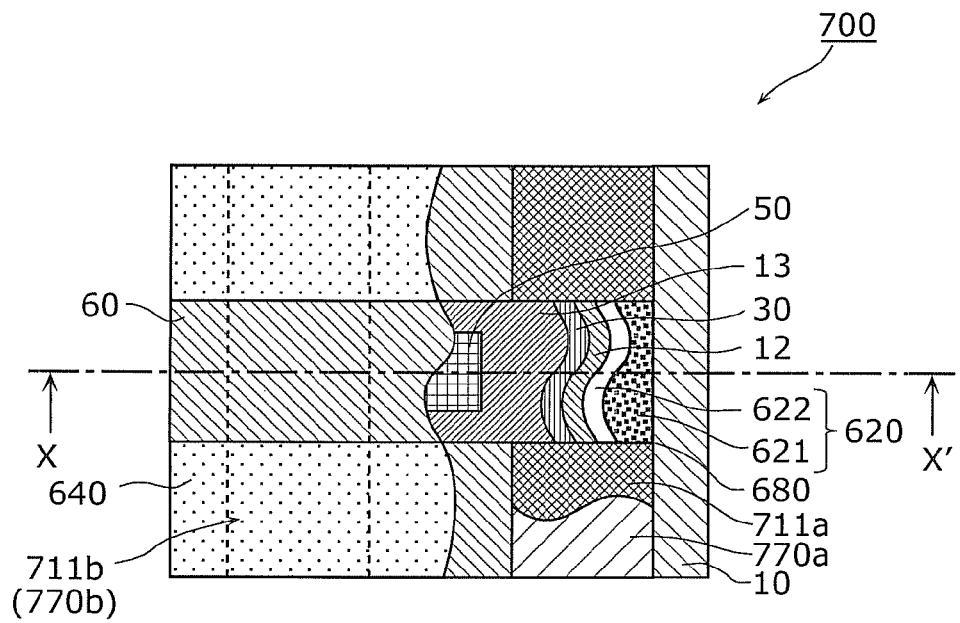
FIG. 19A is a partially cutout plan view illustrating a structure of a memory device according to Embodiment 7.
Figure 19B:
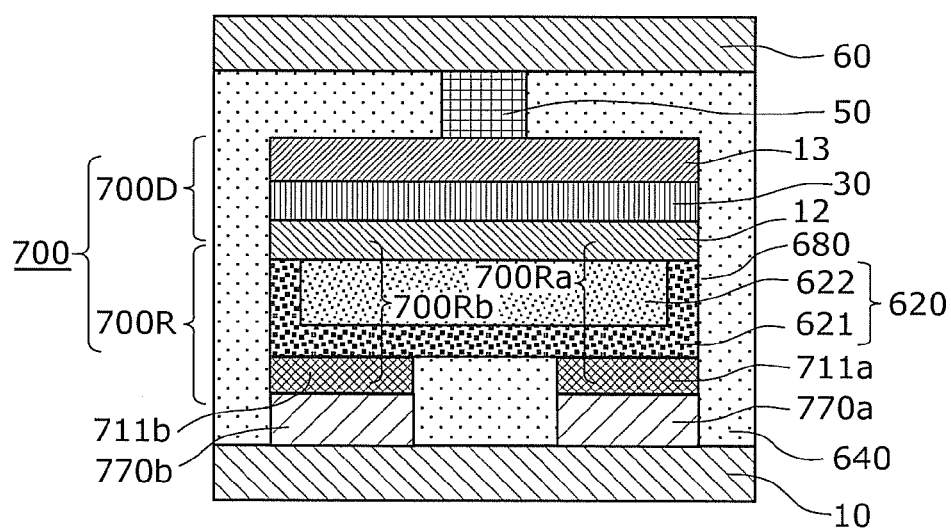
FIG. 19B is a section view illustrating the structure of the memory device cut along an X-X' line in FIG. 19A according to Embodiment 7.

First, a memory device 700 according to Embodiment 7 will be described with reference to FIGS. 19A and 19B. FIG. 19A is a partially cutout plan view illustrating a structure of the memory device 700 according to Embodiment 7. Furthermore, FIG. 19B is a section view illustrating the structure of the memory device 700 cut along an X-X' line in FIG. 19A. Embodiment 7 will be described using two variable resistance elements formed in a single memory device as an example, as according to Embodiment 6.

The memory device 700 in FIGS. 19A and 19B according to Embodiment 7 has the same basic structure as that of the memory device 600 in FIGS. 17A and 17B according to Embodiment 6. Thus, the constituent elements in FIGS. 19A and 19B identical to those in FIGS. 17A and 17B are assigned the same reference signs, and the descriptions are omitted or simplified.

The difference between the memory device 700 in FIGS. 19A and 19B according to Embodiment 7 and the memory device 600 according to Embodiment 6 is that first lines 770a and 770b are formed along first electrodes 711a and 711b, respectively in the memory device 700.

As illustrated in FIGS. 19A and 19B, the first electrodes 711a and 711b are formed in contact with a high-concentration variable resistance layer 621, as the first electrodes 11a and 11b according to Embodiment 6. Furthermore, the same material as that for the first electrodes 11a and 16b according to Embodiment 6 can be used for the first electrodes 711a and 711b.

The two first lines 770a and 770b comprise a metal with a lower resistance, such as Cu, and are formed on a substrate 10. Furthermore, the first electrode 711a and the first electrode 711b are formed on the first line 770a and the first line 770b, and the first line 770a and the first line 770b are in contact with the first electrode 711a and the first electrode 711b, respectively.

The memory device 700 according to Embodiment 7 includes a variable resistance element 700R including first and second variable resistance elements 700Ra and 700Rb, a total number of which is equal to a total number of the first electrodes 711a and 711b with the stacked structure including the first electrodes 711a and 711b, the variable resistance layer 620, and the second electrode 12 as according to Embodiment 6. According to Embodiment 7, the variable resistance element 700R includes two of the first and second variable resistance elements 700Ra and 700Rb within one memory cell, and further includes two of the first electrodes 711a and 711b, the one variable resistance layer 620, and the one second electrode 12. In other words, the first variable resistance element 700Ra includes the first electrode 711a, the high-concentration variable resistance layer 621, the low-concentration variable resistance layer 622, and the second electrode 12. Furthermore, the second variable resistance element 700Rb includes the first electrode 711b, the high-concentration variable resistance layer 621, the low-concentration variable resistance layer 622, and the second electrode 12. Furthermore, the second electrode 12, the non-conductive layer 30, and the third electrode 13 comprise a diode 700D with the stacked structure.

The memory device 700 according to Embodiment 7 having such a structure operates in the same manner and produces the same advantages as the memory device 600 according to Embodiment 6.

Furthermore, the memory device 700 uses the first lines 770a and 770b comprising a material having a resistance lower than that of the first electrodes 711a and 711b. Accordingly, when the first lines 770a and 770b are used as bit lines in a circuit of a semiconductor storage device, the resistance of the bit lines can be reduced, and a favorable circuit operation can be performed. Furthermore, since the first electrodes 711a and 711b can be thinner using the first lines 770a and 770b, the used amount of materials of the first electrodes 711a and 711b can be reduced, and the first electrodes 711a and 711b can be easily processed. In particular, when the material of the first electrodes 711a and 711b is a noble metal, such as Pt, Pd, and Ir, the amount of the noble metal used for the first electrodes 711a and 711b can be reduced, thus reducing the cost.

[Method for Manufacturing Memory Device]

Figure 20A:
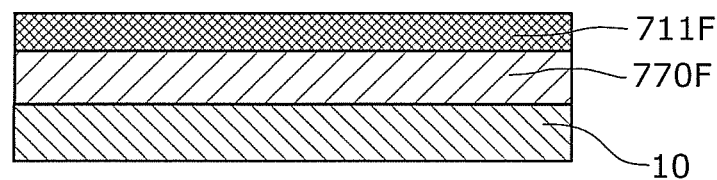
FIG. 20A is a section view illustrating a process of manufacturing the memory device (process of forming a first line film and a first electrode film) according to Embodiment 7.
Figure 20B:
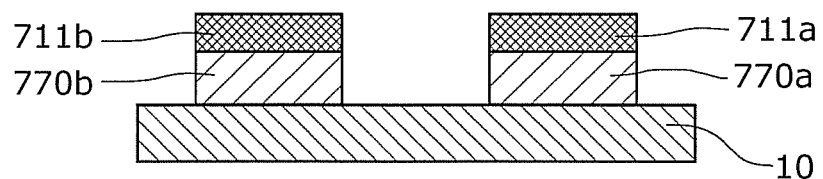
FIG. 20B is a section view illustrating a process of manufacturing the memory device (process of forming first lines and first electrodes) according to Embodiment 7.
Figure 20C:
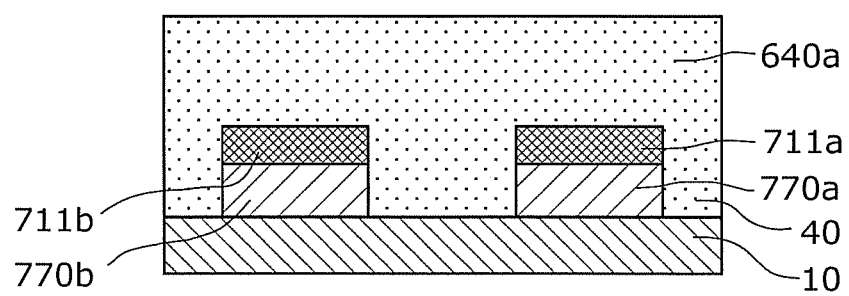
FIG. 20C is a section view illustrating a process of manufacturing the memory device (process of forming an interlayer insulating film) according to Embodiment 7.

Next, a method for manufacturing the memory device 700 according to Embodiment 7 will be described with reference to FIGS. 20A to 20C. FIGS. 20A to 20C are section views illustrating processes of manufacturing the memory device 700 according to Embodiment 7. Since the manufacturing processes after forming the first electrodes 711a and 711b are the same as those after forming the first electrodes 11a and 11b according to Embodiment 6, in the method for manufacturing the memory device 700 according to Embodiment 7, the description is omitted.

First, as illustrated in FIG. 20A, a first line film 770F and a first electrode film 711F are deposited in this order on the substrate 10 using the sputtering method, the CVC method, and so on.

Here, a material such as Al, an Al—Cu alloy, and a Ti—Al—N alloy can be used for the first line film 770F. According to Embodiment 7, an Al film deposited by the sputtering method is used as the first line film 770F. Furthermore, the first line film 770F has a thickness between 200 nm and 400 nm inclusive. Furthermore, the same material as that for the first electrodes 11a and 11b according to Embodiment 6 can be used for the first electrode film 711F. According to Embodiment 7, iridium (Ir) is used as the material for the first electrode film 711F, and the first electrode film 711F has a thickness of 50 nm.

Next, as illustrated in FIG. 20B, the first line film 770F and the first electrode film 711F are patterned into the first lines 770a and 770b and the first electrodes 711a and 711b through masking using an exposure process and etching.

Here, the first lines 770a and 770b have a width of 0.5 μm, and a distance between the first lines 770a and 770b that are adjacent to each other is 0.5 μm. Furthermore, the first electrodes 711a and 711b have a width of 0.5 μm, and a distance between the first electrodes 711a and 711b that are adjacent to each other is 0.5 μm.

Next, as illustrated in FIG. 20C, an interlayer insulating film 640a with a thickness of 600 nm and comprising TEOS-SiO is deposited using the CVD method. Then, a wafer surface including the interlayer insulating film 640a and the first electrodes 711a and 711b becomes almost planarized by polishing the interlayer insulating film 640a until the surface of the first electrodes 711a and 711b are exposed, for example, with the CMP method.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 640a. In addition, a stacked structure of these materials may be used as the interlayer insulating film 640a.

Since the subsequent manufacturing processes are the same as those after FIG. 18C in the manufacturing processes according to Embodiment 6, the description thereof is omitted.

Accordingly, the memory device 700 according to Embodiment 7 can be manufactured.

The memory device 700 can be used as a memory cell of a semiconductor storage device as illustrated in FIG. 3, as according to Embodiment 1. Furthermore, a write operation and a read operation performed by the semiconductor storage device are the same as those according to Embodiment 1.

Embodiment 8

Next, a memory device and a method for manufacturing the memory device according to Embodiment 8 will be described with reference to the drawings. A semiconductor storage device according to Embodiment 8 and a write operation and a read operation performed by the semiconductor storage device are the same as those according to Embodiment 1, and thus, the description thereof is omitted.

[Structure of Memory Device]

Figure 21A:
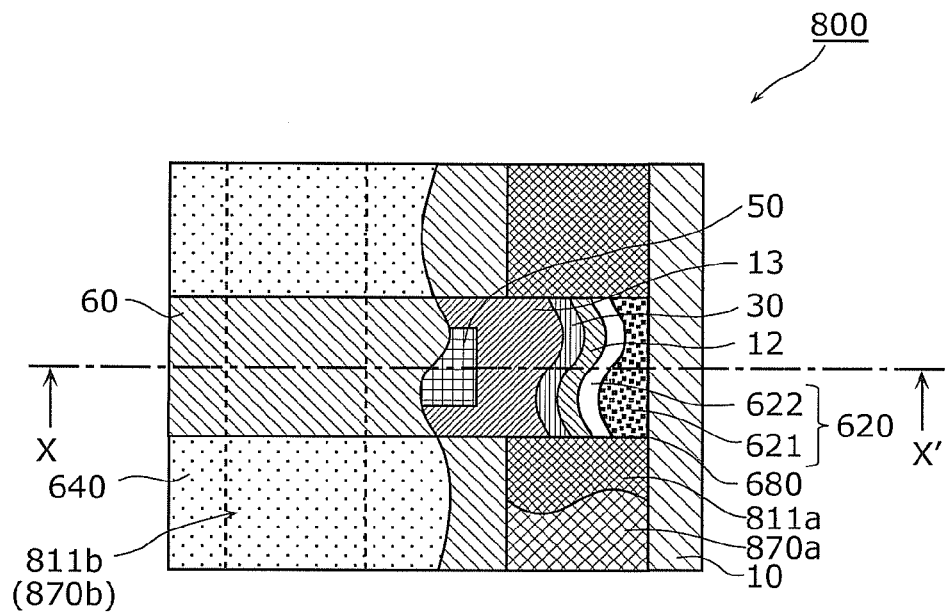
FIG. 21A is a partially cutout plan view illustrating a structure of a memory device according to Embodiment 8.
Figure 21B:
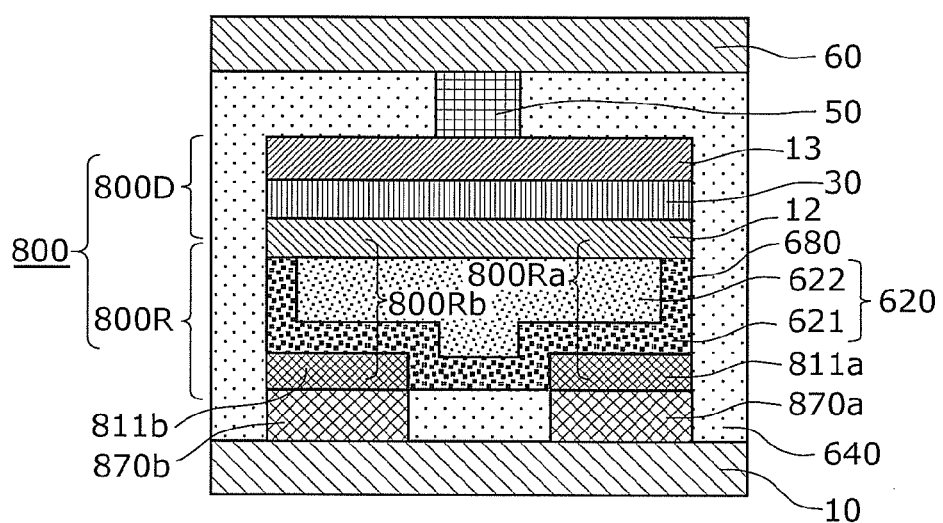
FIG. 21B is a section view illustrating the structure of the memory device cut along an X-X' line in FIG. 21A according to Embodiment 8.

First, a memory device 800 according to Embodiment 8 will be described with reference to FIGS. 21A and 21B. FIG. 21A is a partially cutout plan view illustrating a structure of the memory device 800 according to Embodiment 8. Furthermore, FIG. 21B is a section view illustrating the structure of the memory device 800 cut along an X-X' line in FIG. 21A. Embodiment 8 will be described using two variable resistance elements formed in a single memory device as an example, as according to Embodiments 6 and 7.

The memory device 800 in FIGS. 21A and 21B according to Embodiment 8 has the same basic structure as that of the memory device 700 in FIGS. 19A and 19B according to Embodiment 7. Thus, the constituent elements in FIGS. 21A and 21B identical to those in FIGS. 19A and 19B are assigned the same reference signs, and the descriptions are omitted or simplified.

The differences between the memory device 800 in FIGS. 21A and 21B according to Embodiment 8 and the memory device 700 according to Embodiment 7 are that the lines formed along first electrodes 811a and 811b in the memory device 800 are first lines 870a and 870b that are Cu lines and that the first electrodes 811a and 811b are formed by a plating method.

As illustrated in FIGS. 21A and 21B, the two first lines 870a and 870b are lines comprising copper (Cu), and are formed on the substrate 10 in the memory device 800 according to Embodiment 8. Furthermore, the first electrode 811a and the first electrode 811b are formed on the first line 870a and the first line 870b, and the first line 870a and the first line 870b are in contact with the first electrode 811a and the first electrode 811b, respectively.

The first electrodes 811a and 811b are formed in contact with the high-concentration variable resistance layer 621. The same material as that for the first electrodes 711a and 711b according to Embodiment 7 can be used as the material for the first electrodes 811a and 811b according to Embodiment 8. The first electrodes 811a and 811b are plated electrodes formed on the surface of the first lines 870a and 870b using an electroless plating method.

The memory device 800 according to Embodiment 8 includes a variable resistance element 800R including first and second variable resistance elements 800Ra and 800Rb, a total number of which is equal to a total number of the first electrodes 811a and 811b with the stacked structure including the first electrodes 811a and 811b, the variable resistance layer 620, and the second electrode 12 as according to Embodiment 7. According to Embodiment 8, the variable resistance element 800R includes two of the first and second variable resistance elements 800Ra and 800Rb within one memory cell, and further includes two of the first electrodes 811a and 811b, the one variable resistance layer 620, and the one second electrode 12. In other words, the first variable resistance element 800Ra includes the first electrode 811a, the high-concentration variable resistance layer 621, the low-concentration variable resistance layer 622, and the second electrode 12. Furthermore, the second variable resistance element 800Rb includes the first electrode 811b, the high-concentration variable resistance layer 621, the low-concentration variable resistance layer 622, and the second electrode 12. Furthermore, the second electrode 12, the non-conductive layer 30, and the third electrode 13 comprise a diode 800D with the stacked structure.

The memory device 800 according to Embodiment 8 having such a structure operates in the same manner and produces the same advantages as the memory devices according to Embodiments 6 and 7.

Furthermore, the first electrodes 811a and 811b are formed by a plating method in the memory device 800. Accordingly, the pattern processing through an etching process does not have to be performed on a noble metal, such as Pt, Pd, and Ir, as a material for the first electrodes 811a and 811b. Thus, the following advantages can be produced.

Specifically, the difficulty lies in (i) vertically processing the cross-sectional shape of a noble metal to be used as a material for the first electrodes 811a and 811b, in the general dry etching process using, for example, reactive ion etching, and (ii) completely removing redeposited materials after the etching because of a higher vapor pressure of a reaction product generated from etching gas. Thus, the short circuit easily occurs due to the redeposited materials with the fine pattern, and the pattern formation in the thin line shape also easily fails. Thus, there is a problem in the miniaturization.

In contrast, since the pattern processing through etching a noble metal is not necessary according to Embodiment 8, such problems do not occur. Thus, the advantage that the first electrodes 811a and 811b can be easily miniaturized can be produced.

[Method for Manufacturing Memory Device]

Figure 22A:
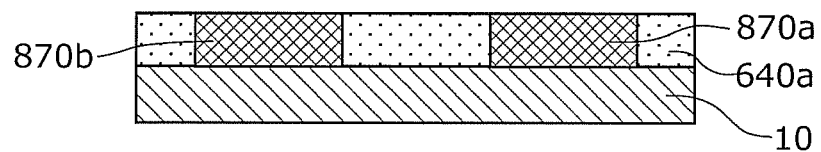
FIG. 22A is a section view illustrating a process of manufacturing the memory device (process of forming first lines and a first interlayer insulating film) according to Embodiment 8.
Figure 22B:
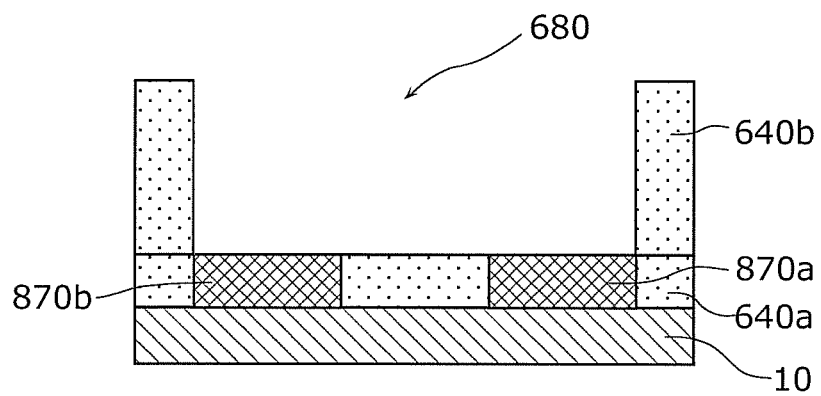
FIG. 22B is a section view illustrating a process of manufacturing the memory device (process of forming a second interlayer insulating film) according to Embodiment 8.

Next, a method for manufacturing the memory device 800 according to Embodiment 8 will be described with reference to FIGS. 22A to 22C. FIGS. 22A and 22B are section views illustrating processes of manufacturing the memory device 800 according to Embodiment 8. Since the manufacturing processes after forming the first electrodes 811a and 811b are the same as those after forming the first electrodes 11a and 11b according to Embodiment 6, in the method for manufacturing the memory device 800 according to Embodiment 8, the description is omitted.

First, as illustrated in FIG. 22A, an interlayer insulating film 640a and the first lines 870a and 870b that are Cu lines are formed on the substrate 10 to expose the surface of the first lines 870a and 870b. The interlayer insulating film 640a and the first lines 870a and 870b can be formed using a general Cu damascene process. Here, the first lines 870a and 870b include Cu portions having a thickness of 200 nm, and have a line width of 0.5 μm. Furthermore, a distance between the first lines 870a and 870b that are adjacent to each other is 0.5 μm.

Next, as illustrated in FIG. 22B, an interlayer insulating film 640b having a thickness of 300 nm and comprising TEOS-SiO is deposited using the CVD method entirely on the top surface of the wafer surface, and a memory cell hole 680 whose bottom surface reaches the top surface of the first lines 870a and 870b is formed by etching the interlayer insulating film 640b until the first lines 870a and 870b are exposed through masking using an exposure process.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 640b. In addition, a stacked structure of these materials may be used as the interlayer insulating film 640b.

Figure 22C:
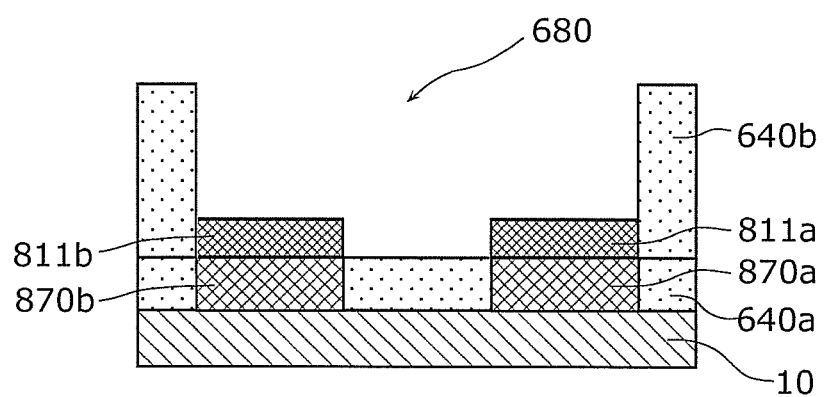
FIG. 22C is a section view illustrating a process of manufacturing the memory device (plating process) according to Embodiment 8.

Next, as illustrated in FIG. 22C, the first electrodes 811a and 811b are formed using, for example, an electroless selective growth plating method only on the exposed surface of the first lines 870a and 870b.

According to Embodiment 8, Pt may be used as a material of the first electrodes 811a and 811b, and a hydrazine-ammonia Pt plating bath or a Pt plating bath including a boron-based compound or hypophosphoric acid as a reducer may be used as an electroless Pt plating bath. Furthermore, the first electrodes 811a and 811b comprising Pt desirably have a thickness approximately between 5 nm and 50 nm, and have a thickness of 25 nm according to Embodiment 8.

Furthermore, after an electrode seed layer comprising one of nickel, a nickel-phosphorus alloy, and a nickel-boron alloy is formed on the exposed surface of the first lines 870a and 870b, the electroless Pt plating bath is desirably performed. Accordingly, the Pt selective growth can be more efficiently performed on the Cu lines. In this case, the electrode seed layer may have a stacked structure comprising one of (i) a pair of palladium and nickel, (ii) a pair of palladium and a nickel-phosphorus alloy, and (iii) a pair of palladium and a nickel-boron alloy.

Since the subsequent manufacturing processes are the same as those after FIG. 18D in the manufacturing processes according to Embodiment 6, the description thereof is omitted.

Accordingly, the memory device 800 according to Embodiment 8 can be manufactured.

The memory device 800 can be used as a memory cell of a semiconductor storage device as illustrated in FIG. 3, as according to Embodiment 1. Furthermore, a write operation and a read operation performed by the semiconductor storage device are the same as those according to Embodiment 1.

Embodiment 9

Next, a memory device and a method for manufacturing the memory device according to Embodiment 9 will be described with reference to the drawings. A semiconductor storage device according to Embodiment 9 and a write operation and a read operation performed by the semiconductor storage device are the same as those according to Embodiment 1, and thus, the description thereof is omitted.

[Structure of Memory Device]

Figure 23A:
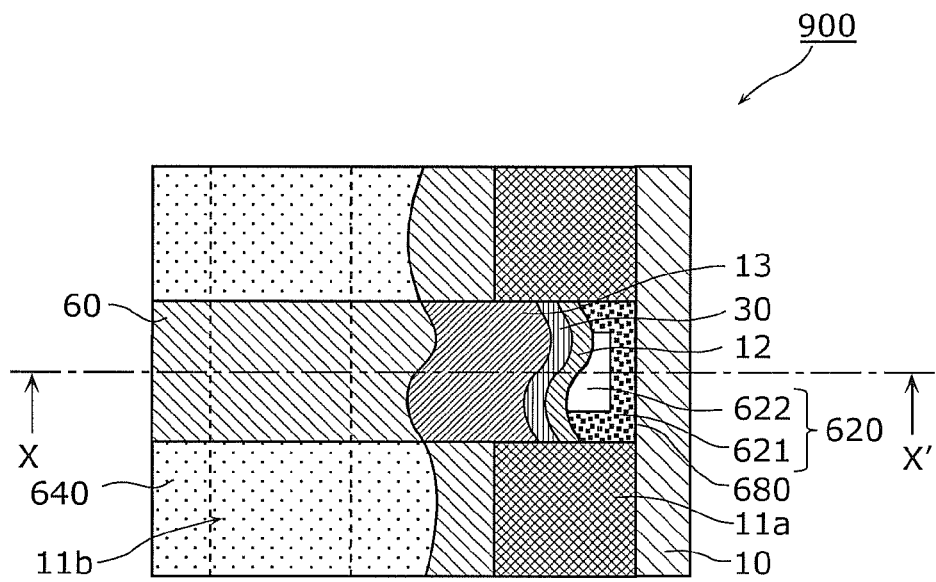
FIG. 23A is a partially cutout plan view illustrating a structure of a memory device according to Embodiment 9.
Figure 23B:
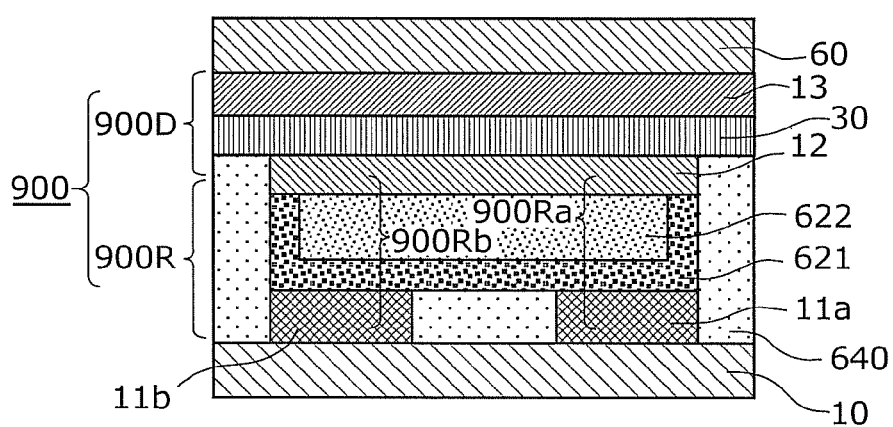
FIG. 23B is a section view illustrating the structure of the memory device cut along an X-X' line in FIG. 23A according to Embodiment 9.

First, a memory device 900 according to Embodiment 9 will be described with reference to FIGS. 23A and 23B. FIG. 23A is a partially cutout plan view illustrating a structure of the memory device 900 according to Embodiment 9. Furthermore, FIG. 23B is a section view illustrating the structure of the memory device 900 cut along an X-X' line in FIG. 23A. Embodiment 9 will be described using two variable resistance elements formed in a single memory device as an example, as according to Embodiments 6 to 8.

The memory device 900 in FIGS. 23A and 23B according to Embodiment 9 has the same basic structure as that of the memory device 600 in FIGS. 17A and 17B according to Embodiment 6. Thus, the constituent elements in FIGS. 23A and 23B identical to those in FIGS. 17A and 17B are assigned the same reference signs, and the descriptions are omitted or simplified.

The differences between the memory device 900 in FIGS. 23A and 23B according to Embodiment 9 and the memory device 600 according to Embodiment 6 are that the memory device 900 does not include the plug 50 included in the memory device 600 according to Embodiment 6 and that a non-conductive layer 30 and a third electrode 13 are fabricated in the same shape as that of a second line 60.

The memory device 900 includes a variable resistance element 900R including first and second variable resistance elements 900Ra and 900Rb, a total number of which is equal to a total number of the first electrodes 11a and 11b with the stacked structure including the first electrodes 11a and 11b, the variable resistance layer 620, and the second electrode 12 as according to Embodiment 6. According to Embodiment 9, the variable resistance element 900R includes two of the first and second variable resistance elements 900Ra and 900Rb within one memory cell, and further includes two of the first electrodes 11a and 11b, the one variable resistance layer 620, and the one second electrode 12. In other words, the first variable resistance element 900Ra includes the first electrode 11a, the high-concentration variable resistance layer 621, the low-concentration variable resistance layer 622, and the second electrode 12. Furthermore, the second variable resistance element 900Rb includes the first electrode 11b, the high-concentration variable resistance layer 621, the low-concentration variable resistance layer 622, and the second electrode 12. Furthermore, the second electrode 12, the non-conductive layer 30, and the third electrode 13 comprise a diode 900D with the stacked structure.

The memory device 900 according to Embodiment 9 having such a structure operates in the same manner and produces the same advantages as the memory device 600 according to Embodiment 6.

Furthermore, the memory device 900 has no plug, and the second line 60 is directly formed on the third electrode 13. Accordingly, since the process of forming the plug can be eliminated, the number of photolithography processes and the manufacturing cost can be reduced.

Furthermore, since the non-conductive layer 30 can be formed on the interlayer insulating film 640 in the memory device 900, the area of the non-conductive layer 30 closer to the second electrode 12 can be increased more than that according to Embodiment 6. Accordingly, since the current flows through the region in the non-conductive layer 30 having the area increased on the interlayer insulating film 640, an amount of effective current can be increased.

[Method for Manufacturing Memory Device]

Figure 24A:
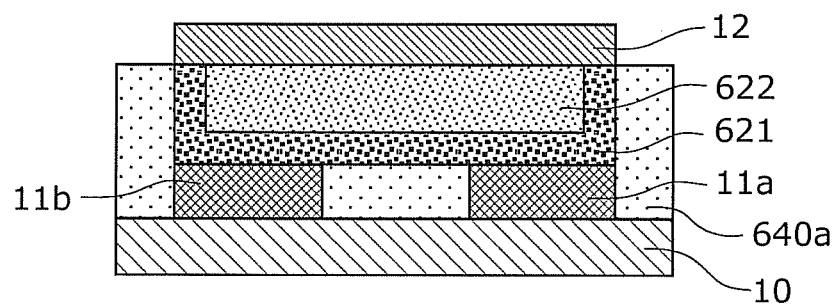
FIG. 24A is a section view illustrating a process of manufacturing the memory device (process of forming a second electrode) according to Embodiment 9.
Figure 24B:
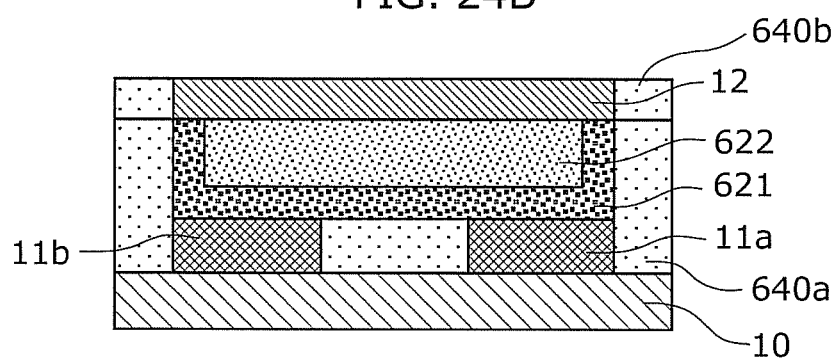
FIG. 24B is a section view illustrating a process of manufacturing the memory device (process of forming a second interlayer insulating film) according to Embodiment 9.

Next, a method for manufacturing the memory device 900 according to Embodiment 9 will be described with reference to FIGS. 24A to 24C. FIGS. 24A and 24B are section views illustrating processes of manufacturing the memory device 900 according to Embodiment 9.

First, the processes illustrated in FIGS. 18A to 18E are performed in the same manner as according to Embodiment 6.

Next, a second electrode film to be the second electrode 12 is deposited on the low-concentration variable resistance layer 622 as illustrated in FIG. 24A. Then, the second electrode 12 is formed through masking using an exposure process and etching. Here, the material of the second electrode 12 is the same as that according to Embodiment 6, and the second electrode 12 can be formed in the same manner as according to Embodiment 6. According to Embodiment 9, a TaN film with a thickness of 50 nm is deposited as the second electrode 12.

Next, as illustrated in FIG. 24B, the interlayer insulating film 640*b* comprising TEOS-SiO and having a thickness of 200 nm is extended upward using, for example, the CVD method to cover the second electrode 12. Then, a wafer surface including the interlayer insulating film 640*b* and the second electrode 12 becomes planarized, for example, by polishing the surface of the interlayer insulating film 640*b* with the CMP method until the surface of the second electrode 12 is exposed.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 640*b*. In addition, a stacked structure of these materials may be used as the interlayer insulating film 640*b*.

Figure 24C:
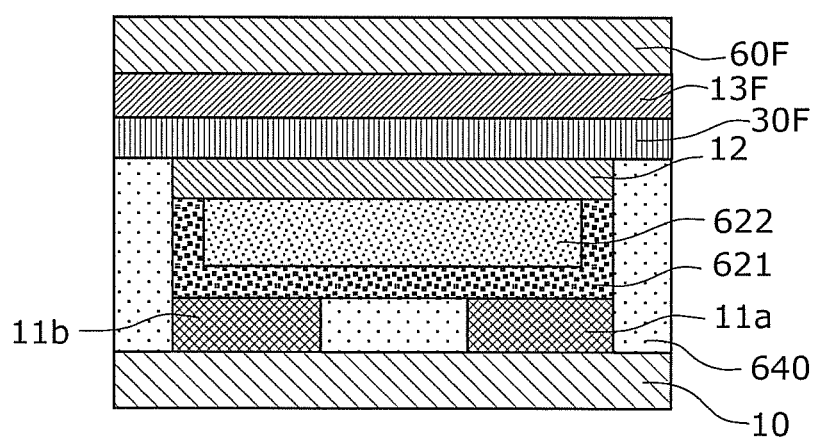
FIG. 24C is a section view illustrating a process of manufacturing the memory device (process of forming stacked films) according to Embodiment 9.

Next, as illustrated in FIG. 24C, a non-conductive film 30F to be the non-conductive layer 30, a third electrode film 13F to be the third electrode 13, a second line film 60F to be the second line 60 are deposited on the wafer surface in this order to form stacked films. Here, the materials of the non-conductive film 30F, the third electrode film 13F, and the second line film 60F are the same as those according to Embodiment 6, and the respective films can be formed in the same manner as according to Embodiment 6. According to Embodiment 9, a $SiN_x$ (x=0.6) film having a thickness of 15 nm as the non-conductive film 30F, a tantalum nitride (TaN) film having a thickness of 30 nm as the third electrode film 13F, and an Al film having a thickness of 200 nm as the second line film 60F are deposited using the sputtering method.

Next, masking using an exposure process and bulk etching are performed on the stacked films including the con-conductive film 30F, the third electrode film 13F, and the second line film 60F to form a stacked structure including the non-conductive layer 30, the third electrode 13, and the second line 60. The second line film 60F is patterned into the second line 60 having a width of 0.5 μm according to Embodiment 9.

Accordingly, the memory device 900 according to Embodiment 9 as illustrated in FIGS. 23A and 23B can be manufactured.

The memory device 900 can be used as a memory cell of a semiconductor storage device as illustrated in FIG. 3, as according to Embodiment 1. Furthermore, a write operation and a read operation performed by the semiconductor storage device are the same as those according to Embodiment 1.

Embodiment 10

Next, a memory device and a method for manufacturing the memory device according to Embodiment 10 will be described with reference to the drawings. The semiconductor storage device according to Embodiment 10 and a write operation and a read operation performed by the semiconductor storage device are the same as those according to Embodiment 1, and thus, the description thereof is omitted.

[Structure of Memory Device]

Figure 25A:
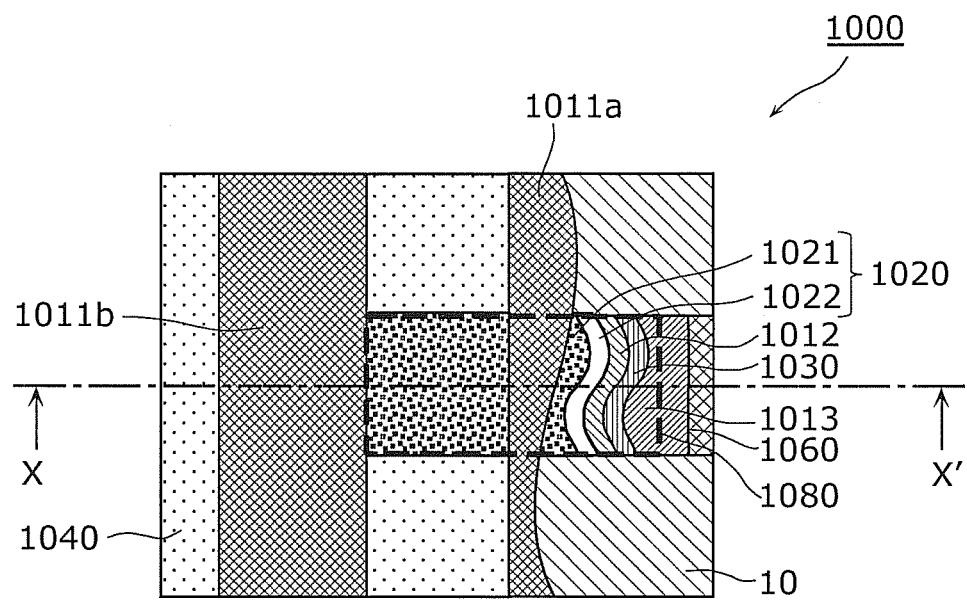
FIG. 25A is a partially cutout plan view illustrating a structure of a memory device according to Embodiment 10.
Figure 25B:
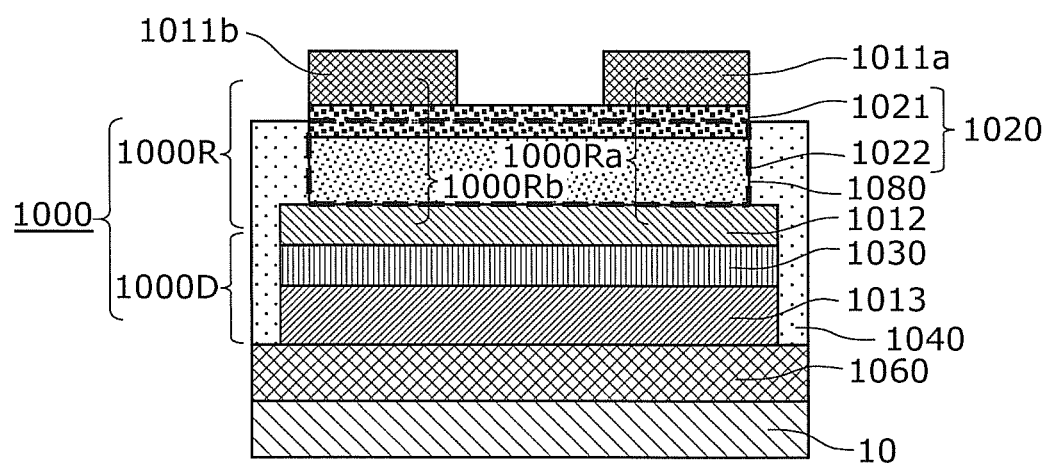
FIG. 25B is a section view illustrating the structure of the memory device cut along an X-X' line in FIG. 25A according to Embodiment 10.

First, a memory device 1000 according to Embodiment 10 will be described with reference to FIGS. 25A and 25B. FIG. 25A is a partially cutout plan view illustrating a structure of the memory device 1000 according to Embodiment 10. Furthermore, FIG. 25B is a section view illustrating the structure of the memory device 1000 cut along an X-X' line in FIG. 25A. Embodiment 10 will be described using two variable resistance elements formed in a single memory device as an example, as according to Embodiments 6 to 9.

As illustrated in FIGS. 25A and 25B, the memory device 1000 according to Embodiment 10 includes a third electrode 1013 formed in contact with the upper surface of a second line 1060 formed on the substrate 10, a non-conductive layer 1030 formed in contact with the upper surface of the third electrode 1013, a second electrode 1012 formed in contact with the upper surface of the non-conductive layer 1030, a memory cell hole 1080 formed within the interlayer insulating film 1040 to at least reach the top surface of the second electrode 1012, a low-concentration variable resistance layer 1022 embedded in the memory cell hole 1080, a high-concentration variable resistance layer 1021 formed on the upper surface of the low-concentration variable resistance layer 1022, and two first electrodes 1011*a* and 1011*b* formed in contact with the upper surface of the high-concentration variable resistance layer 1021.

The same materials as those for the first electrodes 11*a* and 11*b*, the high-concentration variable resistance layer 621, the low-concentration variable resistance layer 622, the second electrode 12, the non-conductive layer 30, the third electrode 13, the second line 60, the interlayer insulating film 640 according to Embodiment 6 can be used for the first electrodes 1011*a* and 1011*b*, the high-concentration variable resistance layer 1021, the low-concentration variable resistance layer 1022, the second electrode 1012, the non-conductive layer 1030, the third electrode 1013, the second line 1060, and the interlayer insulating film 1040 according to Embodiment 10, respectively.

Furthermore, the high-concentration variable resistance layer 1021 and the low-concentration variable resistance layer 1022 comprise a variable resistance layer 1020, and the oxygen concentration of the high-concentration variable resistance layer 1021 is higher than that of the low-concentration variable resistance layer 1022.

The memory device 1000 according to Embodiment 10 includes a variable resistance element 1000R including first and second variable resistance elements 1000Ra and 1000Rb, a total number of which is equal to a total number of the first electrodes 1011a and 1011b with the stacked structure including the first electrodes 1011a and 1011b, the variable resistance layer 1020, and the second electrode 1012. According to Embodiment 10, the variable resistance elements 1000R includes two of the first and second variable resistance elements 1000Ra and 1000Rb within one memory cell, and further includes two of the first electrodes 1011a and 1011b, the one variable resistance layer 1020, and the one second electrode 1012. In other words, the first variable resistance element 1000Ra includes the first electrode 1011a, the high-concentration variable resistance layer 1021, the low-concentration variable resistance layer 1022, and the second electrode 1012. Furthermore, the second variable resistance element 1000Rb includes the first electrode 1011b, the high-concentration variable resistance layer 1021, the low-concentration variable resistance layer 1022, and the second electrode 1012. As such, the high-concentration variable resistance layer 1021, the low-concentration variable resistance layer 1022, and the second electrode 1012 are shared between the first variable resistance element 1000Ra and the second variable resistance element 1000Rb, but the first variable resistance element 1000Ra and the second variable resistance element 1000Rb include the respective first electrodes (1011a and 1011b). The element area of the variable resistance element 1000R is defined as a total of areas (contact areas) in which the first electrodes 1011a and 1011b and the high-concentration variable resistance layer 1021 are in contact with each other.

Furthermore, the second electrode 1012, the non-conductive layer 1030, and the third electrode 1013 comprise a diode 1000D with the stacked structure in the memory device 1000. The element area of the diode 1000D is a smaller one of areas (contact areas) in which (i) the second electrode 1012 and the non-conductive layer 1030 are in contact with each other and (ii) the non-conductive layer 1030 and the third electrode 1013 are in contact with each other.

As such, the two variable resistance elements 1000Ra and 1000Rb and the one diode 1000D are formed solely in the memory device 1000 according to Embodiment 10 as according to Embodiment 6. The memory device 1000 can operate in the same manner as the memory device according to Embodiment 6. Accordingly, the element area of the diode 1000D can be larger than the element area of each of the variable resistance elements 1000Ra and 1000Rb. Thus, the capacity of the memory device can be increased without miniaturizing the variable resistance layer also according to Embodiment 10. As a result, it is possible to substantially increase an allowable current amount of the diode, and prevent the diode from being destroyed by the current during an initial break operation and a resistance change operation.

Furthermore, since processing dimensions of the variable resistance layer and the diode can be larger than the minimum design dimension of the memory device, the memory device can substantially be miniaturized without using special micromachining process technology.

Furthermore, the structure of the memory device 1000 is obtained by turning the structure of the memory device 600 according to Embodiment 6 upside down. Here, the shape of the high-concentration variable resistance layer 1021 is different from that of the high-concentration variable resistance layer 621. With the structure, the process of forming a plug (plug 50 in FIG. 17B) that connects the third electrode 1013 to the second line 1060 can be eliminated. Thus, the number of photolithography processes and the manufacturing cost can be reduced.

Although the memory cell hole 1080 in the plan view is represented by a rectangle as illustrated in FIGS. 25A and 25B according to Embodiment 10, the shape is not limited to the rectangle. For example, the shape of the memory cell hole 1080 in the plan view may be represented by an oval or a polygon.

Furthermore, although the memory cell hole 1080 is formed vertical to the substrate 10 as illustrated in FIG. 25B, it does not always have to be so. For example, the present invention includes a tilt (tapered form) on a cross-section surface of the stacked structure manufactured in an actual manufacturing process.

Furthermore, although the second electrode 1012 is an electrode of a single layer shared between the variable resistance element 1000R and the diode 1000D as illustrated in FIG. 25B according to Embodiment 10, the second electrode 1012 does not have to be so. For example, when the variable resistance element 1000R and the diode 1000D separately comprise appropriate electrode materials, the second electrode 1012 may have a stacked structure including two or more layers of different electrode materials.

[Method for Manufacturing Memory Device]

Next, a method for manufacturing the memory device 1000 according to Embodiment 10 will be described with reference to FIGS. 26A to 26I. FIGS. 26A to 26I are section views illustrating processes of manufacturing the memory device 1000 according to Embodiment 10.

Figure 26A:
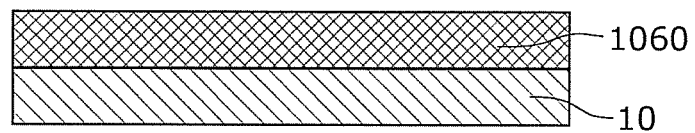
FIG. 26A is a section view illustrating a process of manufacturing the memory device (process of forming a second line) according to Embodiment 10.

First, a second line 1060 that is a Cu line is formed on the substrate 10 as illustrated in FIG. 26A. The second line 1060 can be formed using a general Cu damascene process. The second line 1060 includes a CU portion having a thickness of 200 nm, and has a line width of approximately 0.5 μm.

Figure 26B:
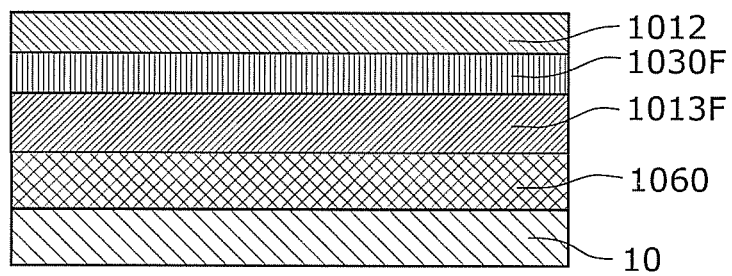
FIG. 26B is a section view illustrating a process of manufacturing the memory device (process of forming a third electrode film, a non-conductive film, and a second electrode film) according to Embodiment 10.

Next, a third electrode film 1013F to be the third electrode 1013, a non-conductive film 1030F to be the non-conductive layer 1030, and a second electrode film 1012F to be the second electrode 1012 are deposited in this order as illustrated in FIG. 26B to form stacked films.

Here, the material of the second electrode film 1012F and the third electrode film 1013F is preferably a noble metal material, for example, one of platinum (Pt), palladium (Pd), and iridium (Ir), a composite of these, copper (Cu), titanium (Ti), tungsten (W), tantalum (Ta), and a metal including at least one of these nitrides. Furthermore, the sputtering method, the CVD method, and so on are used as the film-forming method for these materials. According to Embodiment 10, a tantalum nitride (TaN) film with a thickness of 30 nm is deposited as the second electrode film 1012F and the third electrode film 1013F using the sputtering method.

Furthermore, the material of the non-conductive film 30F according to Embodiment 6 can be used as the material of the non-conductive film 1030F. A $SiN_x$ (x=0.6) film with a thickness of 15 nm is deposited as the non-conductive film 1030F according to Embodiment 10.

Furthermore, the material of the low-concentration variable resistance film 622F according to Embodiment 6 can be used as the material of the low-concentration variable resistance film 1022F. According to Embodiment 10, a $TaO_{0.66}$ film with a thickness of 50 nm is deposited as the low-concentration variable resistance film 1022F using the sputtering method.

Figure 26C:
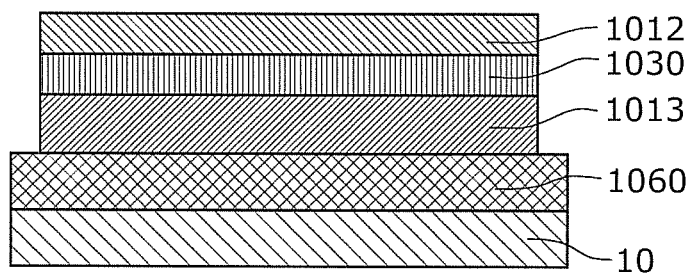
FIG. 26C is a section view illustrating a process of manufacturing the memory device (process of forming stacked layers) according to Embodiment 10.

Next, as illustrated in FIG. 26C, masking using an exposure process and bulk etching are performed on the stacked films including the third electrode film 1013F, the non-conductive film 1030F, and the second electrode film 1012F to form a stacked structure having predetermined dimensions and including the third electrode 1013, the non-conductive layer 1030, and the second electrode 1012. The stacked structure after the etching is represented by a rectangle of 1.5 µm×0.5 µm in the plan view according to Embodiment 10. Furthermore, a longer side of the stacked structure is in a direction of a longer side of the second line 1060.

Figure 26D:
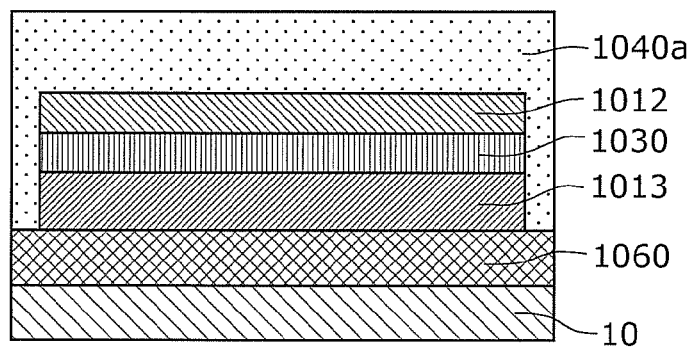
FIG. 26D is a section view illustrating a process of manufacturing the memory device (process of forming an interlayer insulating film) according to Embodiment 10.

Next, as illustrated in FIG. 26D, an interlayer insulating film 1040a comprising TEOS-SiO and having a thickness of 600 nm is deposited using, for example, the CVD method to cover the stacked structure including the third electrode 1013, the non-conductive layer 1030, and the second electrode 1012.

Figure 26E:
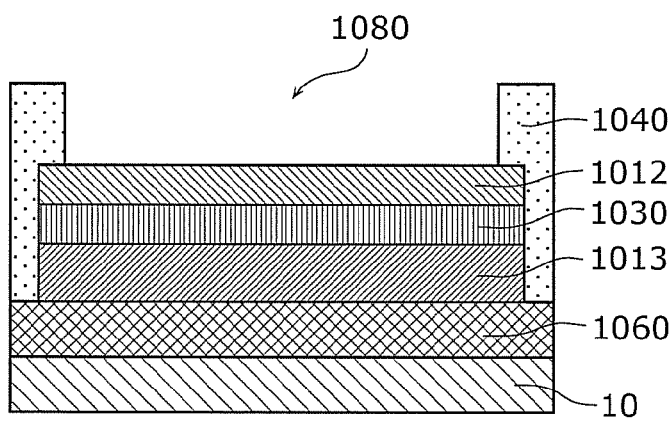
FIG. 26E is a section view illustrating a process of manufacturing the memory device (process of forming a memory cell hole) according to Embodiment 10.

Next, as illustrated in FIG. 26E, the surface of the interlayer insulating film 1040a on the second electrode 1012 becomes planarized, for example, by polishing the surface of the interlayer insulating film 1040a with the CMP method until the thickness of the interlayer insulating film 1040a reaches 300 nm. Then, a memory cell hole 1080 whose bottom surface reaches the top surface of the second electrode 1012 is formed through masking using an exposure process and etching. Thus, an interlayer insulating film 1040 including the memory cell hole 1080 can be formed.

Aside from TEOS-SiO, silicon nitride (SiN), silicon carbonitride (SiCN) which is a low dielectric constant material, silicon oxycarbide (SiOC), fluorinated silicon oxide (SiOF), and so on may be used as a material of the interlayer insulating film 1040. In addition, a stacked structure of these materials may be used as the interlayer insulating film 1040.

Figure 26F:
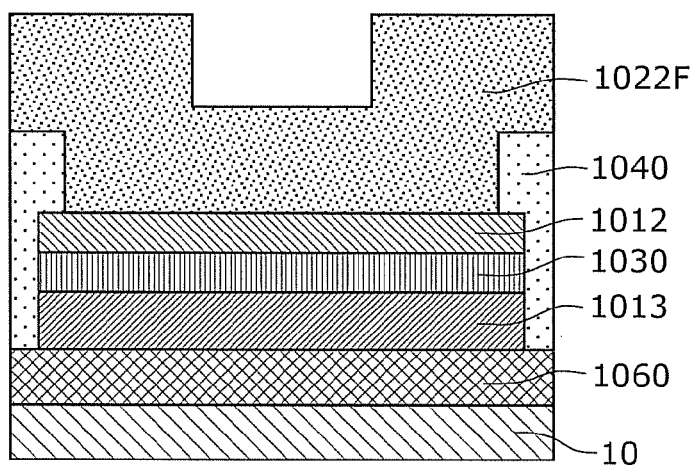
FIG. 26F is a section view illustrating a process of manufacturing the memory device (process of forming a low-concentration variable resistance film) according to Embodiment 10.

Next, as illustrated in FIG. 26F, a $TaO_{0.66}$ film with a thickness of 600 nm is deposited as the low-concentration variable resistance film 1022F to be the low-concentration variable resistance layer 1022, using, for example, the sputtering method. Accordingly, the memory cell hole 1080 is filled with the low-concentration variable resistance film 1022F. Furthermore, the material of the low-concentration variable resistance film 622F according to Embodiment 6 can be used as the material of the low-concentration variable resistance film 1022F.

Figure 26G:
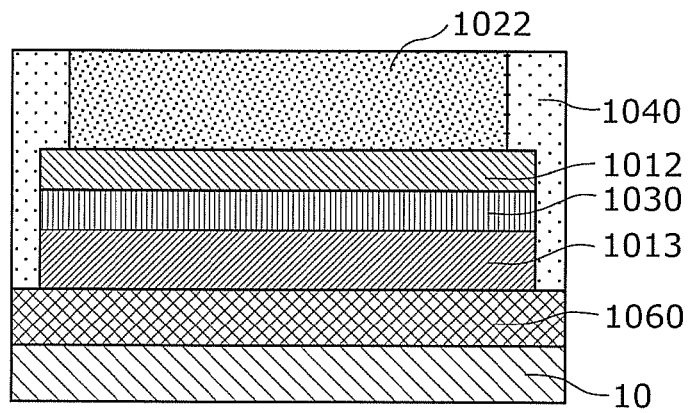
FIG. 26G is a section view illustrating a process of manufacturing the memory device (polishing process) according to Embodiment 10.

Then, as illustrated in FIG. 26G, a wafer surface including the interlayer insulating film 1040 and the low-concentration variable resistance layer 1022 becomes planarized, for example, by polishing the low-concentration variable resistance film 1022F on the interlayer insulating film 1040 with the CMP method.

Figure 26H:
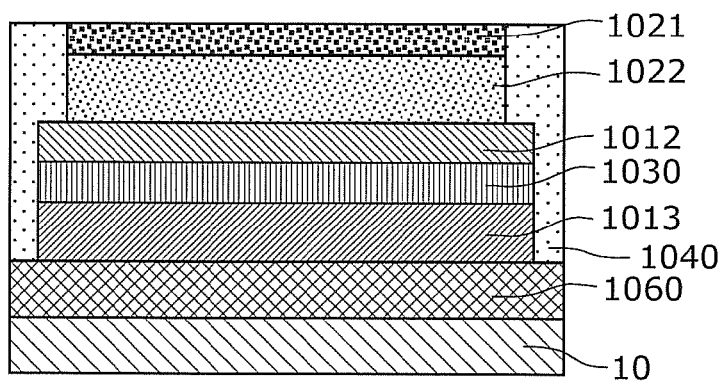
FIG. 26H is a section view illustrating a process of manufacturing the memory device (process of forming a high-concentration variable resistance layer) according to Embodiment 10.

Next, as illustrated in FIG. 26H, the exposed surface of the low-concentration variable resistance layer 1022 is oxidized by performing a plasma oxidation process on the wafer surface to form the high-concentration variable resistance layer 1021. According to Embodiment 10, the high-concentration variable resistance layer 1021 with a thickness of 6 nm is formed by the plasma oxidation process at 400° C.

Figure 26I:
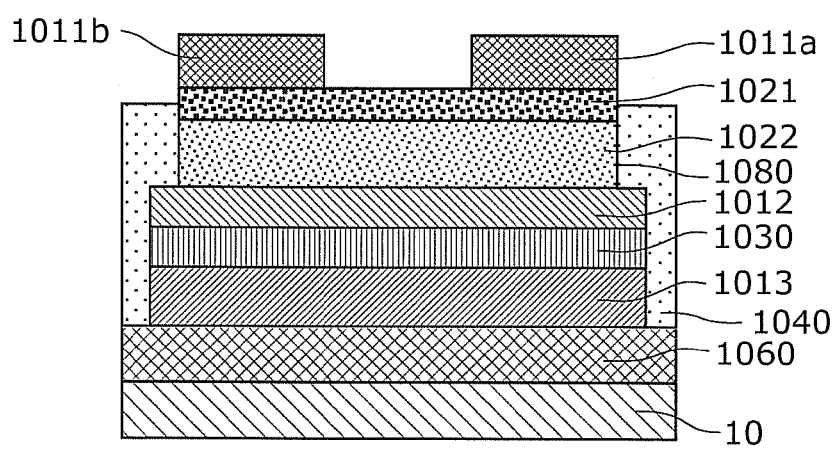
FIG. 26I is a section view illustrating a process of manufacturing the memory device (process of forming first electrodes) according to Embodiment 10.

Next, a first electrode film to be the first electrodes 1011a and 1011b is deposited using the sputtering method, a CVC method, and so on as illustrated in FIG. 26I. Then, the first electrode film is patterned into the first electrodes 1011a and 1011b through masking using an exposure process and etching. Here, the material of the first electrodes 1011a and 1011b is preferably a material from which functions of the high-concentration variable resistance layer 1021 are easily derived, that is, a material in which the resistance state is easily changed. The material is preferably a noble metal material, for example, one of platinum (Pt), palladium (Pd), iridium (Ir), and a composite of these. According to Embodiment 10, iridium (Ir) is used as the material of the first electrodes 1011a and 1011b. Furthermore, the first electrodes 1011a and 1011b have a width of 0.5 µm, and a thickness of 50 nm. Furthermore, a distance between the first electrodes 1011a and 1011b that are adjacent to each other is 0.5 µm.

Furthermore, although not illustrated, when the memory device according to Embodiment 10 is used as a storage device for an integrated circuit, a substrate in which a transistor circuit is formed in advance can be used. Here, a via hole for electrically connecting the transistor circuit is connected to the second line 1060.

Accordingly, the memory device 1000 according to Embodiment 10 can be manufactured.

Since the high-concentration variable resistance layer 1021 is on the low-concentration variable resistance layer 1022 in the memory device 1000, the high-concentration variable resistance layer 1021 can be formed by oxidizing a part of the low-concentration variable resistance layer 1022. Thus, the high-concentration variable resistance layer 1021 can be easily formed.

The memory device 1000 can be used as a memory cell of a semiconductor storage device as illustrated in FIG. 3, as according to Embodiment 1. Furthermore, a write operation and a read operation performed by the semiconductor storage device are the same as those according to Embodiment 1.

Although the memory devices, the semiconductor storage devices, the methods for manufacturing the memory devices, and the reading methods for the semiconductor storage devices according to the present invention are described based on Embodiments 1 to 10, the present invention is not limited such Embodiments.

For example, although Embodiments describe the case where the number of variable resistance elements included in one memory device is two, the number is not limited to two. For example, the number of variable resistance elements included in one memory device may be defined as three or more, and the memory device may include much larger number of variable resistance elements.

Figure 27A:
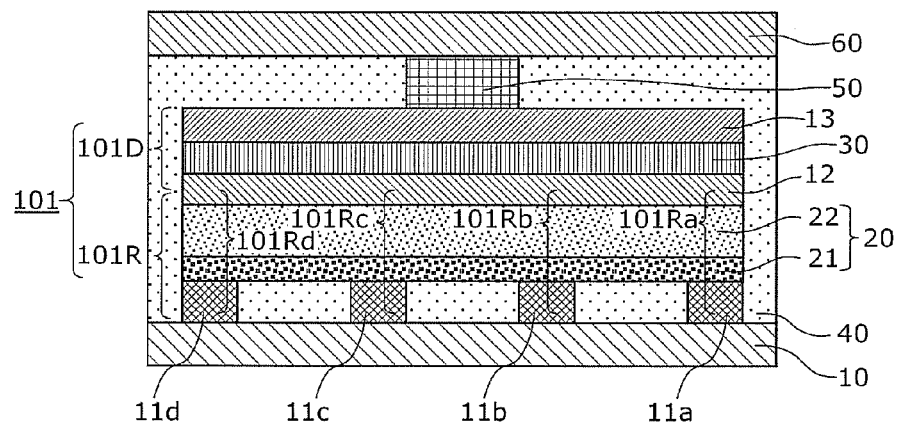
FIG. 27A is a section view illustrating a structure of a memory device according to another Embodiment of the present invention.

Here, an example in which one memory device includes four variable resistance elements will be described with reference to FIG. 27A. FIG. 27A is a section view illustrating a structure of a memory device according to another Embodiment of the present invention. The constituent elements in FIG. 27A identical to those in FIG. 1B are assigned the same reference signs.

A memory device 101 according to the other Embodiment includes four first electrodes 11a, 11b, 11c, and 11d as illustrated in FIG. 27A. In FIG. 27A, the memory device 101 is the same as the memory device 100 in FIG. 1B according to Embodiment 1 except for the number of the first electrodes. Accordingly, the memory device 101 including a variable resistance element 101R including four variable resistance elements and a diode 101D can be formed. The variable resistance elements are a first variable resistance element 101Ra, a second variable resistance element 101Rb, a third variable resistance element Rc, and a fourth variable resistance element 101Rd.

Figure 27B:
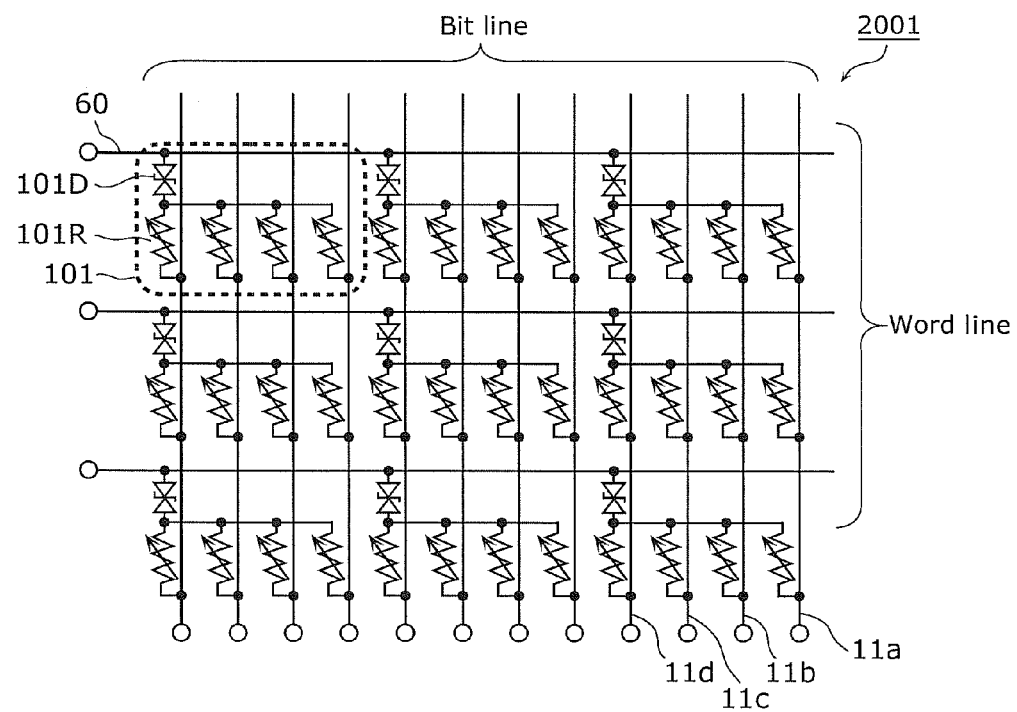
FIG. 27B illustrates an exemplified structure of a semiconductor storage device according to the other Embodiment.

An example of a semiconductor storage device 2001 including a cross-point memory cell array of three by three of the memory devices 101 illustrated in FIGS. 27A and 27B will be described with reference to FIG. 27B. FIG. 27B illustrates an exemplified structure of a semiconductor storage device according to the other Embodiment.

As illustrated in FIG. 27B, the semiconductor storage device 2001 includes 3 word lines and 12 bit lines (3×4). In this case, since the number of the current sensing circuits connected through the read word line selection circuit is identical to that of the variable resistance elements included in one memory device, four current sensing circuits may be placed. Performing a write operation and a read operation by the semiconductor storage device 2000 according to Embodiment 1 makes it possible to determine resistance states of four variable resistance elements. In other words, the resistance states of the first, second, third, and fourth variable resistance elements in a memory cell to be read can be determined based on the currents that flow through the four current sensing circuits.

As the variable resistance elements that are commonly connected to a diode are larger in number, the element area of the diode can be relatively increased. Thus, the margin of an allowable current of the diode can be increased. However, since the leakage current through each of the variable resistance elements tends to increase and the read margin tends to decrease, the number of variable resistance elements included in one memory device needs to be comprehensively determined in consideration of the scale of the memory cell array and the read margin.

Embodiments resulting from various modifications of the exemplary embodiments that may be conceived by those skilled in the art are intended to be included within the scope of the present invention as long as these do not depart from the essential features of the present invention. Furthermore, embodiments resulting from arbitrary combinations of constituent elements of the different exemplary embodiments are intended to be included within the scope of the present invention as long as these do not depart from the essential features of the present invention.

INDUSTRIAL APPLICABILITY

The nonvolatile semiconductor storage device including the memory devices according to the present invention has a cross-point structure that allows miniaturization and increasing the capacity, and is useful as a nonvolatile semiconductor storage device used in various electronic devices, such as digital household appliances, memory cards, mobile phones, and personal computers.

REFERENCE SIGNS LIST

10 Substrate
11a, 11b, 211a, 211b, 311a, 311b, 511a, 511b, 711a, 711b, 811a,
811b, 1011a, 1011b First electrode
211F, 711F First electrode film
12, 212, 512, 1012 Second electrode
12F, 512F, 1012F Second electrode film
13, 213, 513, 1013 Third electrode
13F, 513F, 1013F Third electrode film
20, 520, 620, 1020 Variable resistance layer
21, 521, 621, 1021 High-concentration variable resistance layer
21F, 621F High-concentration variable resistance layer
22, 522, 622, 1022 Low-concentration variable resistance layer
22F, 522F, 622F, 1022F Low-concentration variable resistance film
30, 230, 530, 1030 Non-conductive layer
30F, 530F, 1030F Non-conductive film
40, 40a, 40b, 540, 640, 640a, 640b, 1040, 1040a Interlayer insulating film
50 Plug
60, 560, 1060 Second line
60F Second line film
100, 101, 200, 300, 400, 500, 600, 700, 800, 900, 1000 Memory device
100D, 101D, 200D, 300D, 400D, 550D, 600D, 700D, 800D, 900D,
1000D Diode
100R, 101R, 200R, 300R, 400R, 500R, 600R, 700R, 800R, 900R,
1000R Variable resistance element
100Ra, 101Ra, 200Ra, 300Ra, 400Ra, 500Ra, 600Ra, 700Ra, 800Ra,
900Ra, 1000Ra First variable resistance element
100Rb, 101Rb, 200Rb, 300Rb, 400Rb, 500Rb, 600Rb, 700Rb, 800Rb,
900Rb, 1000Rb Second variable resistance element
101Rc Third variable resistance element
101Rd Fourth variable resistance element
270a, 270b, 370a, 370b, 770a, 770b, 870a, 870b First line
270F, 770F First line film
680, 1080 Memory cell hole
2000, 2001 Semiconductor storage device
2100 Memory cell array
2200 Read word line selection circuit
2300 Read bit line selection circuit
2400 Write word line selection circuit
2500 Write bit line selection circuit
2600 Writing direction selection circuit
2701 First current sensing circuit
2702 Second current sensing circuit

The invention claimed is:

1. A memory device, comprising:
a substrate;
a plurality of first electrodes, a second electrode, and a third electrode that are stacked above the substrate;
a variable resistance layer formed in an island shape between the first electrodes and the second electrode; and
a non-conductive layer formed between the second electrode and the third electrode,
wherein the variable resistance layer includes a high-concentration variable resistance layer located closer to the first electrodes, and a low-concentration variable resistance layer located closer to the second electrode, the low-concentration variable resistance layer having an oxygen concentration lower than an oxygen concentration of the high-concentration variable resistance layer,
the second electrode, the non-conductive layer, and the third electrode comprise a diode,
the second electrode, the third electrode, the variable resistance layer, and the non-conductive layer are formed across the first electrodes,
the first electrodes, the variable resistance layer, and the second electrode comprise a plurality of variable resistance elements, a total number of which is equal to a total number of the first electrodes, and
each of the variable resistance elements has a resistance value that independently changes according to a voltage applied between the first electrodes and the second electrode.

2. The memory device according to claim 1, further comprising
an interlayer insulating film in which a memory cell hole is formed,
wherein the variable resistance layer is formed within the memory cell hole, and
the high-concentration variable resistance layer is formed on an entire bottom surface of the memory cell hole.

3. The memory device according to claim 1,
wherein a first line is formed opposite to the variable resistance layer with respect to the first electrodes, and
a material comprised in the first line has a resistance value smaller than a resistance value of a material comprised in the first electrodes.

4. The memory device according to claim 3,
wherein each of the first electrodes is formed by a plating method.

5. The memory device according to claim 1,
wherein a second line is formed opposite to the non-conductive layer with respect to the third electrode, and
the third electrode, the non-conductive layer, and the second line have a same shape in a vertical direction with respect to the substrate.

6. The memory device according to claim 1,
wherein the third electrode, the second electrode, and the first electrodes are formed in this order above the substrate.

7. The memory device according to claim 1,
wherein the first electrodes comprise one of platinum (Pt), palladium (Pd), iridium (Ir), and a composite of Pt, Pd, and Ir.

8. The memory device according to claim 1,
wherein the high-concentration variable resistance layer and the low-concentration variable resistance layer comprise an oxide of one of tantalum, hafnium, and zirconium.

9. A cross-point memory cell array including a matrix of a plurality of the memory devices according to claim 1.

10. A semiconductor storage device, comprising:
a cross-point memory cell array including a matrix of a plurality of the memory devices according to claim 1;
a plurality of word lines formed in a row direction of the memory cell array;
a plurality of bit lines formed in a column direction of the memory cell array;
a read word line selection circuit connected to the word lines;
a read bit line selection circuit connected to the bit lines; and
a plurality of current sensing circuits connected to the bit lines,
wherein the read word line selection circuit selects one of the word lines to apply a first potential to the third electrode included in a corresponding one of the memory devices to be read,
the read bit line selection circuit selects a plurality of bit lines to apply a same second potential simultaneously to the first electrodes in the corresponding one of the memory devices to be read, the second potential being different from the first potential, and
the current sensing circuits detect each current that flows through the bit lines selected by the read bit line selection circuit to apply the second potential.

11. A semiconductor storage device comprising a cross-point memory array including a plurality of first lines, a plurality of second lines that three-dimensionally cross the first lines, and a plurality of memory devices that correspond to a plurality of cross-points between the first lines and the second lines,
wherein each of the memory devices is the memory device according to claim 1, and includes a diode, and at least a first variable resistance element and a second variable resistance element,
the first variable resistance element has one end connected to one of the first lines,
the second variable resistance element has one end connected to an other one of the first lines that is adjacent to the one of the first lines that is connected to the first variable resistance element,
the diode has one end connected to one of the second lines, and
the diode has the other end connected to the other end of the first variable resistance element and the other end of the second variable resistance element.

12. A method for manufacturing a memory device, the method comprising:
forming a plurality of first electrodes on a substrate;
forming an interlayer insulating film having a height up to a surface of the first electrodes;
stacking, on the first electrodes and the interlayer insulating film, films including a high-concentration variable resistance film, a low-concentration variable resistance film, a second electrode film, a non-conductive film, and a third electrode film, the low-concentration variable resistance film having an oxygen concentration lower than an oxygen concentration of the high-concentration variable resistance film; and
patterning the stacked films simultaneously into a high-concentration variable resistance layer, a low-concentration variable resistance layer, a second electrode, a non-conductive layer, and a third electrode that are across the first electrodes.

13. A method for manufacturing a memory device, the method comprising:
forming a plurality of first electrodes on a substrate;
forming an interlayer insulating film to cover the first electrodes;
forming a memory cell hole in a region of the interlayer insulating film to expose a surface of each of the first electrodes;
sequentially embedding, in the memory cell hole, a high-concentration variable resistance film and a low-concentration variable resistance film having an oxygen concentration lower than an oxygen concentration of the high-concentration variable resistance film;
forming a high-concentration variable resistance layer and a low-concentration variable resistance layer in the memory cell hole by removing the high-concentration variable resistance film and the low-concentration variable resistance film to expose a surface of the interlayer insulating film in a region of the interlayer insulating film in which the memory cell hole is not formed; and
forming stacked films including a second electrode film, a non-conductive film, and a third electrode film on the memory cell hole; and
patterning the stacked films simultaneously into a second electrode, a non-conductive layer, and a third electrode to cover at least a part of the memory cell hole,
where the high-concentration variable resistance layer is formed on an entire bottom surface of the memory cell hole.

14. The method according to claim 12, further comprising forming copper lines between the substrate and the first electrodes,
wherein the first electrodes are formed on the copper lines by an electroless plating method.

15. A reading method for the semiconductor storage device according to claim 10 to read information written in the memory devices included in the semiconductor storage device, the reading method comprising:
applying a first potential to the third electrode included in the corresponding one of the memory devices to be read;
applying a second potential simultaneously to each of the first electrodes in the corresponding one of the memory devices to be read, the second potential being different from the first potential, and
determining each of resistance states of the variable resistance elements in the corresponding one of the memory devices to be read by detecting each current that flows through the bit lines connected to the first electrodes to which the second potential is applied, and reading information on the corresponding one of the memory devices to be read.

16. The memory device according to claim 1, wherein the variable resistance layer is rectangular in a plan view.

* * * * *